(12) United States Patent
Hall et al.

(10) Patent No.: US 6,792,856 B2
(45) Date of Patent: Sep. 21, 2004

(54) METHOD AND APPARATUS FOR ACCURATE, MICRO-CONTACT PRINTING

(75) Inventors: Shawn Anthony Hall, Pleasantville, NY (US); Ronald W. Nunes, Hopewell Junction, NY (US); Robert H. Fair, Slate Hill, NY (US); William J. Surovic, Carmel, NY (US); Istvan Lovas, Mahopac, NY (US); Robert Scott Emmans, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 10/197,005

(22) Filed: Jul. 16, 2002

(65) Prior Publication Data

US 2004/0011231 A1 Jan. 22, 2004

(51) Int. Cl.$^7$ ................................................ B41K 3/02
(52) U.S. Cl. ....................................... 101/368; 101/214
(58) Field of Search ................................ 101/327, 287, 101/322, 297, 319, 133, 214, 368

(56) References Cited

U.S. PATENT DOCUMENTS

| | | | | |
|---|---|---|---|---|
| 170,695 A | * | 12/1875 | Adams | 101/379 |
| 1,273,131 A | * | 7/1918 | Barrett | 101/125 |
| 1,952,629 A | * | 3/1934 | Newgard | 101/131 |
| 2,013,259 A | * | 9/1935 | Wagner | 101/133 |

* cited by examiner

*Primary Examiner*—Daniel J. Colilla
(74) *Attorney, Agent, or Firm*—F. Chau & Associates, LLC

(57) ABSTRACT

Disclosed is a printing apparatus, having a print surface lying in a print plane defined by an imaginary x-axis and y-axis, the print surface having an outward normal pointing in the positive direction along an imaginary z-axis, such that the x-axis, y-axis, and z-axis are substantially orthogonal to one another, a lower stamp clamp disposed adjacent to the negative-x edge of the print surface, an upper stamp clamp, moveable in two dimensions in a trajectory plane defined by the x-axis and z-axis, a stamp comprising a flexible material, the stamp having a first end attached to the lower stamp clamp and a second end attached to the upper stamp clamp, such that a cross section of the stamp parallel to the trajectory plane forms an arc extending from an origin point Q on the lower stamp clamp having (x,z) coordinates (0,0) to point E on the upper stamp clamp, this arc being described by the mathematical function θ(s), where s is the curvilinear distance along the arc measured from point Q, and θ is the angle between the print plane and an imaginary line, the imaginary line being tangent to the cross section of the stamp at s, and wherein, during a print operation, the upper stamp clamp is moved in a trajectory comprising a plurality of xz positions of the upper clamp stamp that blend into a substantially continuous motion, the trajectory being effective in laying the stamp down smoothly and flat upon the print surface in a manner such that a moving contact front between the stamp and the print surface is created, the contact front being disposed substantially along a line characterized by a contact-front coordinate $s_0 x_0$ that increases as the trajectory progresses, the trajectory also being effective in causing the curvature $$\frac{d\theta}{ds}$$

of the stamp at or near the contact front to be substantially constant throughout the motion. The preferred embodiment also has either or both of two additional systems that move along the x axis in coordination with the motion of the upper stamp clamp: a print-force-application system effective in pressing the stamp against the print surface, and a stamp control system for helping to control the curvature of the stamp near the contact front.

24 Claims, 49 Drawing Sheets

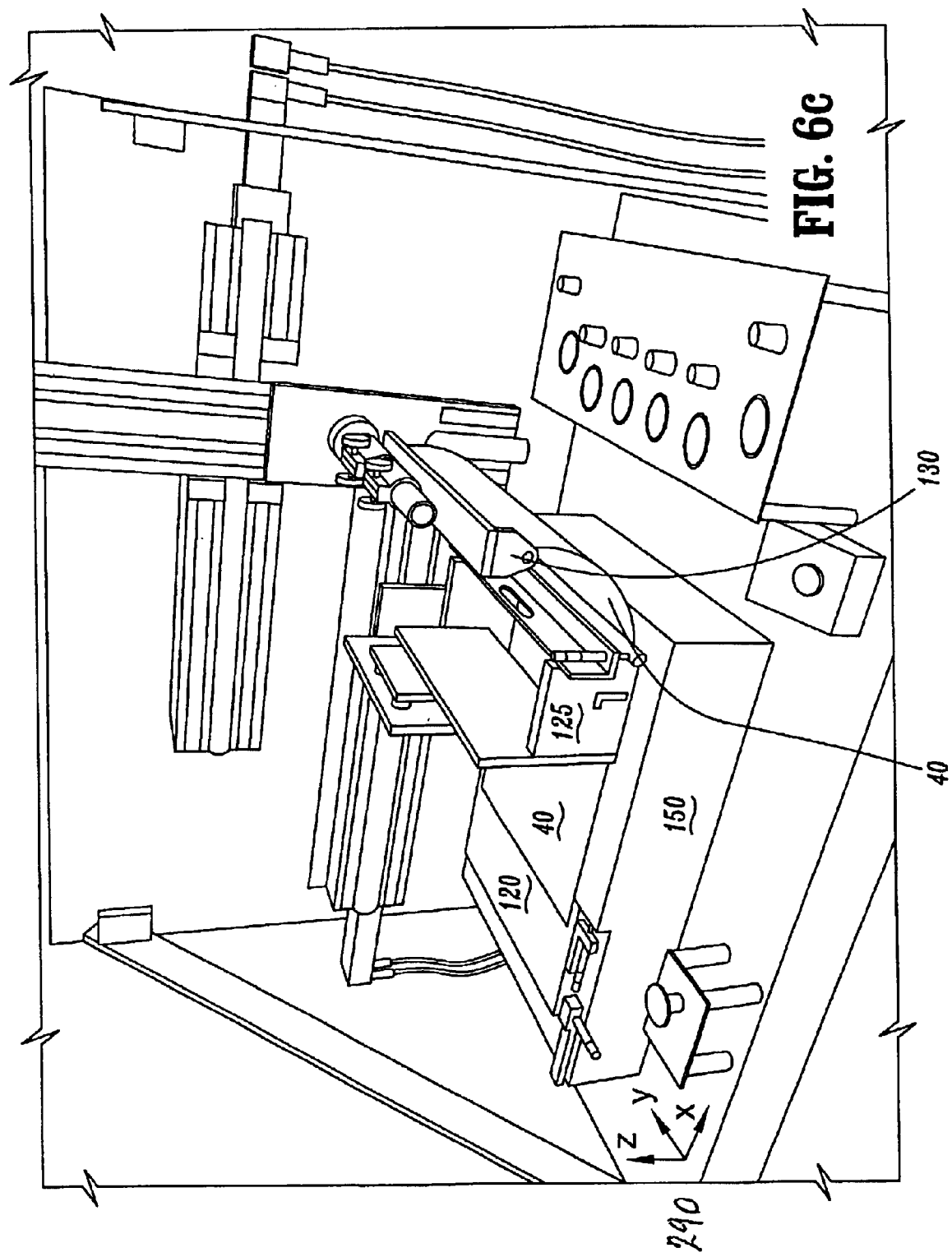

METHOD AND APPARATUS FOR ACCURATE, MICRO-CONTACT PRINTING

FIELD OF THE INVENTION

The invention relates to printing, particularly to micro-contact printing, also called "soft lithography", in which a flexible stamp transfers an "inked" pattern to a receiving surface by mechanical contact, the pattern often having very small features normally associated with optical lithography and other expensive methods. More generally, the invention relates to a precise and controlled way of bringing two surfaces into contact, and subsequently separating them.

BACKGROUND OF THE INVENTION

A number of printing techniques collectively known as "soft lithography" have been recently developed, spurred by the 1993 discovery of micro-contact printing, as described in A. Kumar and G. M. Whitesides, FEATURES ON GOLD HAVING MICROMETER TO CENTIMETER DIMENSIONS CAN BE FORMED THROUGH A COMBINATION OF STAMPING WITH AN ELASTOMERIC STAMP AND AN ALKANETHIOL INK FOLLOWED BY CHEMICAL ETCHING, *Appl. Phys. Lett.*, 63, 2002 (1993), the disclosure of which is incorporated by reference herein in their entirety. Typically, in such a printing technique, a flexible, polymeric stamp, embossed with a pattern and coated with a chemical "ink", is brought into contact with a receiving surface and then separated from it, thereby transferring the image to the receiving surface in the form of a molecular monolayer of the ink. A full review of the techniques of soft lithography has recently been given in Y. Xia and G. M. Whitesides, SOFT LITHOGRAPHY, *Angew. Chem. Int. Ed.*, 37, 550 (1998) and in B. Michel, et al., PRINTING MEETS LITHOGRAPHY: SOFT APPROACHES TO HIGH RESOLUTION PATTERNING, to be published in *IBM Journal of Research and Development* (special issue on lithography), the disclosures of both of which are incorporated by reference herein in their entirety.

Soft lithography promises to deliver printing that is less costly than that available with conventional techniques, such as optical lithography, used routinely in semiconductor processing. Soft lithography's lower cost is possible because the per-print process is simpler than conventional techniques—there are fewer steps and fewer costly machines. Moreover, soft lithography can print large areas quickly, whereas traditional, optical techniques can print only small areas at a time, and must build up large areas by "stitching" (step and repeat), a slow process requiring an extremely precise and expensive machine known as a lithographic stepper.

To enable soft lithography, a printing method and apparatus are required to bring the stamp and the receiver into intimate contact, in a controlled and repeatable manner, such that the pattern on the stamp is transferred to the receiver with the greatest possible fidelity (i.e., with minimal distortion). To insure intimate contact everywhere, the printing method must prevent the trapping of gaseous bubbles (e.g., air bubbles) between the opposing surfaces of the stamp and the receiver. To insure repeatability, the printing apparatus must be automated. To achieve high fidelity, two requirements must be met. Firstly, the stamp itself should resist distortions in its own plane; such resistance is provided, for example, by the two-layer "hybrid stamps" described by B. Michel et. al., supra. Secondly, the printing apparatus must provide, when the stamp and the receiver come into contact, uniform contact pressure and uniform geometric conditions over the entire printed area, lest the stamp be non-uniformly strained and therefore the printed pattern distorted.

Several prior-art methods and machines attempt to provide the printing requirements needed for soft lithography. However, these prior-art methods are deficient in several respects. One such method is described in U.S. Pat. No. 5,669,303 entitled APPARATUS AND METHOD FOR STAMPING A SURFACE, issued Sep. 23, 1997. This apparatus brings a circular stamp, held at its edges, into gradual contact with a receiver. The stamp is treated as a membrane under variable pressure: the convex (lower-pressure) side of the curving stamp being gradually flattened against the receiver while the periphery of the stamp is held fixed. Although the gradual contact successfully eliminates the trapping of air bubbles, this method and apparatus clearly produces non-uniform strain in the stamp as the varying pressure stretches the membrane, thereby distorting the pattern. Acknowledging this distortion, various schemes were proposed to compensate it, but the manufacturing practicality of these schemes is doubtful, and it would clearly be preferable if the method did not engender the non-uniform strain in the first place.

Another prior-art apparatus and method are described by B. Michel et al., supra, as the "rocker cylinder printing tool". In this method, the stamp is wrapped on a partial drum of radius R, and then "rocked" upon the receiving surface in a manner somewhat analogous to the motion of a rocking chair upon a floor. In other words, the method is like a printing press in which the receiver remains stationary while the axis of the rotating drum translates over it. The problems with this method are three-fold. Firstly, the embossed pattern on the stamp is stretched in the print direction due to the drum's curvature, introducing systematic distortion. Secondly, over the print cycle, the peak contact pressure between the stamp and the receiver is spatially non-uniform because it depends critically on the drum-to-receiver gap, which varies as the mechanism moves on account of unavoidable mechanical tolerances such as bearing runout and machining inaccuracies on the drum's surface. Attempting to minimize variations in peak contact pressure by introducing a compliant layer (known as a "soft pad") behind the stamp simply trades peak-pressure non-uniformity for geometric non-uniformity; that is, as the soft pad compresses to accommodate gap changes, the local curvature of the stamp near the line of contact varies, and thus the tangential strain of the embossed pattern varies—this complex variation being superimposed on the systematic strain due to the drum's curvature. Thirdly, because the drum is both translating and rotating, the accuracy of printing depends critically on precisely matching the drum's translational speed $v$ with its rotational speed $\omega$; ideally, to roll without slipping and without straining the compliant stamp by frictional forces, the drum's velocity $v$ should be exactly equal to $\omega R$. However, this ideal matching is nearly impossible to accomplish to the tolerance (~1 ppm) required for high-accuracy, large-area applications—exactly the applications where soft lithography seeks to replace optical lithogtaphy. Thus the rocker-style printer is ill-suited to the task of soft lithography. In fact, a controlled experiment was performed in which feature-placement errors on two prints from the same stamp were measured—one print made with a well-engineered rocker printer, the other with an alternative scheme (such as the current invention), where the three problems discussed above are absent. The results demonstrate roughly a factor-of-three advantage in feature-placement accuracy for the latter method.

All three shortcomings of the rocker printer, of course, are shared by the "printing press" style of machine. In particular, the printing press shares the third shortcoming mentioned above (print accuracy dependent on precise matching of v to $\omega R$): although the printing-press's drum rotates without translating, the receiver instead translates beneath it, so speed matching is still an issue. Although the printing press is, of course, suitable for images to be observed by the human eye, where feature-placement accuracy need not be better than about 10 to 20 $\mu$m, it appears to be unsuitable for the applications of soft lithography (e.g., printing patterns for electronic circuitry), where feature-placement accuracy on the order of 1 $\mu$m or better is required.

Accordingly, there is a need for an improved method and apparatus for transferring patterns from a stamp to a receiver with great fidelity, the method and apparatus being scalable to large-size receivers and amenable of various types of stamps.

SUMMARY OF THE INVENTION

Disclosed is a printing apparatus, comprising a print surface lying in a print plane defined by an imaginary x-axis and y-axis, the print surface having an outward normal pointing in the positive direction along an imaginary z-axis, such that the x-axis, y-axis, and z-axis are substantially orthogonal to one another, a lower stamp clamp disposed adjacent to the negative-x edge of the print surface, an upper stamp clamp, moveable in two dimensions in a trajectory plane defined by the x-axis and z-axis, a stamp comprising a flexible material, the stamp having a first end attached to the lower stamp clamp and a second end attached to the upper stamp clamp, such that a cross section of the stamp parallel to the trajectory plane forms an arc extending from an origin point Q on the lower stamp clamp having (x,z) coordinates (0,0) to point E on the upper stamp clamp, this arc being described by the mathematical function $\theta(s)$, where s is the curvilinear distance along the arc measured from point Q, and $\theta$ is the angle between the print plane and an imaginary line, the imaginary line being tangent to the cross section of the stamp at s, and wherein, during a print operation, the upper stamp clamp is moved in a trajectory comprising a plurality of xz positions of the upper clamp stamp that blend into a substantially continuous motion, the trajectory being effective in laying the stamp down smoothly and flat upon the print surface in a manner such that a moving contact front between the stamp and the print surface is created, the contact front being disposed substantially along a line characterized by a contact-front coordinate $s_0$ $x_0$ that increases as the trajectory progresses, the trajectory also being effective in causing the curvature $$\frac{d\theta}{ds}$$

of the stamp at or near the contact front to be substantially constant throughout the motion.

Another aspect of the printer comprises a print-force-application system effective in pressing the stamp against the print surface, and defining an approximate contact front disposed substantially along a line $l_B$ parallel to the y-axis in the xy plane, the line $l_B$ intersecting the trajectory plane at $(x, z)=(x_B, 0)$, the approximate-contact-front x-coordinate $x_B$ increasing as the trajectory progresses and being substantially equal, at any stage of the trajectory, to the arc-length coordinate $s_B$ of point B, inasmuch as the arc of the stamp is assumed to be substantially flat over the segment from point Q to point B.

Another aspect of the printer further comprises a stamp-control system movable along the x-axis, wherein, throughout the trajectory, each xz position of the upper stamp clamp is a function of the displacement $x_C$ of the stamp-control system along the x-axis; the trajectory being effective in laying the stamp down upon the print surface such that the stamp is in continuous contact with a contact surface of the stamp-control system throughout the trajectory, the location of the contact surface being characterized by an arc-length coordinate $s_C$ that increases as the trajectory progresses.

In another aspect of the printer, the stamp-control system is disposed along a line $l_C$ parallel to the y-axis, line $l_C$ intersecting the trajectory plane at point C having coordinates $x_C$ and $z_C$, where $z_C$ is a fixed, positive z-coordinate during any one printing operation, whereas $x_C$ increases as the trajectory progresses, in coordination with the contact-front coordinate $x_0$.

In another aspect of the printer, the contact surface of the stamp-control system is a plane delimited in the x direction by two lines $l_C$ and $l_D$ separated by a fixed distance $W_{CD}$, these lines being parallel to the y-axis and intersecting the trajectory plane at points C and D respectively, these points having coordinates $(x_C, z_C)$ and $(x_D, z_D)$ respectively, such that the contact surface is defined by the three parameters $(x_C, z_C, \theta_{CD})$, where $$\theta_{CD} \equiv \tan^{-1}\left(\frac{z_D - z_C}{x_D - x_C}\right)$$

is the angle between the contact surface and the print plane, and such that the stamp angle $\theta(s)$ between arc-length coordinates $s=s_C$ and $s=s_D$ is substantially equal to $\theta_{CD}$; that is, $$\theta(s) \approx \theta_{CD} \text{ for } s_C \leq s \leq s_D.$$

In another aspect of the printer, the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x_E$ and $z_E$; the upper-clamp line $l_E$ being disposed on the upper stamp clamp at a radius $R_S$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta_E \equiv \theta(L)$.

In another aspect of the printer, the trajectory comprises a plurality of configurations, each configuration described by the coordinate $s_0 \equiv x_0$ of the contact front and by corresponding coordinates $x_P$, $z_P$ of the pivot line given by the equations $$x_P = x_E + R_s \cos\theta_E$$

$$z_P = z_E + R_s \sin\theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $\theta(s)=0$ for $0 \leq s \leq s_0$, whereas for $s > s_0$, $\theta(s)$ is determined by solution of the differential equations $$\frac{du}{ds} = F(u),$$

the lower-end boundary conditions $$u_0 \equiv \begin{Bmatrix} u_{10} \\ u_{20} \end{Bmatrix} \equiv \begin{Bmatrix} \theta_0 \\ \frac{d\theta}{ds}\Big|_0 \end{Bmatrix} = \begin{Bmatrix} 0 \\ \kappa_0 \end{Bmatrix},$$

and the upper-end boundary condition $$T(\beta) \equiv EI \frac{d\theta}{ds}\Big|_E + F_{XO} R_S \sin\theta_E - w(s-s_0)R_s \cos\theta_E = 0,$$

wherein $$u \equiv \begin{Bmatrix} u_1 \\ u_2 \end{Bmatrix} \equiv \begin{Bmatrix} \theta \\ \frac{d\theta}{ds} \end{Bmatrix}, F(u) \equiv \begin{Bmatrix} u_2 \\ \frac{F_{XO}}{EI} \sin u_1 - \frac{w(s-s_0)}{EI} \cos u_1 \end{Bmatrix},$$

$\kappa_0$ is a specified curvature at point O, the parameter $\beta = F_{XO}$, unknown a priori, is the internal x-directed force acting on the stamp's cross section at $s=s_0$ per unit depth of the stamp in the y direction, E is Young's modulus of the stamp, I is the area moment of inertia of the stamp's cross section per unit depth in the y-direction, and w is the weight per unit area of the stamp; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined value $\beta^{(1)}$ of the unknown parameter $\beta$, whereupon the differential equations are solved again; this iteration procedure being applied repeatedly until the correct auxiliary boundary condition $T(\beta)=0$ is achieved to within some tolerance.

In another aspect of the printer the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x_E$ and $z_E$; the upper-clamp line $l_E$ being disposed on the upper stamp clamp at a radius $R_S$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta \equiv \theta(L)$.

In another aspect of the printer, the trajectory comprises a plurality of configurations, each configuration described by the coordinate $s_B \equiv x_B$ of the approximate contact front and by corresponding coordinates $x_P$, $z_P$ of the pivot line given by the equations $x_P = x_E + R_s \cos \theta_E$ $z_P = z_E + R_s \sin \theta_E$, where $$x_E = \int_0^L \cos\theta(s) ds \text{ and } z_E = \int_0^L \sin\theta(s) ds,$$

and where the mathematical function $\theta(s)$ describing the shape of the arc for a given configuration is assumed to be $\theta(s)=0$ for $0 \leq s \leq s_B$, whereas for $s > s_B$, $\theta(s)$ is determined by solution of the differential equations $$\frac{du}{ds} = F(u),$$

the lower-end boundary conditions $$u_B \equiv \begin{Bmatrix} u_{1B} \\ u_{2B} \end{Bmatrix} \equiv \begin{Bmatrix} \theta_B \\ \frac{d\theta}{ds}\Big|_B \end{Bmatrix} = \begin{Bmatrix} 0 \\ \kappa_B \end{Bmatrix},$$

and the upper-end boundary condition $$T(\beta) \equiv EI \frac{d\theta}{ds}\Big|_E + F_{XB} R_S \sin\theta_E - w(s-s_B)R_s \cos\theta_E = 0,$$

wherein $$u \equiv \begin{Bmatrix} u_1 \\ u_2 \end{Bmatrix} \equiv \begin{Bmatrix} \theta \\ \frac{d\theta}{ds} \end{Bmatrix}, F(u) \equiv \begin{Bmatrix} u_2 \\ \frac{F_{XB}}{EI} \sin u_1 - \frac{w(s-s_B)}{EI} \cos u_1 \end{Bmatrix},$$

$\kappa_B$ is a specified curvature at point B, the parameter $\beta = F_{XB}$, unknown a priori, is the internal x-directed force acting on the stamp's cross section at $s=s_B$ per unit depth of the stamp in the y direction, E is Young's modulus of the stamp, I is the area moment of inertia of the stamp's cross section per unit depth in the y-direction, and w is the weight per unit area of the stamp; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined value $\beta^{(1)}$ of the unknown parameter $\beta$, whereupon the differential equations are solved again; this iteration procedure being applied repeatedly until the correct auxiliary boundary condition $T(\beta)=0$ is achieved to within some tolerance.

In another aspect of the printer, the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x_E$ and $z_E$, the upper-clamp line $l_E$ being disposed on the upper stamp clamp at a radius $R_s$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta_E \equiv \theta(L)$.

In another aspect of the printer, the trajectory comprises a plurality of configurations, each configuration described by the coordinate $s_0 \equiv x_0$ of the contact front and by corresponding coordinates $x_P$, $z_P$ of the pivot line given by the equations:

$$x_P = x_E + R_s \cos \theta_E$$

$$z_P = z_E + R_s \sin \theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s) = 0 \text{ for } 0 \le s \le s_0,$$

whereas for $s > s_0$, $\theta(s)$ is determined by solution of the differential equations $$\frac{du}{ds} = F(u),$$

the lower-end boundary conditions $$u_0 \equiv \begin{Bmatrix} u_{10} \\ u_{20} \\ u_{30} \\ u_{40} \end{Bmatrix} \equiv \begin{Bmatrix} \theta_0 \\ \frac{d\theta}{ds}\Big|_0 \\ F_{X_0} \\ F_{Z_0} \end{Bmatrix} = \begin{Bmatrix} 0 \\ 0 \\ F_{X_0} \\ F_{Z_0} \end{Bmatrix},$$

and the auxiliary boundary conditions $$T(\beta) = 0,$$

wherein $$u \equiv \begin{Bmatrix} u_1 \\ u_2 \\ u_3 \\ u_4 \end{Bmatrix} \equiv \begin{Bmatrix} \theta_0 \\ \frac{d\theta}{ds} \\ F_x(s) \\ F_z(s) \end{Bmatrix}, F(u) \equiv \begin{Bmatrix} u_2 \\ \frac{u_3}{EI}\sin u_1 - \frac{u_4}{EI}\cos u_1 \\ -p(s)\sin u_1 - f(s)\cos u_1 \\ w + p(s)\cos u_1 - f(s)\sin u_1 \end{Bmatrix},$$

$$T(\beta) \equiv \begin{Bmatrix} z_C - \int_0^{s_C} \sin\theta(s)ds \\ \theta_C - \theta_{CD} \\ EI\frac{d\theta}{ds}\Big|_E + F_{XE}R_S\sin\theta_E - F_{ZE}R_S\cos\theta_E \end{Bmatrix},$$

and wherein $F_X(s)$ and $F_Z(s)$ are functions of s describing the internal x-directed and z-directed forces acting on the stamp's cross section at s per unit depth of the stamp in the y direction, $F_{XE} \equiv F_X(s_E)$, $F_{ZE} \equiv F_Z(s_E)$, $\beta$ is a vector of parameters that are unknown a priori, $$\beta = \begin{Bmatrix} s_0 \\ F_{X_0} \\ F_{Z_0} \end{Bmatrix},$$

$s_0$ is the aforementioned arc-length coordinate of the contact front, $F_{X_0} \equiv F_X(s_0)$, $F_{Z_0} \equiv F_Z(s_0)$, E is Young's modulus of the stamp, I is the area moment of inertia of the stamp's cross section per unit depth in the y-direction, w is the weight per unit area of the stamp, p(s) and f(s) are functions of s describing forces applied normal to the stamp and tangential to the stamp respectively by the print-force-application system, the stamp-control system and the print surface, $s_C$ is the value of arc-length coordinate a at point C, $\theta_C \equiv \theta(s_C)$ is the angle of the arc at point C, and $\theta_{CD}$ is the aforementioned angle of the stamp-control system's contact surface; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton-Raphson iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined vector $\beta^{(1)}$ whereupon the differential equations are solved again; this iteration procedure being applied repeatedly until the correct auxiliary boundary conditions $T(\beta) = 0$ are achieved to within some tolerance.

In another aspect of the printer, the trajectory comprises a plurality of configurations, each configuration described by the coordinate $s_0 \equiv x_0$ of the contact front and by corresponding coordinates $x_P$, $z_P$ of the pivot line given by the equations:

$$x_P = x_E + R_s \cos \theta_E$$

$$z_P = z_E + R_s \sin \theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s) = 0 \text{ for } 0 \le s \le s_0,$$

whereas for $s > s_0$, $\theta(s)$ is determined in stamp segments OC and DE by solution of the differential equations $$\frac{du}{ds} = F(u),$$

the lower-end boundary conditions $$u_0 \equiv \begin{Bmatrix} u_{10} \\ u_{20} \end{Bmatrix} \equiv \begin{Bmatrix} \theta_0 \\ \dfrac{d\theta}{ds}\bigg|_0 \end{Bmatrix} = \begin{Bmatrix} 0 \\ \kappa_0 \end{Bmatrix},$$

and the upper-end boundary condition $$T(\beta) \equiv EI \dfrac{d\theta}{ds}\bigg|_E + F_{XE} R_S \sin\theta_E - F_{ZE} R_S \cos\theta_E = 0,$$

wherein $$u \equiv \begin{Bmatrix} u_1 \\ u_2 \end{Bmatrix} \equiv \begin{Bmatrix} \theta \\ \dfrac{d\theta}{ds} \end{Bmatrix},$$

$$F(u) \equiv \begin{Bmatrix} u_2 \\ \dfrac{F_X(s)}{EI} \sin u_1 - \dfrac{F_Z(s)}{EI} \cos u_1 \end{Bmatrix},$$

$\kappa_0$ is a specified curvature at point O, E is Young's modulus of the stamp, I is the area moment of inertia of the stamp's cross section per unit depth in the y-direction, w is the weight per unit area of the stamp, $F_x(s)$ and $F_z(s)$ are the x-directed and z-directed stamp forces per unit length of stamp in the y direction, given by $$F_x(s) = \begin{cases} F_{x0}, & 0 \leq s \leq s_C \\ F_{x0} + \Delta F_x, & s_D \leq s \leq s_E, \end{cases}$$

and $$F_z(s) = \begin{cases} 0, & 0 \leq s \leq s_0 \\ w(s - s_0), & s_0 \leq s \leq s_C \\ w(s - s_0) + \Delta F_z, & s_D \leq s \leq s_E, \end{cases}$$

in which $F_{z0} \equiv F_x(s_0) \equiv \beta$ is a parameter that is unknown a priori, and the differences $\Delta F_x$ and $\Delta F_z$ are respectively the differences $$\Delta F_x \equiv F_x(s_D) - F_x(s_C)$$

$$\Delta F_z \equiv F_z(s_D) - F_z(s_C)$$

that occur across stamp segment CD where the stamp-control system contacts the stamp, the values of which differences, along with the value of the difference $$\Delta \kappa \equiv \dfrac{d\theta}{ds}\bigg|_D - \dfrac{d\theta}{ds}\bigg|_C,$$

may be calculated from the three equations of static equilibrium for the stamp under the action of forces applied to the stamp by the stamp-control system, these three differences together with $\theta_D = \theta_C$ permitting numerical integration for stamp segment DE to proceed immediately from the numerical-integration result obtained at the final point C in stamp segment OC, and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\dfrac{\partial T}{\partial \beta}\right]^{-1}_{\beta = \beta^{(0)}},$$

Newton iteration $$\beta^{(n+1)} = \beta^{(n)} - \left[\dfrac{\partial T}{\partial \beta}\right]^{-1}_{\beta = \beta^{(n)}} T(\beta^{(n)})$$

is applied to obtain a refined vector $\beta^{(1)}$, whereupon the differential equations are solved again; this iteration procedure being applied repeatedly until the correct auxiliary boundary conditions $T(\beta) = 0$ are achieved to within some tolerance.

In another aspect of the printer, a stamp-control system movable along the x-axis, wherein, throughout the trajectory, each xz position of the upper stamp clamp is a function of the displacement $x_C$ of the stamp-control system along the x-axis; the trajectory being effective in laying the stamp down upon the print surface such that the stamp is in continuous contact with a contact surface of the stamp-control system, the location of the contact surface being characterized by an arc-length coordinate $s_C$ that increases as the trajectory progresses.

In another aspect of the printer, the stamp-control system is disposed along a line $l_C$ parallel to the y-axis, line $l_C$ intersecting the trajectory plane at point C having coordinates $x_C$ and $z_C$, where $z_C$ is a fixed, positive z-coordinate during any one printing operation, whereas $x_C$ increases as the trajectory progresses, in coordination with the contact-front coordinate $x_0$.

In another aspect of the printer the contact surface of the stamp-control system is a plane delimited in the x direction by two lines $l_C$ and $l_D$ separated by a fixed distance $W_{CD}$, these lines being parallel to the y-axis and intersecting the trajectory plane at points C and D respectively, these points having coordinates $(x^C, z_C)$ and $(x_D, z_D)$ respectively, such that the contact surface is defined by the three parameters $(x_C, z_C, \theta_{CD})$, where $$\theta_{CD} \equiv \tan^{-1}\left(\dfrac{z_D - z_C}{x_D - x_C}\right)$$

is the angle between the contact surface and the print plane, and such that the stamp angle $\theta(s)$ between arc-length coordinates $s = s_C$ and $s = s_D$ is substantially equal to $\theta_{CD}$; that is, $$\theta(s) \approx \theta_{CD} \text{ for } s_C \leq s \leq s_D.$$

In another aspect of the printer, the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x_E$ and $z_E$; the upper-clamp line $l_E$ being disposed on the upper stamp clamp at a radius $R_S$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta_E \equiv \theta(L)$.

In another aspect of the printer, the trajectory comprises a plurality of configurations, each configuration described by the coordinate $s_0 \equiv x_0$ of the contact front and by corresponding coordinates $x_P$, $z_P$ of the pivot line given by the equations:

$$x_P = x_E + R_s \cos\theta_E$$

$$z_P = z_E + R_s \sin\theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s) = 0 \text{ for } 0 \le s \le s_0,$$

whereas for $s > s_0$, $\theta(s)$ is determined by solution of the differential equations $$\frac{du}{ds} = F(u),$$

the lower-end boundary conditions $$u_0 \equiv \begin{Bmatrix} u_{10} \\ u_{20} \\ u_{30} \\ u_{40} \end{Bmatrix} \equiv \begin{Bmatrix} \theta_0 \\ \frac{d\theta}{ds}\big|_0 \\ F_{X_0} \\ F_{Z_0} \end{Bmatrix} = \begin{Bmatrix} 0 \\ 0 \\ F_{X_0} \\ F_{Z_0} \end{Bmatrix},$$

and the auxiliary boundary conditions $$T(\beta) = 0,$$

wherein $$u \equiv \begin{Bmatrix} u_1 \\ u_2 \\ u_3 \\ u_4 \end{Bmatrix} \equiv \begin{Bmatrix} \theta \\ \frac{d\theta}{ds} \\ F_x(s) \\ F_z(s) \end{Bmatrix}, F(u) \equiv \begin{Bmatrix} u_2 \\ \frac{u_3}{EI}\sin u_1 - \frac{u_4}{EI}\cos u_1 \\ -p(s)\sin u_1 - f(s)\cos u_1 \\ w + p(s)\cos u_1 - f(s)\sin u_1 \end{Bmatrix},$$

$$T(\beta) \equiv \begin{Bmatrix} z_C - \int_0^{s_C} \sin\theta(s)ds \\ \theta_C - \theta_{CD} \\ EI\frac{d\theta}{ds}\big|_E + F_{XE}R_S\sin\theta_E - F_{ZE}R_S\cos\theta_E \end{Bmatrix},$$

and wherein $F_X(s)$ and $F_Z(s)$ are functions of s describing the internal x-directed and z-directed forces acting on the stamp's cross section at s per unit depth of the stamp in the y direction, $F_{XE} \equiv F_X(s_E)$, $F_{ZE} \equiv F_Z(s_E)$, $\beta$ is a vector of parameters that are unknown a priori, $$\beta = \begin{Bmatrix} s_0 \\ F_{X_0} \\ F_{Z_0} \end{Bmatrix},$$

$s_0$ is the aforementioned arc-length coordinate of the contact front, $F_{X0} \equiv F_X(0)$, $F_{Z0} \equiv F_Z(0)$, E is Young's modulus of the stamp, I is the area moment of inertia of the stamp's cross section per unit depth in the y-direction, w is the weight per unit area of the stamp, p(s) and f(s) are functions of s describing forces applied normal to the stamp and tangential to the stamp respectively by the print-force-application system, the stamp-control system and the print surface, $s_C$ is the value of arc-length coordinate s at point C, $\theta_C \equiv \theta(s_C)$ is the angle of the arc at point C, and $\theta_{CD}$ is the aforementioned angle of the stamp-control system's contact surface; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton-Raphson iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined vector $\beta^{(1)}$, whereupon the differential equations are solved again; this iteration procedure being applied repeatedly until the correct auxiliary boundary conditions $T(\beta) = 0$ are achieved to within some tolerance.

In another aspect of the printer, the trajectory comprises a plurality of configurations, each configuration described by the coordinate $s_B \equiv x_B$ of the approximate contact front and by corresponding coordinates $x_P$, $z_P$ of the pivot line given by the equations $$x_P = x_E + R_s \cos\theta_E$$

$$z_P = z_E + R_s \sin\theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s) = 0 \text{ for } 0 \le s \le s_B,$$

whereas for $s > s_B$, $\theta(s)$ is determined in stamp segments OC and DE by solution of the differential equations $$\frac{du}{ds} = F(u),$$

the lower-end boundary conditions $$u_B \equiv \begin{Bmatrix} u_{1B} \\ u_{2B} \end{Bmatrix} \equiv \begin{Bmatrix} \theta_B \\ \frac{d\theta}{ds}\big|_B \end{Bmatrix} = \begin{Bmatrix} 0 \\ \kappa_B \end{Bmatrix},$$

and the upper-end boundary condition $$T(\beta) \equiv EI\frac{d\theta}{ds}\big|_E + F_{XE}R_S\sin\theta_E - F_{ZE}R_S\cos\theta_E = 0,$$

wherein $$u \equiv \begin{Bmatrix} u_1 \\ u_2 \end{Bmatrix} \equiv \begin{Bmatrix} \theta \\ \frac{d\theta}{ds} \end{Bmatrix},$$

$$F(u) \equiv \left\{ \begin{array}{c} u_2 \\ \dfrac{F_x(s)}{EI}\sin u_1 - \dfrac{F_z(s)}{EI}\cos u_1 \end{array} \right\},$$

$\kappa_B$ is a specified curvature at point B, E is Young's modulus of the stamp, I is the area moment of inertia of the stamp's cross section per unit depth in the y-direction, w is the weight per unit area of the stamp, $F_x(s)$ and $F_z(s)$ are the x-directed and z-directed stamp forces per unit length of stamp in the y direction, given by $$F_x(s) = \begin{cases} F_{x0}, & 0 \leq s \leq s_C \\ F_{x0} + \Delta F_x, & s_D \leq s \leq s_E, \end{cases}$$

and $$F_z(s) = \begin{cases} 0, & 0 \leq s \leq s_0 \\ w(s-s_0), & s_0 \leq s \leq s_C \\ w(s-s_0) + \Delta F_z, & s_D \leq s \leq s_E, \end{cases}$$

in which $F_{x0} \equiv F_x(s_0) \equiv \beta$ is a parameter that is unknown a priori, and the differences $\Delta F_x$ and $\Delta F_z$ are respectively the differences $\Delta F_x \equiv F_x(s_D) - F_x(s_C)$ $\Delta F_z \equiv F_z(s_D) - F_z(s_C)$ that occur across stamp segment CD where the stamp-control system contacts the stamp, the values of which differences, along with the value of the difference $$\Delta \kappa \equiv \left.\dfrac{d\theta}{ds}\right|_D - \left.\dfrac{d\theta}{ds}\right|_C,$$

may be calculated from the three equations of static equilibrium for the stamp under the action of forces applied to the stamp by the stamp-control system, these three differences together with $\theta_D = \theta_C$ permitting numerical integration for stamp segment DE to proceed immediately from the numerical-integration result obtained at the final point C in stamp segment OC, and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\dfrac{\partial T}{\partial \beta}\right]^{-1}_{\beta=\beta^{(0)}},$$

Newton iteration $$\beta^{(n+1)} = \beta^{(n)} - \left[\dfrac{\partial T}{\partial \beta}\right]^{-1}_{\beta=\beta^{(n)}} T(\beta^{(n)})$$

is applied to obtain a refined vector $\beta^{(1)}$ whereupon the differential equations are solved again; this iteration procedure being applied repeatedly until the correct auxiliary boundary conditions $T(\beta)=0$ are achieved to within some tolerance.

In another aspect of the printer, the print-force-application system comprises a flat-iron.

In another aspect of the printer, the stamp-control system comprises a vacuum bar.

Disclosed is a printing apparatus, comprising a receiver means whose receiving surface lies in an xy plane, the normal to the surface defining a z-axis direction, a lower stamp clamp means for fixing a first edge of a stamp, an upper stamp clamp means for holding a second edge of a stamp for movement in the xz directions, a flexible stamp means for printing to the receiver, said flexible stamp in substantially the form of a sheet defining edges, the first edge of which is affixed to the lower stamp clamp, and the opposing second edge of which is affixed to the upper stamp clamp, thereby allowing the stamp to hang in a curve under gravity and the sheet's own stiffness, such that every normal to the stamp's curved surface lies substantially parallel to the xz plane, and a trajectory-producing means for moving the upper stamp clamp along a prescribed trajectory in the xz plane, such that the stamp is draped upon the receiving surface in a manner that causes the curvature of the stamp near a contact front at a point B to be constant throughout the trajectory.

Another aspect of the apparatus further comprises print-force application means for applying pressure upon the stamp means against the receiver means and for defining the contact front.

Another aspect of the apparatus further comprises stamp-control means for defining a point C through which the curvature of the sheet will pass throughout the trajectory.

BRIEF DESCRIPTION OF THE DRAWINGS

FIGS. 6a, 6b, and 6c are three-dimensional views of the printing machine of the invention at the start, the middle, and the end of the printing process, respectively.

DETAILED DESCRIPTION OF THE INVENTION

1. Overall Description

Figure 1:
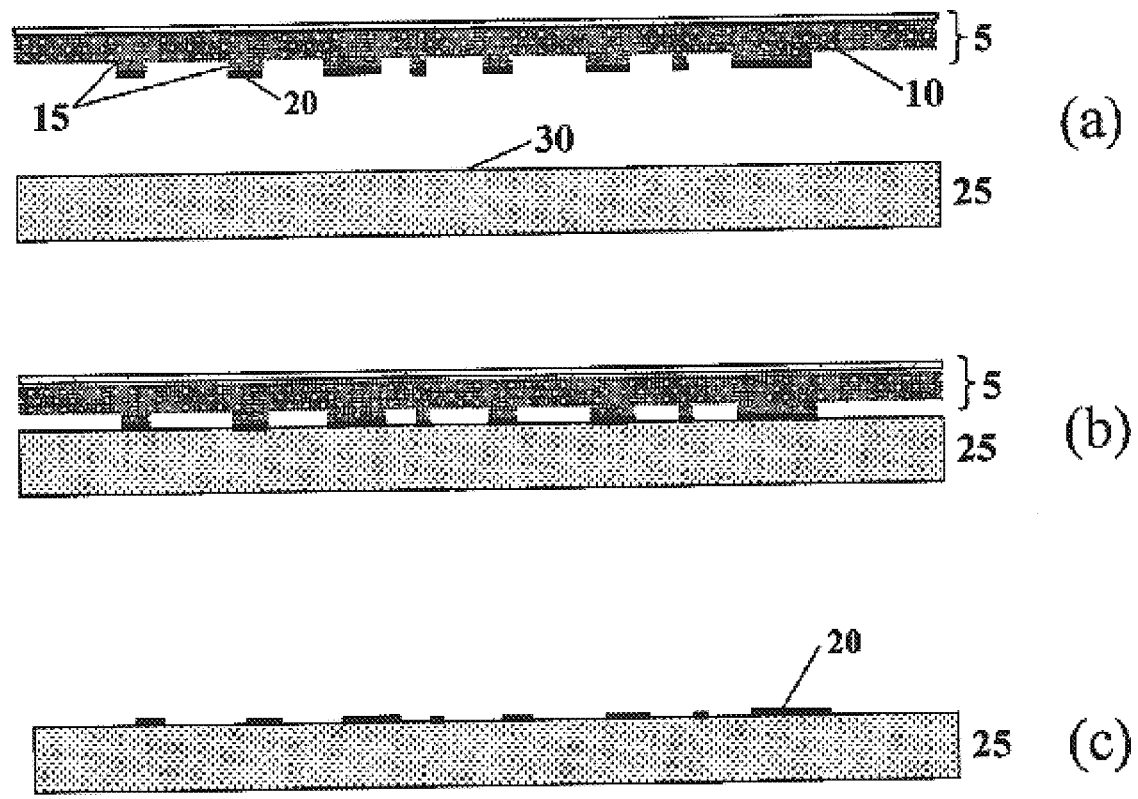
FIG. 1 is a schematic drawing of a micro-contact printing process.

FIG. 1 shows a schematic of the printing process accomplished by the invention. Apart from the printing machine itself, the printing process requires three elements, as shown in FIG. 1a: a stamp 5 having a printing surface 10 embossed with a raised pattern 15; ink 20 that coats the raised pattern 15; and a receiver 25 to whose receiver surface 30 the ink 20 will be transferred during the printing process by mechanical contact of raised pattern 15 and receiver surface 30, as shown in FIG. 1b. The printing machine (not shown in FIG. 1) must accomplish this transfer in such a way that after separation of the stamp 5 from the receiver 25 (FIG. 1c), the placement of transferred ink on the receiver surface 30 faithfully replicates the raised pattern 15. The invention provides such a printing machine having a number of advantages over prior-art machines.

Figure 2:
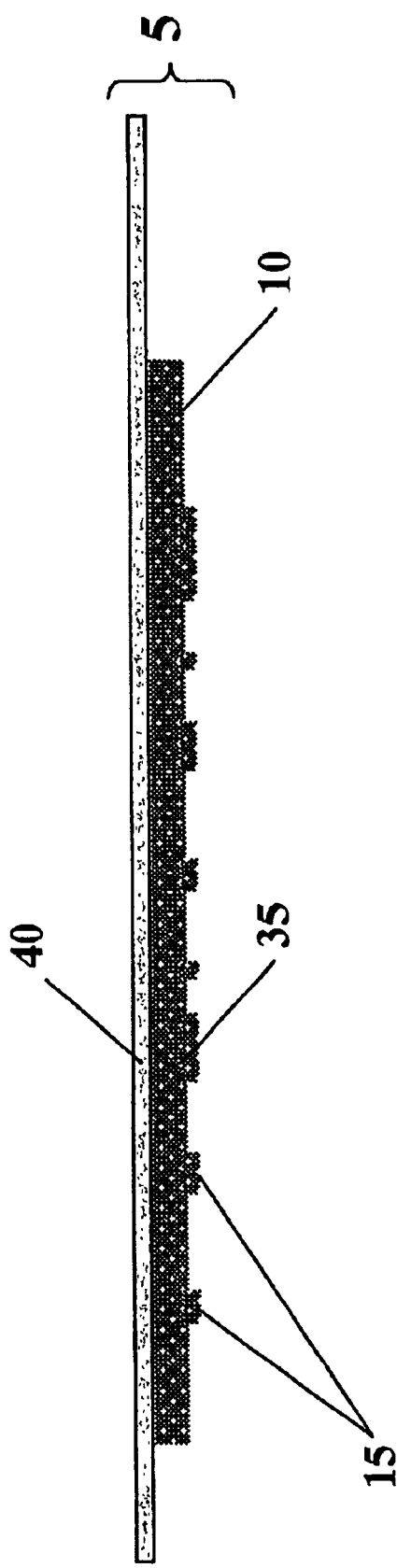
FIG. 2 is a schematic drawing of a two-layer stamp of the type used by this invention.

Although the printing machine may be used with any type of stamp consistent with the following detailed description, the preferred embodiment of the machine uses the type of stamp described in commonly assigned Biebuyck et al., U.S. Pat. No. 5,817,242, entitled STAMP FOR LITHOGRAPHIC PROCESS, issued Oct. 6, 1998, the disclosures of which are incorporated by reference herein in their entirety. As shown in FIG. 2, this type of stamp comprises two bonded layers, a polymer layer 35, upon whose printing surface 10 the raised pattern 15 is embossed, and a back-plane layer 40, typically composed of metal or other material having a high modulus of elasticity. The back-plane layer 40 provides high lateral stiffness, and therefore high feature-placement accuracy of the printed pattern on receiver surface 30. Such accuracy is difficult to achieve—particularly for large-area stamps—using the low-modulus polymer layer 35 alone. As drawn in FIG. 2, the area of the back-plane layer 40 is typically somewhat larger than that of the polymer layer 35, for reasons explained subsequently.

Figure 3:
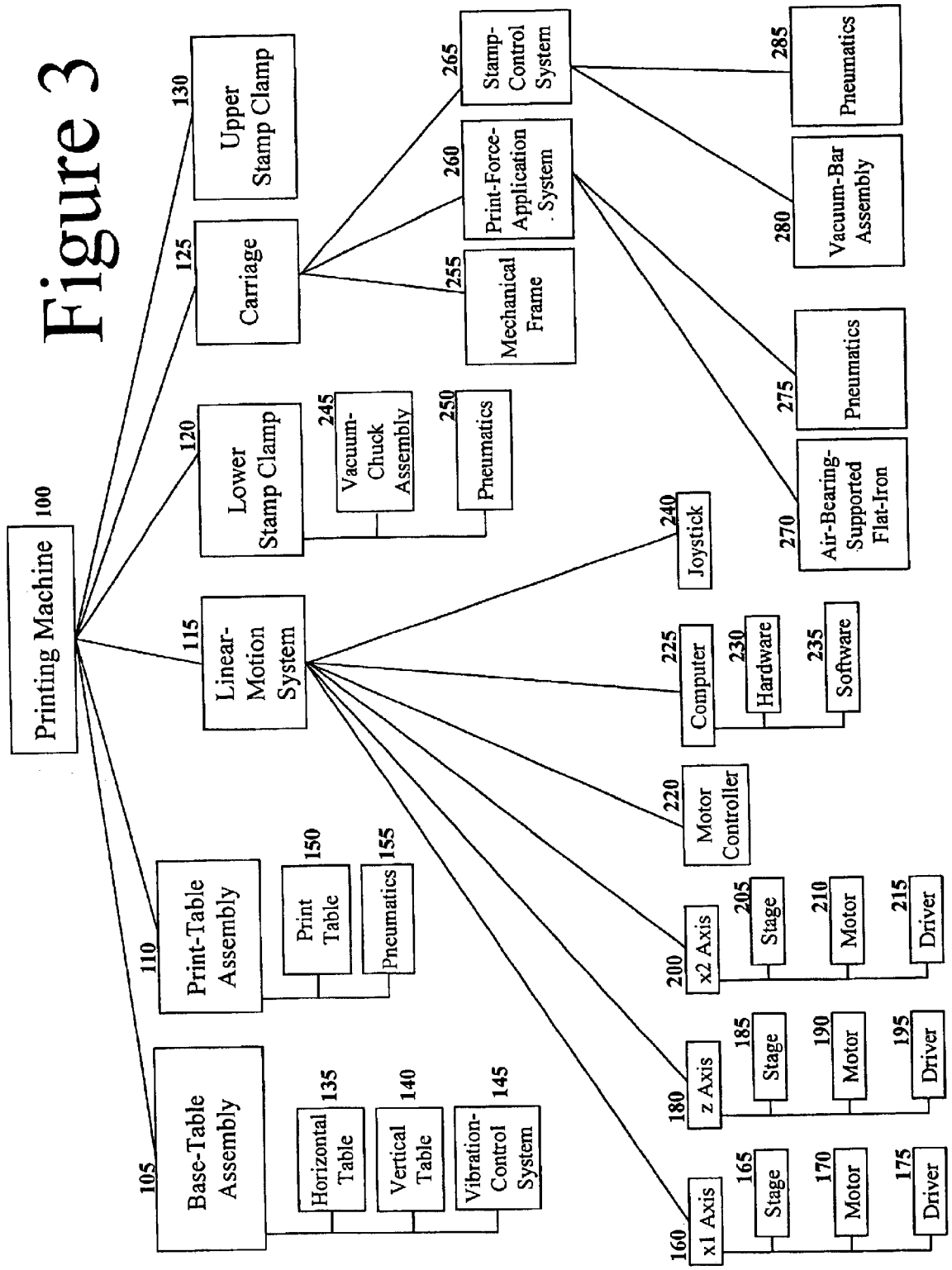
FIG. 3 is a block diagram specifying the components of a printing machine.

Referring to FIG. 3, the printing machine 100 described in this invention will preferably comprise six subsystems, including a base-table assembly 105, a print-table assembly 110, a linear-motion system 115, a lower stamp clamp 120, a carriage 125, and an upper stamp clamp 130.

As also shown in FIG. 3, four of these six subsystems may be further divided into more detailed subsystems. The base-table assembly 105 comprises a horizontal base table 135, a vertical base table 140, and a vibration-control system 145. The print-table assembly 110 comprises the print-table itself, 150, as well as pneumatics 155. The linear-motion system 115 comprises three axes of motion (160, 180, and 200), requiring three sets of linear-motion stages (165, 185, 205); motors (170, 190, and 210) and motor drivers (175, 195, 215); a multi-axis motor controller 220; a computer 225 utilizing standard hardware 230 but specialized software 235; and a joystick 240 or similar input device. The lower stamp clamp 120 comprises a vacuum chuck assembly 245 that may be micro-positioned with respect to the print table 150, as well as pneumatics 250 to operate the vacuum chuck. The carriage 125 comprises a mechanical frame 255; a print-force-application system 260 for applying the force of contact between the stamp 5 and the receiver 25 during printing; and a stamp-control system 265 to insure that the critical geometry of the stamp is maintained throughout the printing process, thereby to achieve the best possible printed replica of the embossed pattern 15 on the receiver 25.

The latter two systems may be further subdivided into components. The print-force-application system 260 comprises an air-bearing-supported flat-iron 270 to apply the force of contact between stamp 5 and receiver 25 during printing, and pneumatics 275 to control the flow of air to the flat-iron. The stamp-control system comprises a vacuum-bar assembly 280 to control the geometry of the stamp during printing, and pneumatics 285 to operate the vacuum bar.

Figure 4:
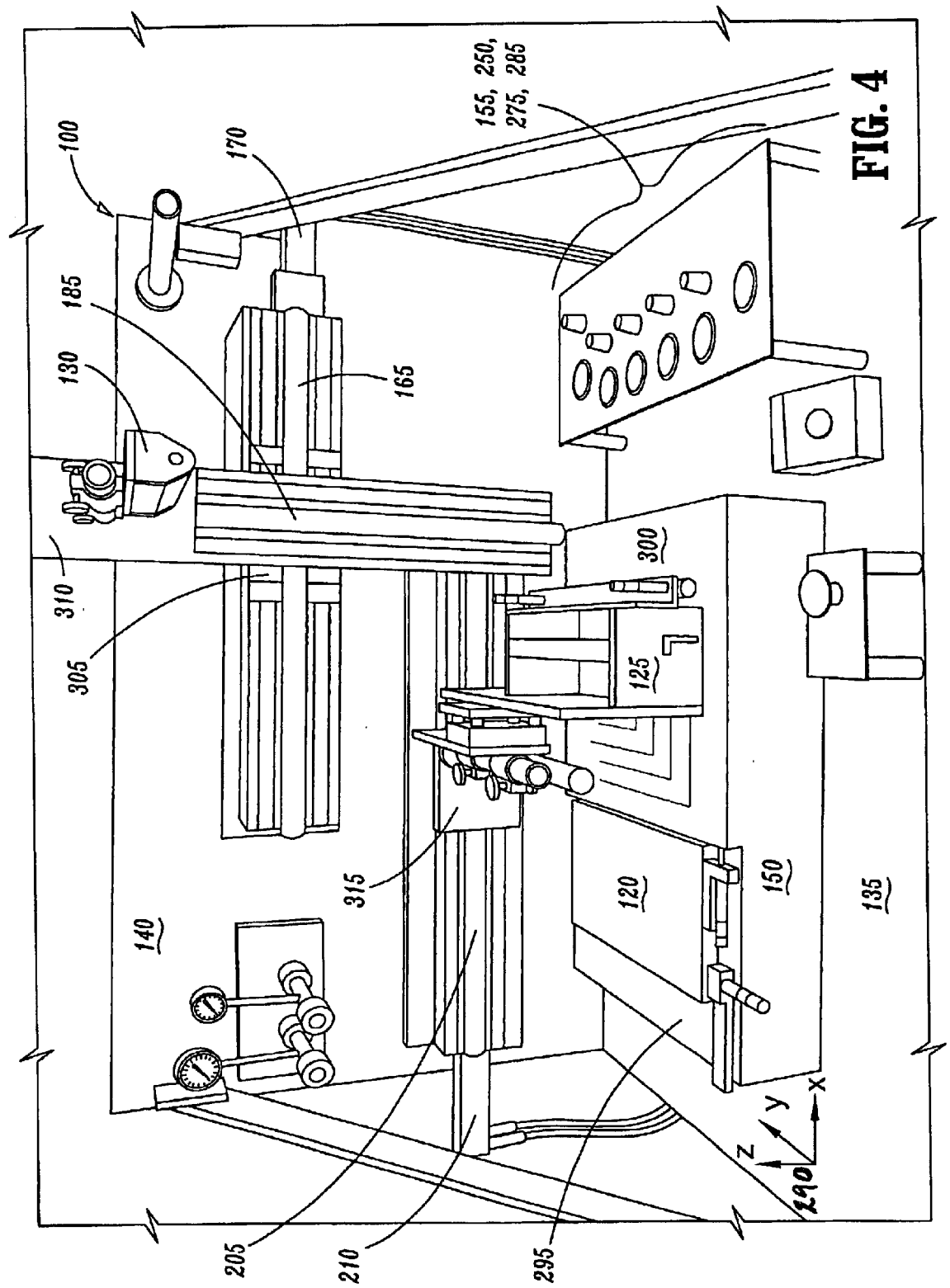
FIG. 4 is a three-dimensional view of an embodiment of the printing machine of the invention, prior to loading the stamp.

FIG. 4 depicts the entire printing machine 100 without the stamp installed. For reference, an xyz coordinate system 290 is shown; on subsequent figures, the xyz orientation of this coordinate system (but not the origin) remains consistent. The base-table assembly 105 (from FIG. 3) comprises a horizontal base table 135 and a vertical base table 140, affixed to each other at right angles, forming an "L" shape. The print table 150 rests on the horizontal base table 135, and the lower stamp clamp 120 rests on the print table's stepped-down surface 295, which is preferably machined lower than its elevated receiver surface 300, for reasons clarified later. Pneumatic controls represented by 155, 250, 275, and 285 are shown at the right end of the horizontal base table 135.

The system of three computer-driven stages (165, 185, 205) are affixed to the vertical base table 140. Two of these stages, 165 and 185, which correspond to axes ($x_1$,z), form a two-axis set: horizontal stage 165 is affixed to the vertical base table 140; stage 185 is affixed to faceplate 305 of stage 165. Thus faceplate 310 of z stage 185 is capable of executing two-dimensional motion parallel to the xz plane. The third computer-driven stage, 205, corresponding to axis $x_2$, is affixed to the vertical base table, parallel to stage 165 and below it, in such a way that the z stage 185 can pass over the body of the $x_2$ stage 205 without interference.

The upper stamp clamp 130 is affixed to faceplate 310 of z-stage 185; thus, the upper stamp clamp 130 can move in two dimensions parallel to the xz plane. Likewise, the carriage 125 is affixed to faceplate 315 of $x_2$-stage 205; thus, the carriage can move in one dimension parallel to the x-axis. Because the motors (170, 190, 210) driving all three stages are computer controlled via the same controller 220 (from FIG. 3), it is possible to provide coordinated triple-axis movement of the upper stamp clamp and the carriage simultaneously.

Figure 5:
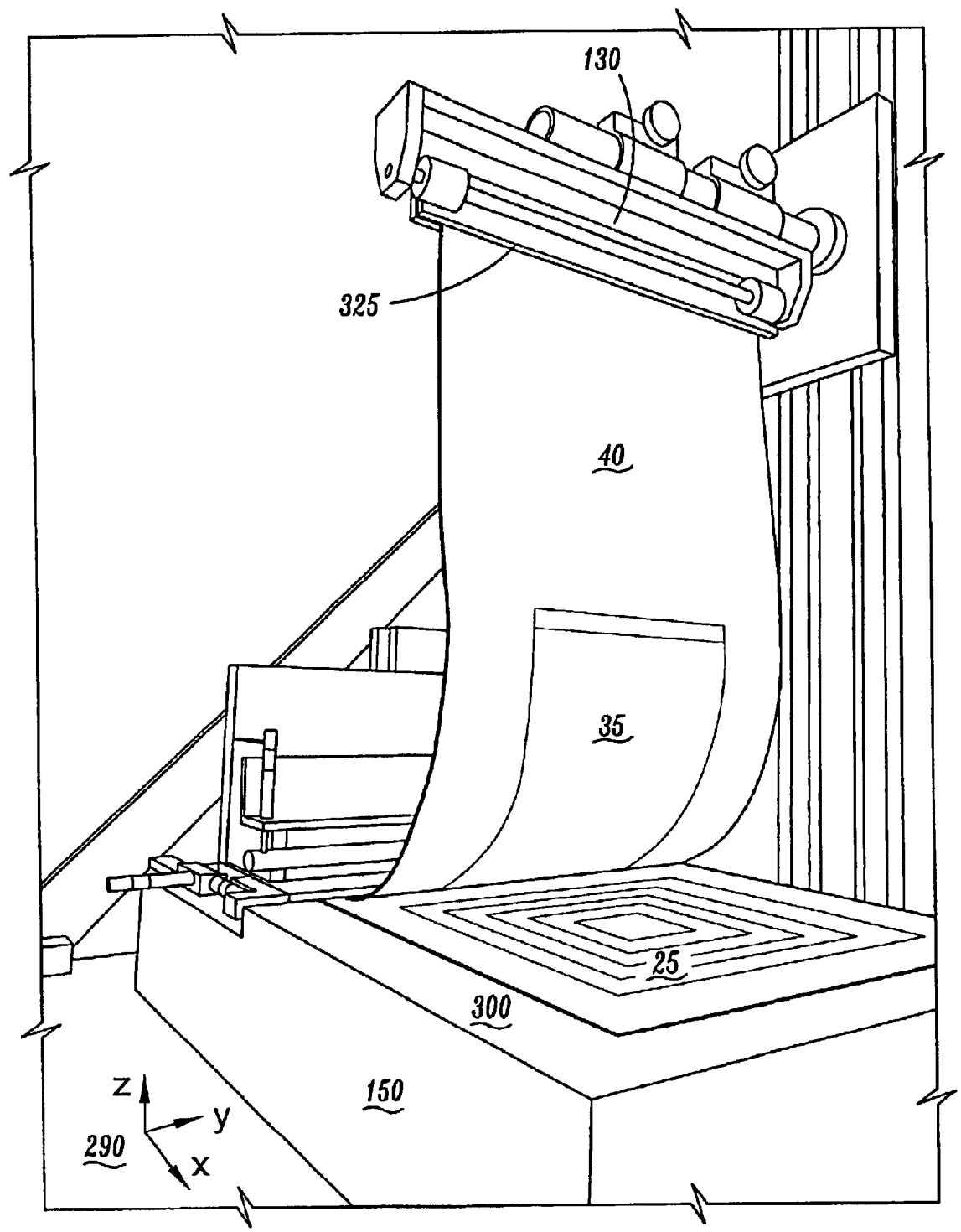
FIG. 5 is a three-dimensional view of an embodiment of the printing machine of the invention, after loading the stamp.
Figure 6A:
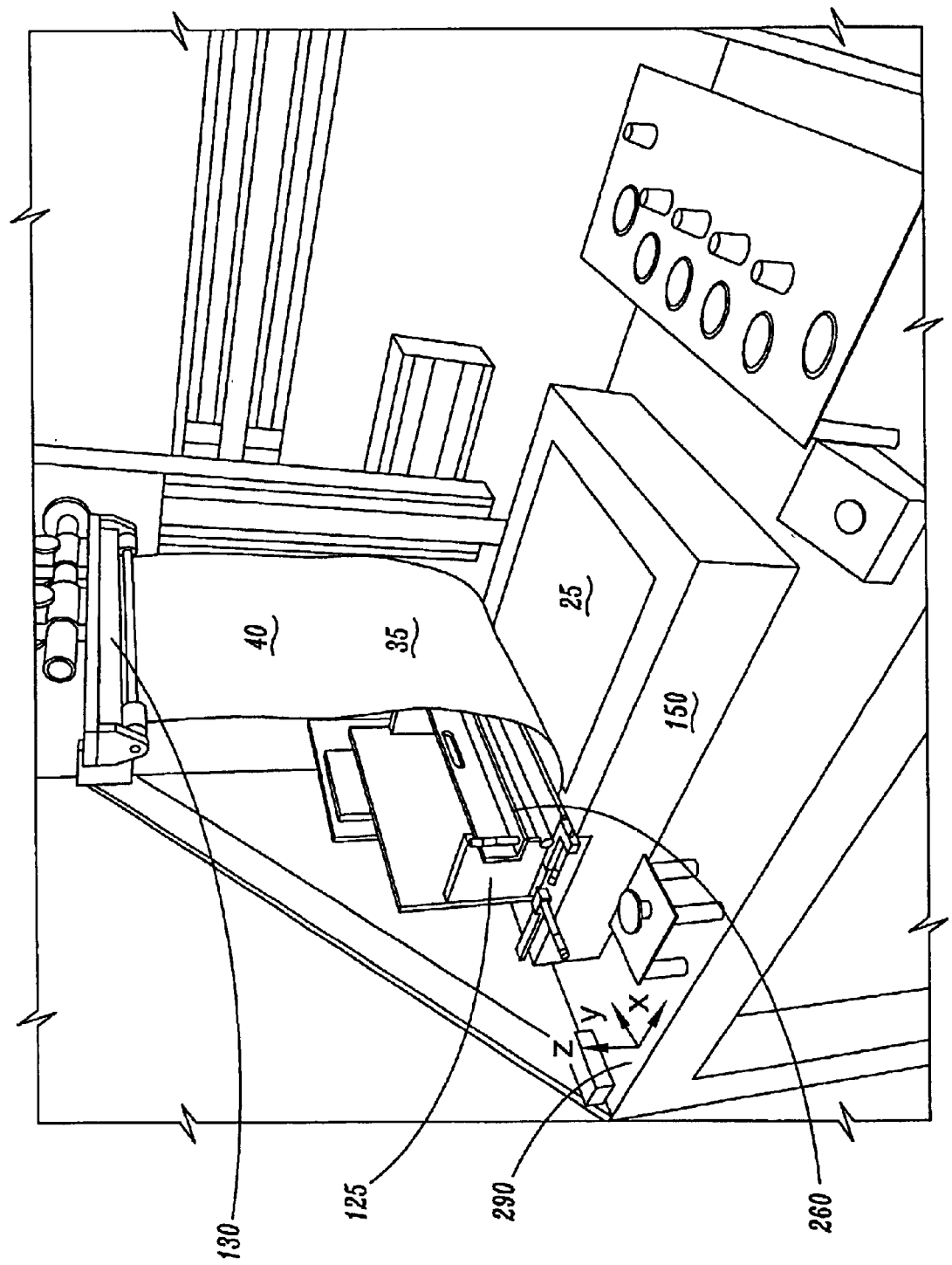
Figure 6B:
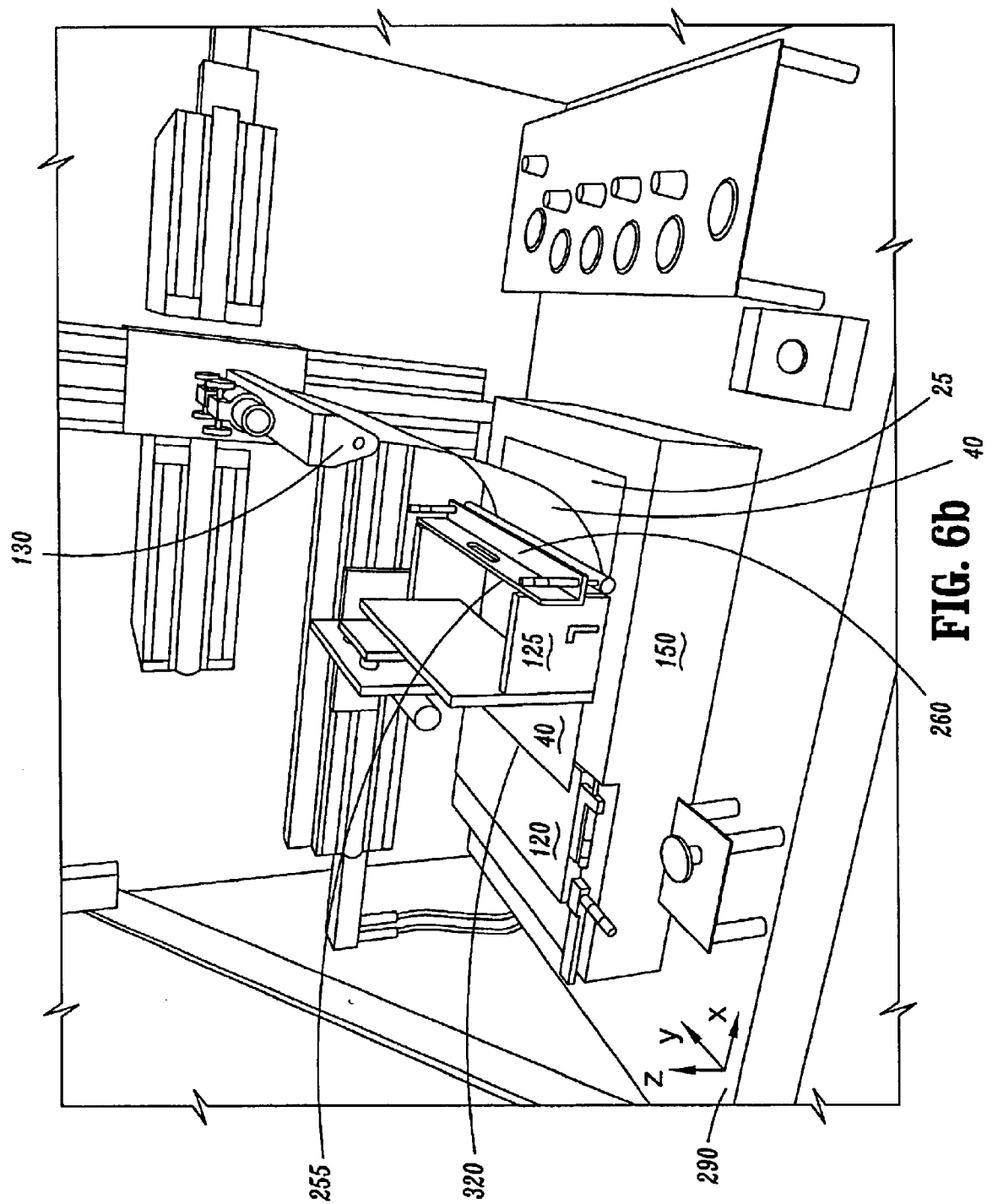

Referring to FIGS. 5 and 6, the receiver 25 is held fixed, throughout the printing process, to the print table's elevated receiver surface 300. As shown in FIG. 6b, one end of the stamp's back-plane layer 40, hereafter called the stationary end 320, is attached to the lower stamp clamp 120, such that the stamp's polymer layer 35 faces downward. This stationary end 320 remains fixed during printing. The opposite end of the stamp's back-plane layer 40, hereafter called the movable end 325, is attached to the upper stamp clamp 130. Because the stamp is flexible, when it is mounted in the printing machine, suspended between the upper stamp clamp 130 and the lower stamp clamp 120, it hangs in a natural curve, as shown.

FIG. 6 shows how the printing process proceeds. Specifically, FIGS. 6a, 6b, and 6c show the beginning, middle, and end of the printing process respectively. As shown by comparison of the three figures, the upper stamp clamp 130 moves in two dimensions (xz) during printing—downward and to the right, thereby laying the stamp's polymer layer 35 gradually upon the receiver 25. Simultaneously, in a motion coordinated with that of the upper stamp clamp 130, the carriage 125 moves to the right, so that the systems it carries—the print-force-application system 255 and the stamp-control system 260—can apply the contact force and geometrical control necessary to achieve uniform, accurate printing. When the end of the printing process is reached (i.e., when the stamp is fully in contact with the receiver), or perhaps after an intervening delay, the stamp is peeled from the receiver by reversing the three-axis motions used for printing. When peeling is done—when the stamp is completely separated from the receiver 25—the receiver, now patterned with the ink 20, may be removed from the printing machine.

2. Detailed Description of Sub-Systems
2.1 Base-Table Assembly

Figure 7:
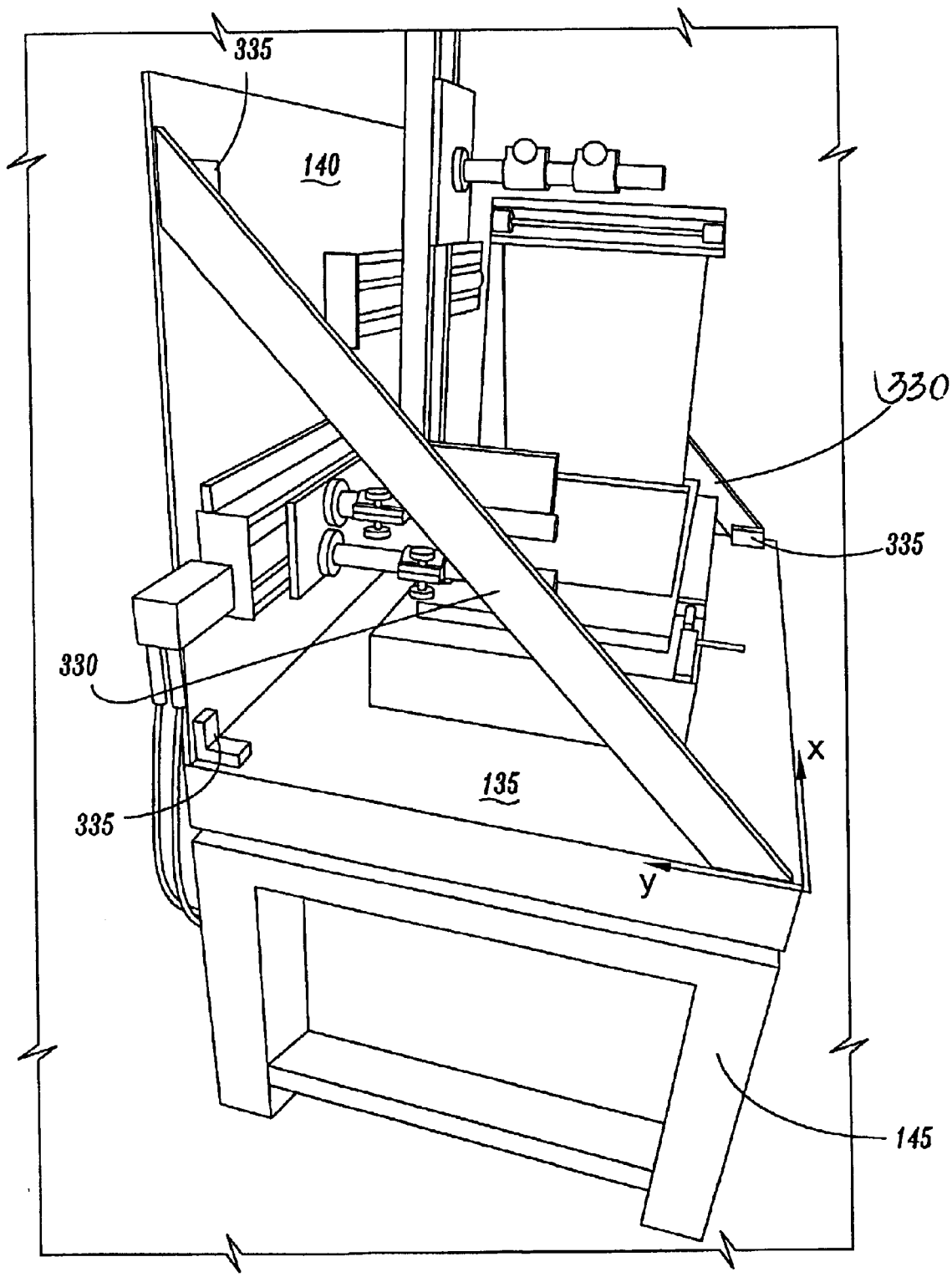
FIG. 7 is a three-dimensional view of a base table.

FIG. 7 shows the base-table assembly 105 (from FIG. 3) in more detail. In addition to the horizontal base table 135 and the vertical base table 140, it preferably comprises two diagonal struts 330 or other suitable reinforcing means, to hold the vertical base table perpendicular to the horizontal base table. These may be attached by six strut blocks 335 for attachment of the diagonal struts 330 to the base tables 135 and 140 as well as for attachment of the tables to each other. Also provided is a vibration-control system 145. In a prototype of the invention constructed to generate the print images of FIGS. 38 through 45, the horizontal base table 135, vertical base table 140, and vibration-isolation system 145 were purchased from Newport Corporation (Fountain Valley, Calif.). The thickness of the tables (135, 140) and load-bearing capacity of the vibration-control system 145 depend on the x and y dimensions of the receiver 25 (from FIG. 3). In the prototype of the invention, the receiver dimensions are 381 mm×381 mm (15"×15"). For this case the horizontal base table 135 is 914 mm×1,524 mm×102 mm thick (36"×60"×4" thick), the vertical base table 140 is 914 mm×1,524 mm×51 mm thick (36"×60"×2" thick), and the vibration-isolation system 145 has a load capacity of 5,780 N (1300 lbs).

2.2 Print-Table Assembly

Figure 8A:
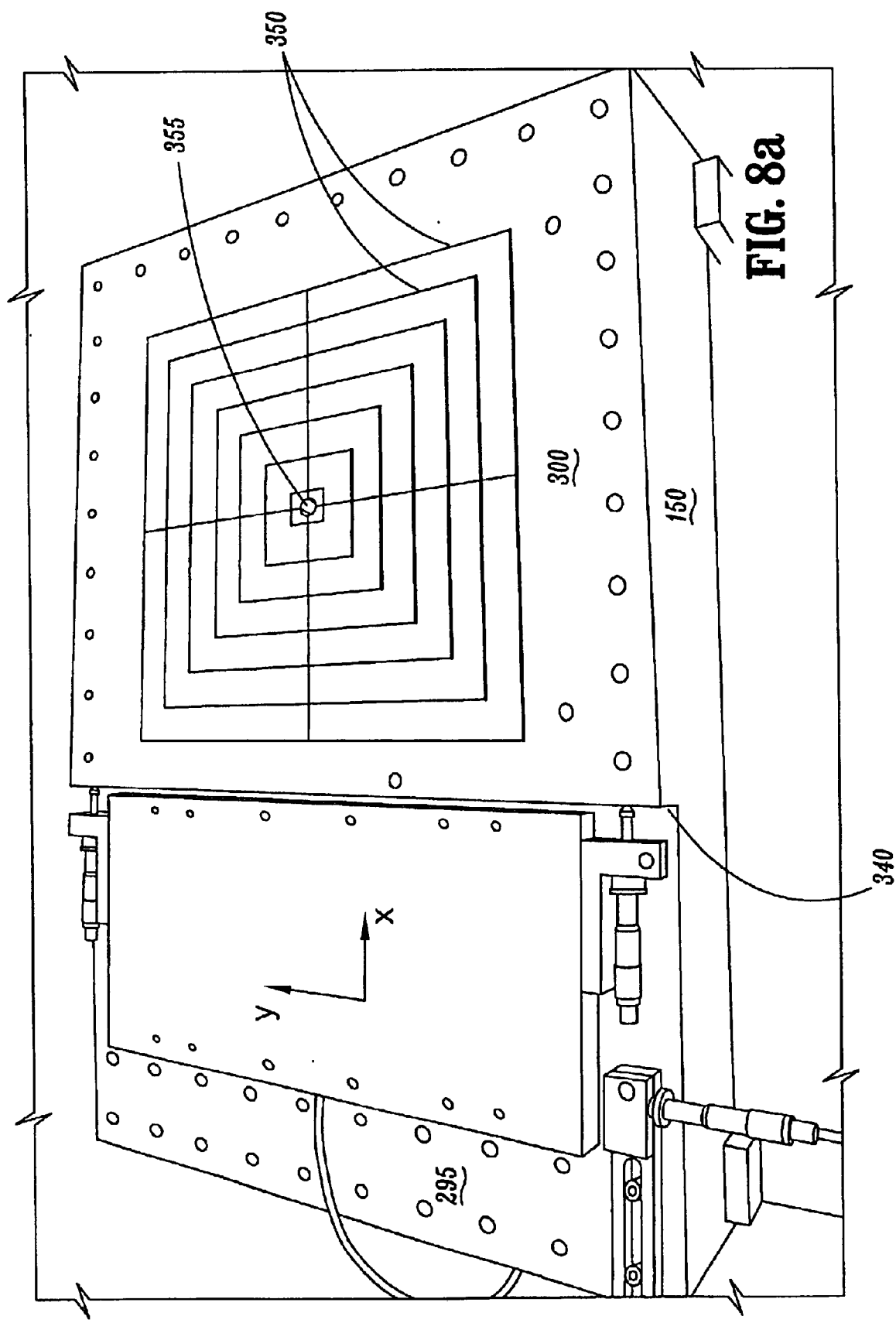
FIG. 8a is a three-dimensional view of a print table before a receiver is loaded.
Figure 8:
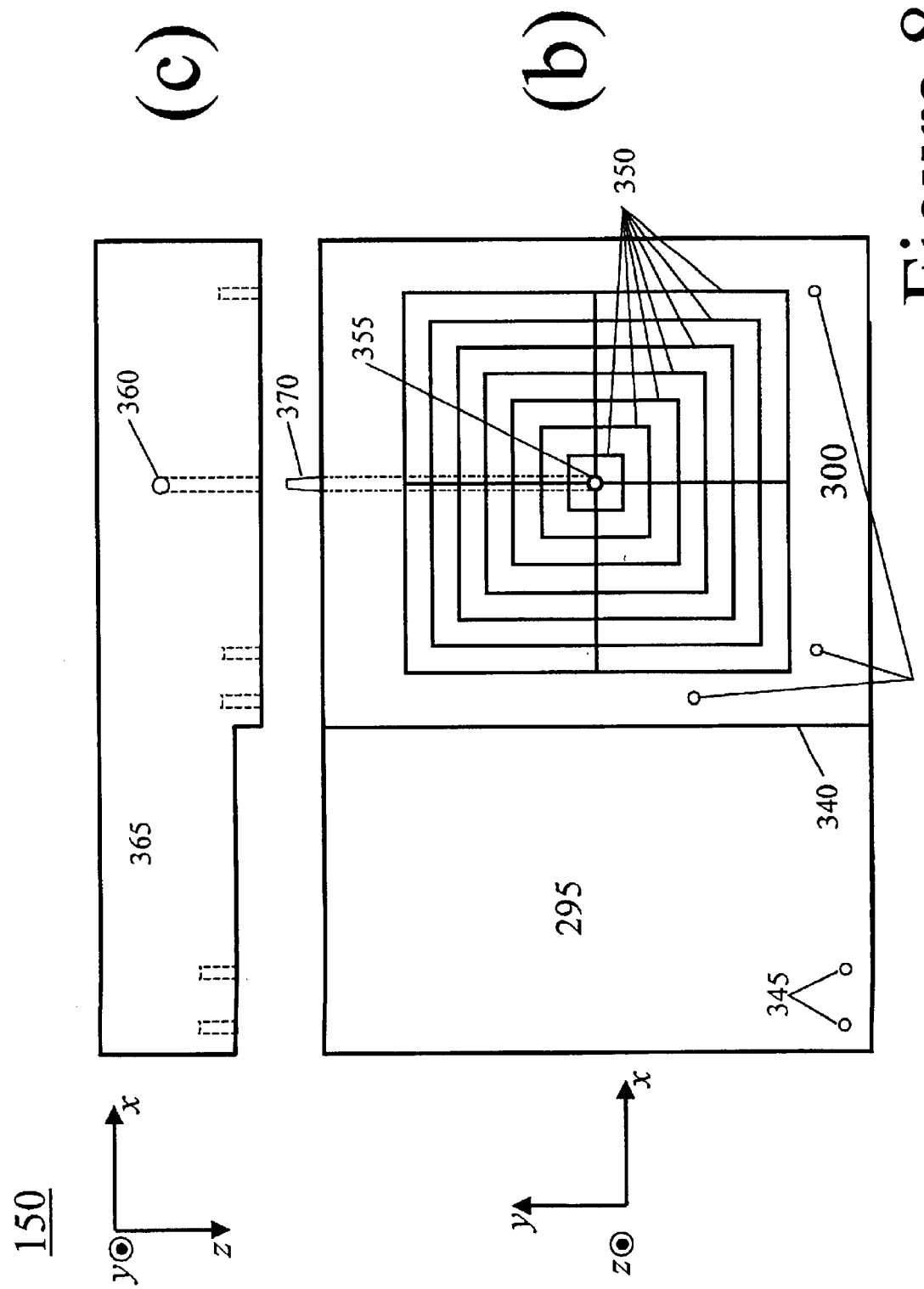
FIGS. 8b and 8c are orthographic projections of the print table.

FIGS. 8a, 8b, and 8c show an embodiment of the print table 150 in more detail. FIG. 8a is a three-dimensional view of the print table 150 with a lower stamp clamp 120 mounted on it. FIGS. 8b and 8c are respectively a top view and a rear view of the print table 150 alone. As shown in FIG. 8a, a preferred top surface of the print table 150 comprises a step 340, which divides the surface into an elevated receiver surface 300 and, parallel to it, the stepped-down surface 295. Preferably, both of these surfaces will be flat to a high degree of precision. Stepped-down surface 295 may have threaded holes 345 (FIG. 8b) or other mounting means as will be described below in conjunction with the lower stamp clamp 120. Elevated receiver surface 300 will preferably have a connected series of narrow, shallow grooves 350 or other suitable vacuum carrying means, which provide a vacuum chuck to hold receiver 25 fixed to elevated receiver surface 300 during the printing process, and also provide an air-pressure chuck to break the vacuum seal when the printing process is finished. The grooves 350 in elevated receiver surface 300 are alternately exposed to vacuum and air pressure, during and after the printing process respectively, by means of one or more vacuum openings 355, drilled perpendicular to receiver surface 300, and which communicate with grooves 350. The vacuum openings 355 may intersect a pressure-supply hole 360 (FIG. 8c) drilled at right angles to it, parallel to receiver surface 300, from the rear surface 365 of print table 150. Where pressure-supply hole 360 exits print table 150 at rear surface 365, it is terminated with a common pneumatic fitting 370, which is connected to pneumatic controls 155, of a type well known in the art, that can alternately supply vacuum or air pressure, as described above, to grooves 350.

Figure 9:
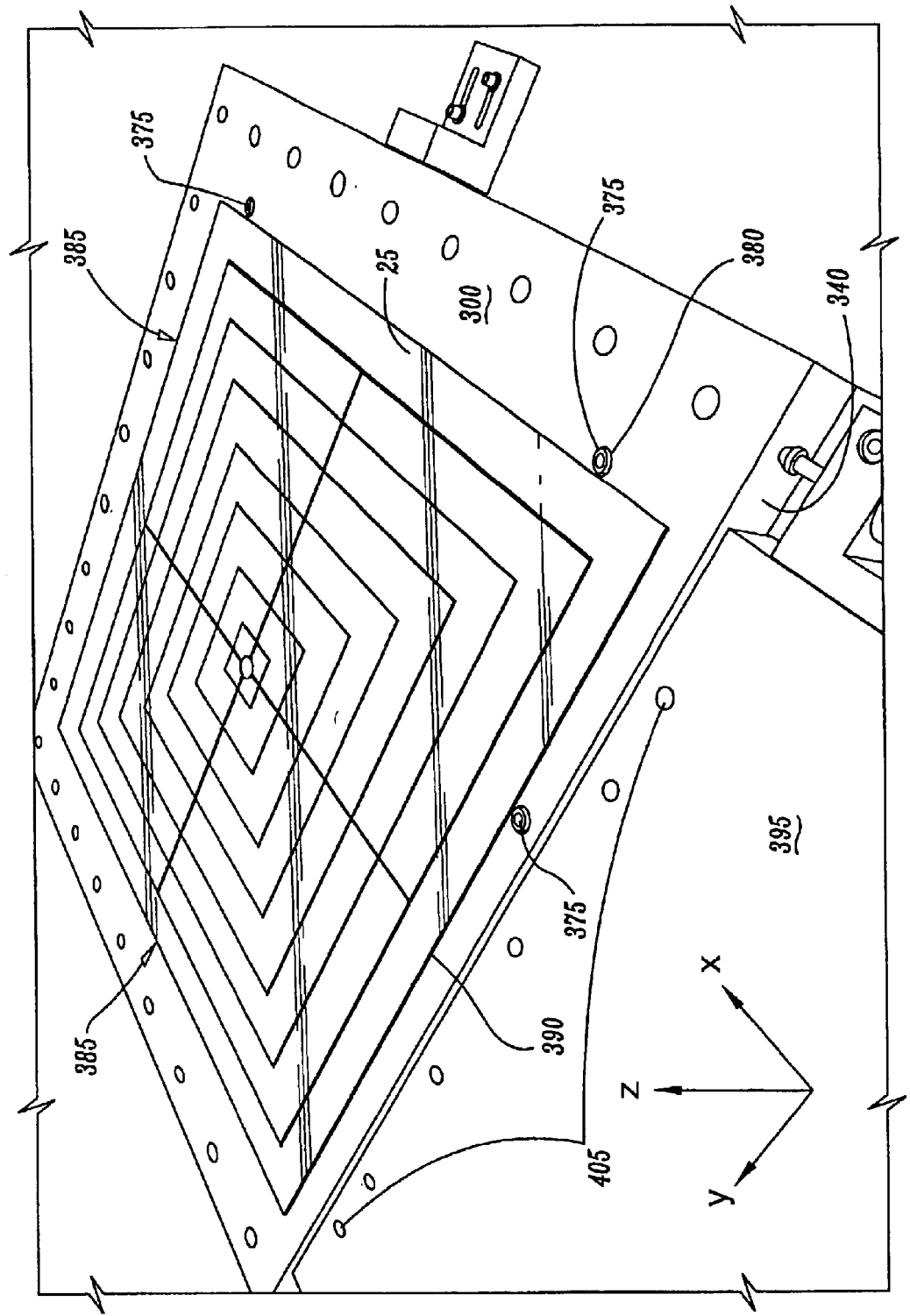
FIG. 9 is a three-dimensional view of the print table after the receiver is loaded.

FIG. 9 shows that, before receiver 25 is affixed to elevated receiver surface 300 using vacuum pressure applied to grooves 350, the receiver will preferably be located precisely on the surface by alignment means 375 such as, for example, a plurality of banking pins threaded into the three threaded holes 380 shown on FIG. 8b. The banking pins 375 protrude above receiver surface 300 by an amount just slightly less than the thickness of the receiver 25. Receiver 25 is banked to the cylindrical surfaces of banking pins 375 by application of lateral forces 385 applied in the -x and -y directions. The banking pins 375 are located such that, when the receiver 25 is registered against the pins' side surfaces, the receiver's leading edge 390 is substantially perpendicular to the line formed by the print table's step 340.

Preferably, the print table 150 is made of a material, such as granite, whose surfaces may be made very flat. Custom block of granite—comprising step 340, threaded holes 345, grooves 350, vacuum hole 355, pressure-supply hole 360, pneumatic fitting 370, and threaded holes 380—may be ordered from various commercial sources, such as L. S. Starrett Co., Granite Surface Plate Division, Mt. Airy, N.C. Solid granite is a preferred material for this application because the flatness of the receiver surface 300, upon which receiver 25 rests during printing, significantly influences the accuracy of the transfer of the pattern 15 from the stamp 5 to the receiver 25. As is well-known in the art of tool-making, a lapped granite surface provides a durable, high-precision flat surface.

2.3 Lower Stamp Clamp

Figure 10:
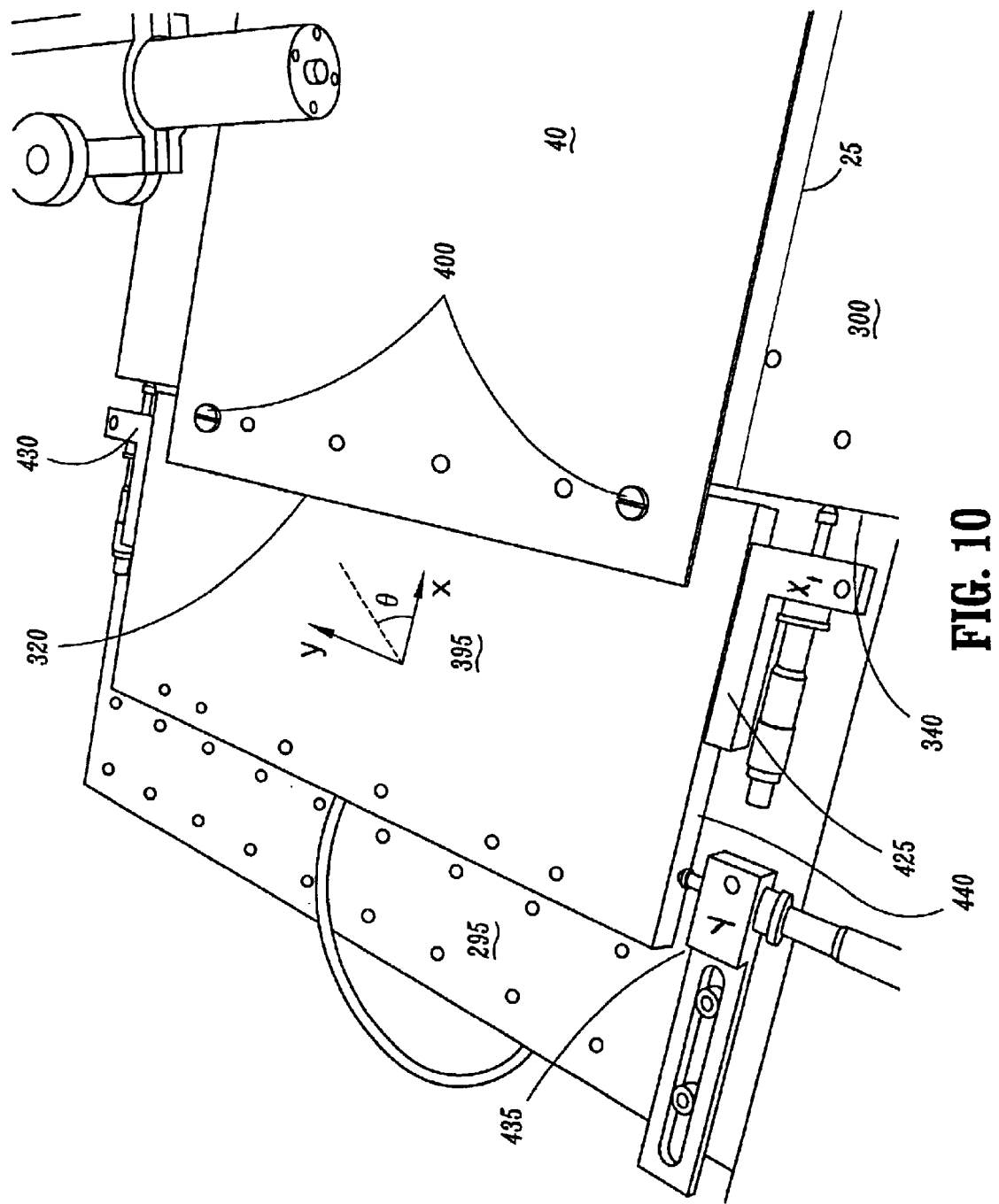
FIG. 10 is a three-dimensional view of a lower stamp clamp.

FIG. 10 shows the vacuum-chuck assembly 245 (from FIG. 3) of lower stamp clamp 120 (from FIG. 3). This assembly, which rests upon stepped-down surface 295 of print table 150, comprises a vacuum plate 395; a stamp attachment means 400 such as, for example, one or more locating screws that mate with threaded locating holes 405 (shown in FIG. 9) for attachment of the stamp to the vacuum plate 395; and three micrometer assemblies 425, 430, and 435. In the embodiment shown in the drawings, a first micrometer assembly 425 is affixed to front surface 440 of vacuum plate 395. Likewise, a second micrometer assembly 430—a mirror image of 425—is affixed to the rear surface of vacuum plate 395. Yet a third micrometer assembly 435 is affixed to the stepped-down surface 295 of print table 150 using two threaded holes 345. The three micrometer assemblies 425, 430, and 435 are used to adjust the position and orientation of the vacuum plate 395 with respect to the print table 150.

Figure 11:
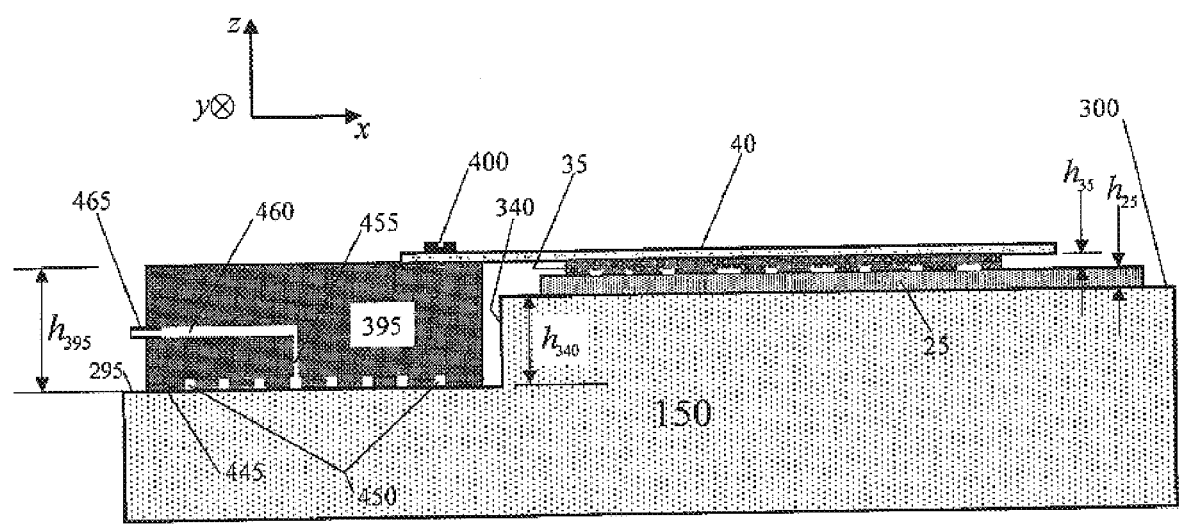
FIG. 11 is cross-sectional diagram of the print table, the lower stamp clamp, the stamp and the receiver.

As shown in FIG. 11, the vacuum plate 395 is machined to thickness $h_{395}$ satisfying the following equation:

$$h_{395} = h_{340} + h_{25} + h_{35},$$

where $h_{340}$ is the height of step 340, $h_{25}$ is the thickness of receiver 25, and $h_{35}$ is the thickness of the stamp's polymer layer 35. In this way, when the polymer layer 35 is brought into contact with the receiver during the printing process, the stamp's back-plane layer 40 lies flat, as shown in FIG. 11.

Figure 12:
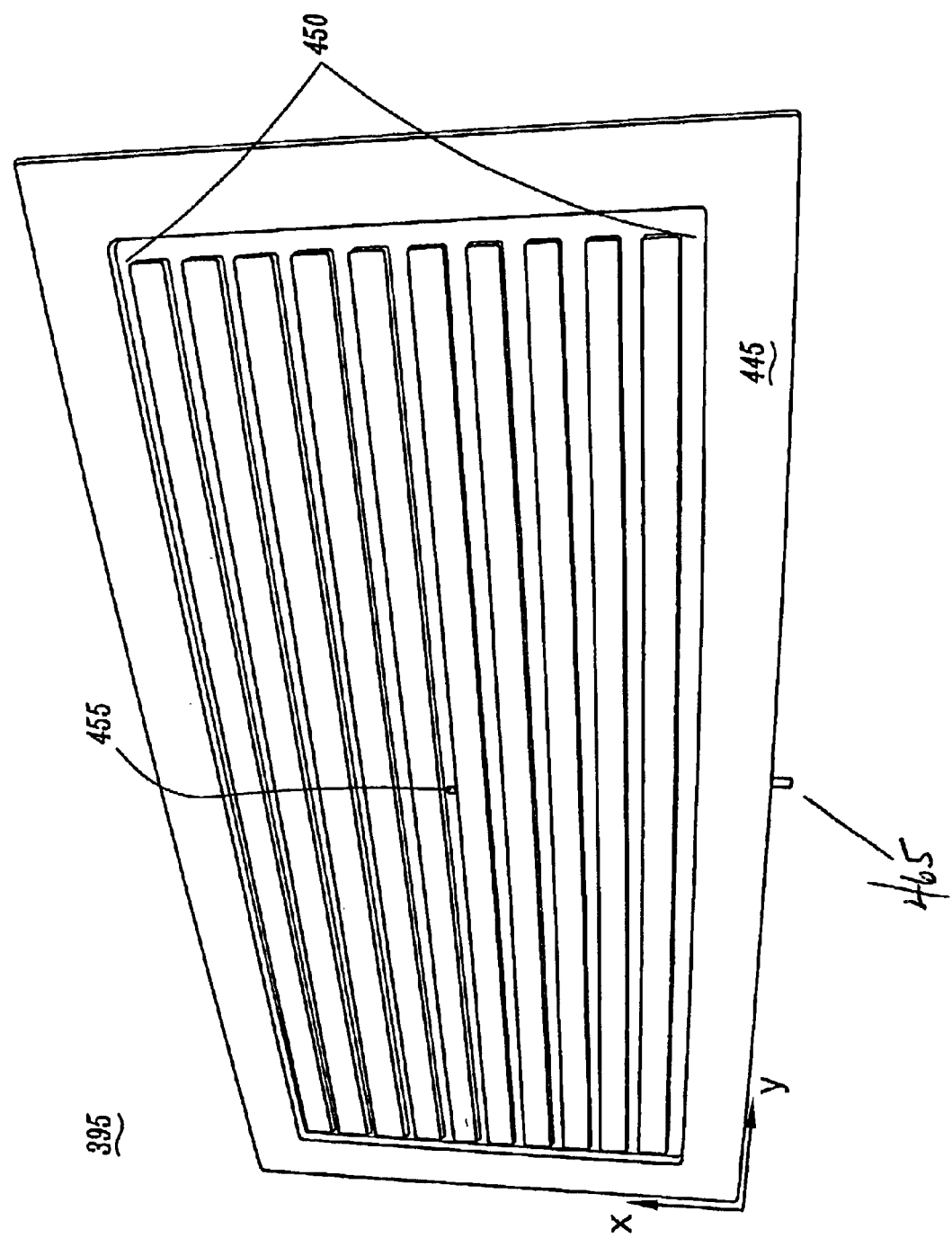
FIG. 12 is a three-dimensional view of the bottom surface of a vacuum plate that is part of the lower stamp clamp.

As further shown in FIG. 11, and also in FIG. 12 (which is a bottom view of vacuum plate 395), the bottom surface 445 of vacuum plate 395 is machined with a number of shallow grooves 450 or other suitable vacuum carrying means. These grooves provide a vacuum chuck to hold vacuum plate 395 fixed to surface 295 during the printing process, but also provide, as needed during machine setup, an air-pressure chuck by means of which the vacuum plate 395 is floated on an air cushion to facilitate translational and rotational adjustment of vacuum plate 395 with respect to the print table 150, as discussed further below in connection with the micrometer assemblies 425, 430, and 435. The grooves 455 in surface 450 may be alternately exposed to vacuum and air pressure, as needed, by means of a bleed hole 455 drilled perpendicular to surface 445 and communicates with grooves 450. The bleed hole 455 intersects a pressure-supply hole 460 drilled at right angles to it, parallel to surface 445, as shown in FIG. 11. The pressure-supply hole 460 is terminated with a thread suitable for a pneumatic fitting 465. Pneumatic controls 250, of a type well know in the art, are connected to the fitting 465 to alternately supply the vacuum and air pressure as described above.

Figure 13:
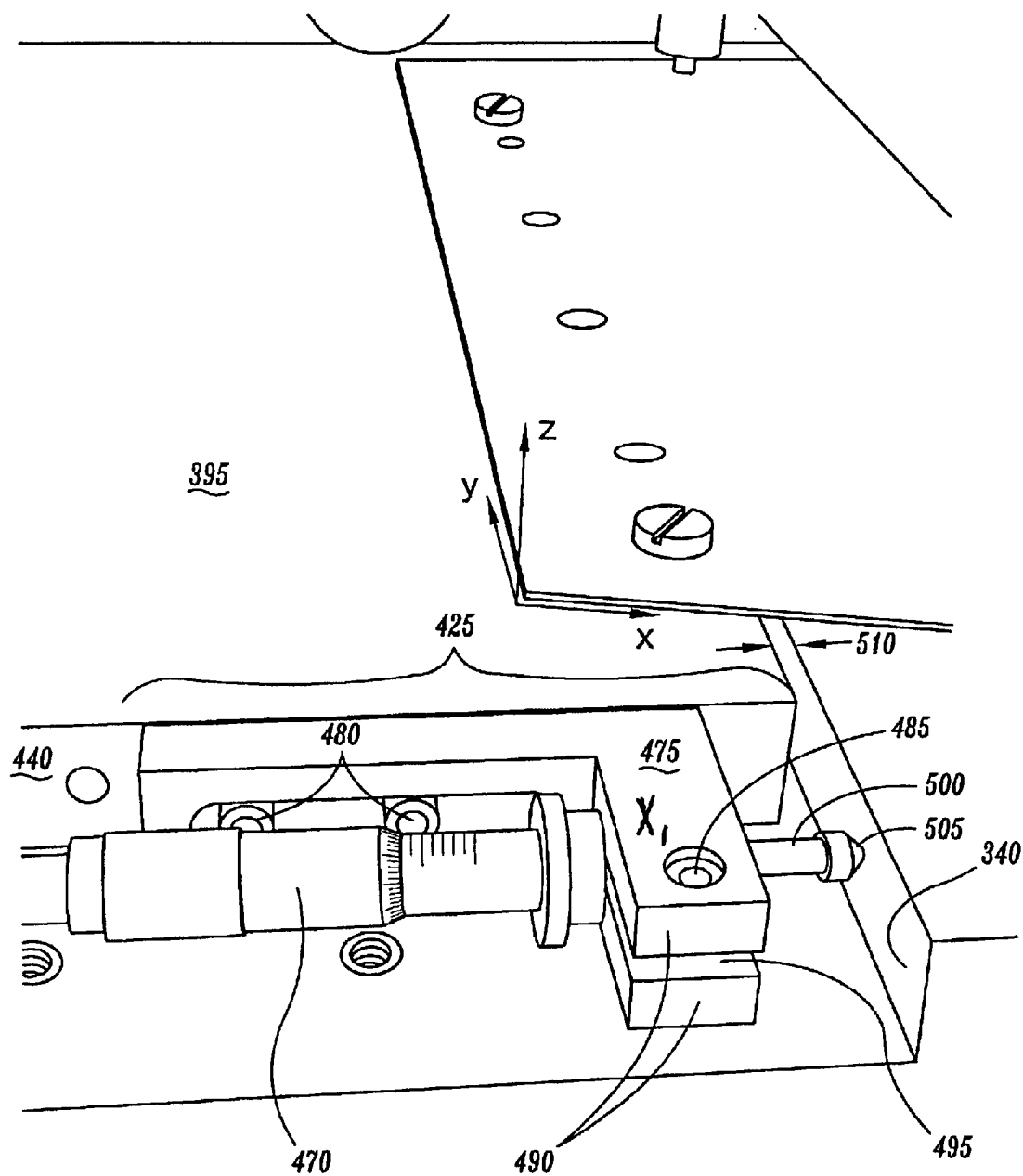
FIG. 13 is a close-up of an adjustment mechanism for the lower stamp clamp.

FIG. 13 is a close-up of first micrometer assembly 425, which comprises a micrometer head 470, and a mounting means, such as an L-bracket 475, and screws 480 that affix L-bracket 475 to front surface 440 of vacuum plate 395. The body of the micrometer head 470 is affixed to the L-bracket 475 using, for example, a slotted-hole clamp arrangement, wherein a clamping screw 485 forces together the legs 490 on either side of the slot 495, thereby gripping the micrometer head 475, such that the axis of the micrometer head is parallel to front surface 440 of vacuum plate 395, and rigidly connected to it. Non-rotating spindle 500 of micrometer head 475, outfitted with ball-bearing tip 505, is extended so that the ball-bearing tip 505 bears against step 340 of print table 150, such that, by further extension of the spindle 500, the distance 510 (between step 340 and vacuum plate 395 near the front of the print table 150) is increased. Conversely, distance 510 may be decreased by retraction of the spindle, provided only that a force (manual, spring-loaded, etc.) is applied to vacuum plate 395, in the positive x direction, to keep the ball-bearing tip 505 and the step 340 in intimate contact. The ball-bearing tip assures a rolling, single-point contact between the micrometer and the step 340.

Figure 14:
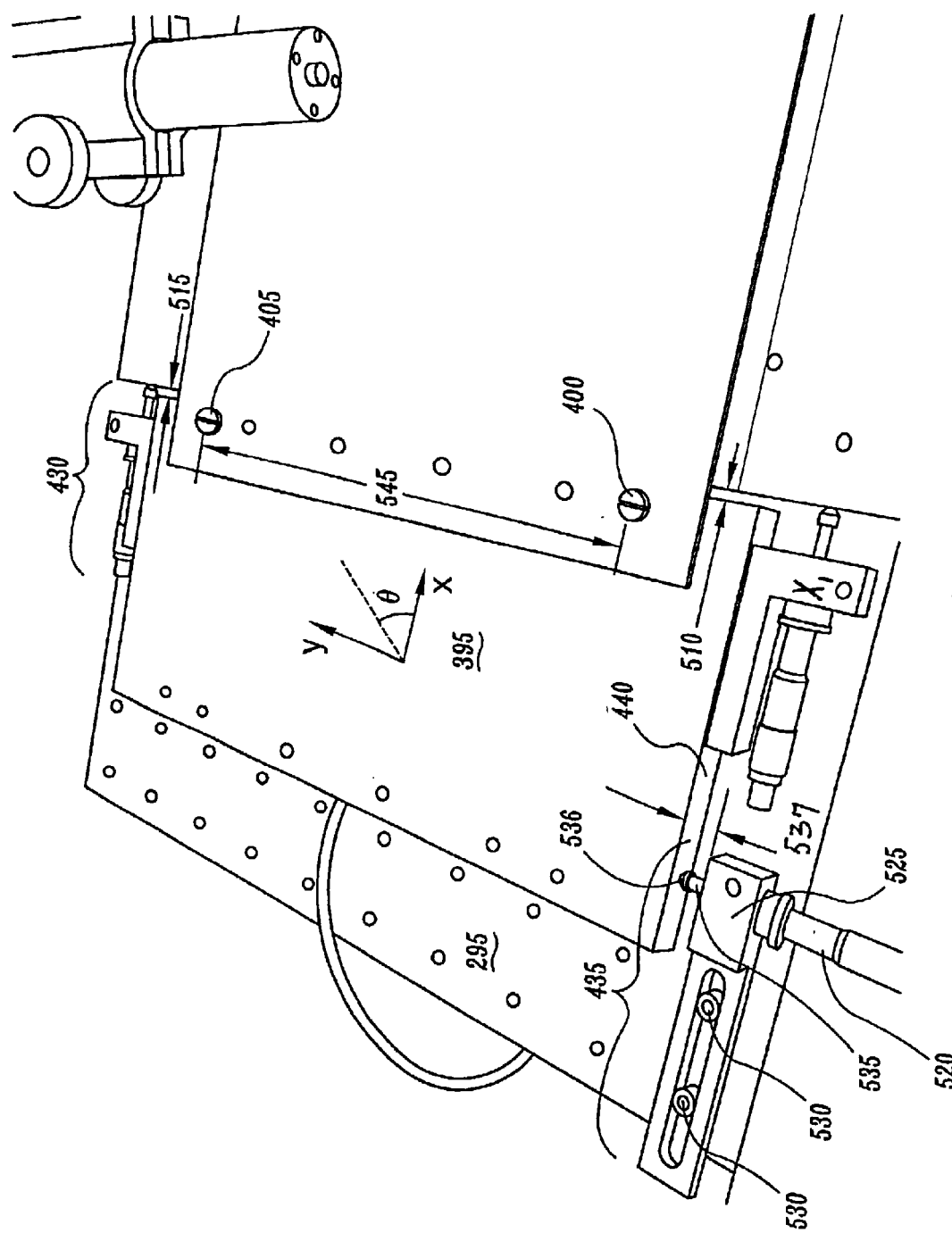
FIG. 14 is a close-up of another adjustment mechanism for the lower stamp clamp.

As shown in FIG. 14, there is preferably provided a second micrometer assembly 430, affixed to the rear surface of vacuum plate 395, a mirror image of first micrometer assembly 425. Thus, by analogy to the previous paragraph, second micrometer assembly 430 is used to modulate the distance 515 between step 340 and vacuum plate 395 near the rear of the print table 150. Thus, the two micrometer assemblies 425 and 430, by modulating distances 510 and 511 respectively, move vacuum plate 395 in the two degrees of freedom x and θ.

As further shown in FIG. 14, there is preferably provided a third micrometer assembly 435 comprising a micrometer head 520, a straight bracket 525, and screws 530 or similar means to affix straight bracket 525 or other mount means to the stepped-down surface 295 of the print table 150. The body of the micrometer head 520 may be affixed to the straight bracket 525, using the slotted-hole clamp arrangement described in connection with FIG. 13, such that the axis of the micrometer head is perpendicular to the front surface 440 of vacuum plate 395, and rigidly connected to surface 295 of print table 150. Non-rotating spindle 535 of micrometer head 520, outfitted with ball-bearing tip 536 (analogous to tip 505 of micrometer head 470) is extended to bear against the front surface 440 of vacuum plate 395, such that, by further extension of the spindle 535, the distance 537 (between the front surface 440 of vacuum plate 395 and the straight bracket 525) is increased. Conversely, distance 537 may be decreased by retraction of spindle 535, provided only that a manual force is applied to vacuum plate 395, in the negative y direction, to keep the spindle 535 and surface 440 in intimate contact.

In the prototype of the invention, the micrometer heads used in micrometer assemblies 425, 430, and 435 are sold under the tradename "Model 262ML Micrometer Head", and are commercially available from The L. S. Starrett Company, Athol, Mass. The ball-bearing tips 505 and 536 are sold under the tradename "Model 247MA ball attachment" and are likewise available from L. S. Starrett.

In summary, referring to FIGS. 13 and 14, the three micrometer assemblies 425, 430, and 435, because they allow adjustment of the three distances 510, 515, and 537, provide complete, three-degree-of-freedom (xyθ) adjustment of the location and orientation of vacuum plate 395 with respect to the print table 150. Thus, the xy location and θ orientation of the stamp 5 can be adjusted with respect to the receiver 25, because, as previously shown in FIG. 11, the stamp's back-plane 40 is affixed to the vacuum plate 395, whereas, as shown in FIG. 9, the receiver 25 is affixed to the print table 150.

This xyθ adjustability of the stamp 5 with respect to the receiver 25 is achieved, however, without sacrificing stiffness of the stamp-to-receiver connection during the printing process. During printing, the vacuum chuck 455 locks the vacuum plate 395 (and hence the stationary end 320 of the stamp's back-plane 40, as described in the next paragraph)

to the print-table's stepped-down surface 295, while the vacuum chuck 350 locks the receiver 25 to the print-table's elevated receiver surface 300. Thus during printing, the connection between the stamp 5 and the receiver 25 is extremely stiff—much stiffer than could be attained by alternative, xyθ-adjustable arrangements such as conventional stages. Such high stiffness contributes substantially to faithful transfer of the stamp's raised pattern 15 to the receiver 25.

Figure 15:
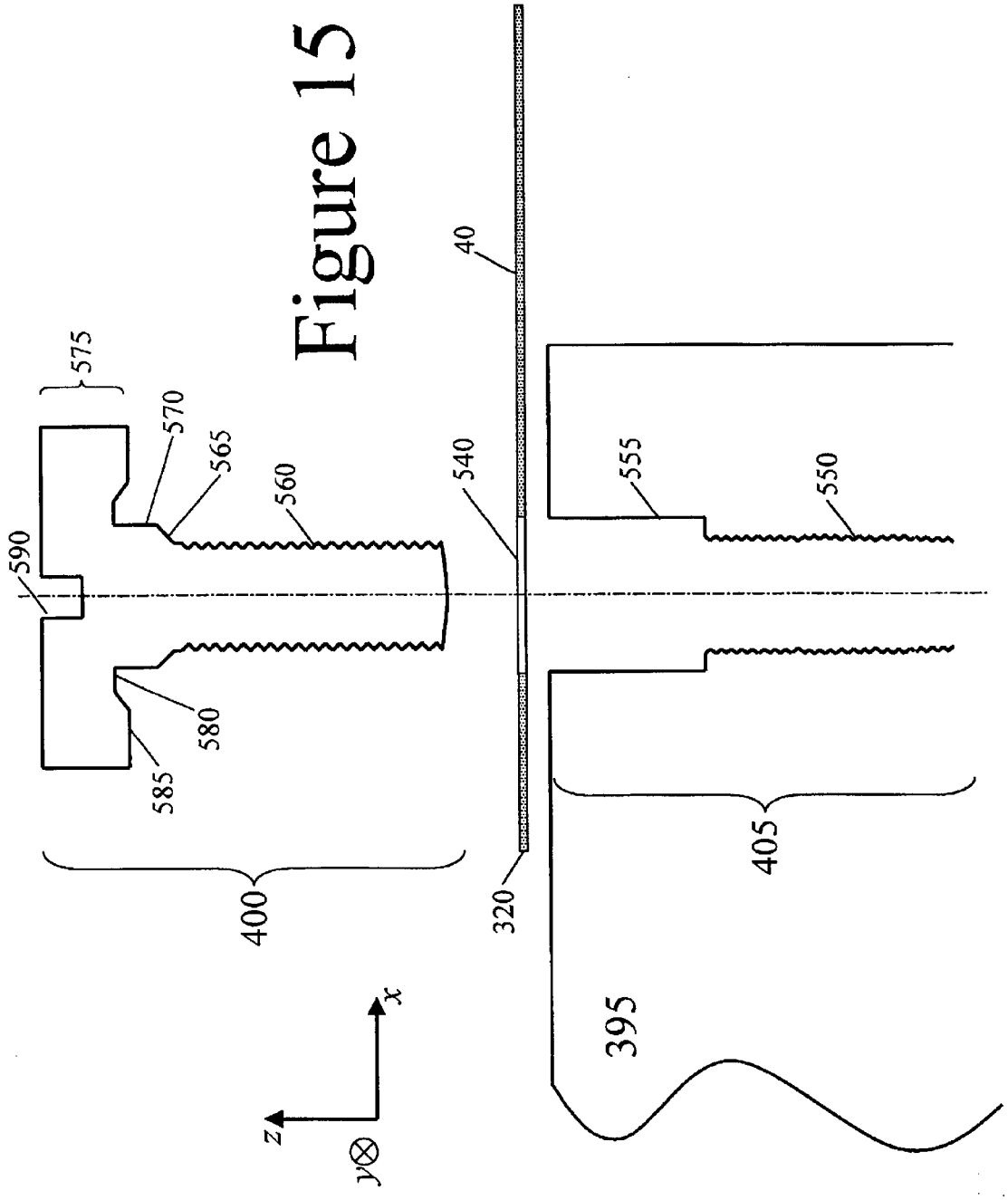
FIG. 15 is a cross-sectional diagram of screws that locate and attach the stamp to the lower stamp clamp.

FIG. 15 shows a cross-sectional, exploded detail of the locating screws 400 (introduced in FIG. 10 and repeated in FIG. 14) and the mating locating holes 405 (shown in FIG. 9), that are used in the prototype of this invention. Of course, there are many means by which a back-plane layer 40 may be simultaneously located and attached to a vacuum plate 395, but the means shown are simple yet effective. Near its stationary end 320, the back-plane 40 is provided with two or more holes 540, separated by a precise center-to-center distance 545 (shown on FIG. 14). Locating screws 400 are inserted through the stamp holes 540 and screwed into the threaded portion 550 of locating holes 405. The unthreaded portion 555 of locating holes 405 are precisely machined to match the distances between and diameters of the holes 540 in the back-plane 40. By these means, the two screws 400 serve not only to locate the stamp's back-plane 40 with respect to the vacuum plate 395, but also to rigidly attach the one to the other.

As further shown in FIG. 15, the locating screw 400 has a threaded portion 560 that mates with the threaded portion 550 of locating hole 405; a chamfered portion 565 that facilitates the entry of screw 400 into locating hole 405; a locating portion 570 that mates with the unthreaded portion 555 of locating hole 405; and a head 575 whose undersurface comprises a relieved area 580 and a bearing area 585, and whose top surface comprises a screw-driver slot 590 or other screw-torquing means. The locating portion 570 of locating screw 400 has an axial length shorter than that of the hole's unthreaded portion 555, and a diameter that is larger than the clearance diameter of the locating screw's threaded portion 560 but slightly less than the diameter of the hole's unthreaded portion 555, such that a slip fit of the screw's locating portion 570 into the hole's locating portion 555 is achieved. The diameter of screw's locating portion 570 is also slightly less than the diameter of the stamp hole 540 in the back-plane 40, such that a slip fit of the screw's locating portion 570 through stamp hole 540 is achieved. Regarding the head 575 of screw 400, the relieved area 580 insures that the critical diameter of the screw's locating portion 570 continues toward the top of the screw far enough to avoid any unwanted interference with the aforementioned slip-fit clearances, and the bearing area 585 affixes backplane 40 to vacuum plate 395 when locating screw 400 is tightened.

2.4 Upper Stamp Clamp

Figure 16:
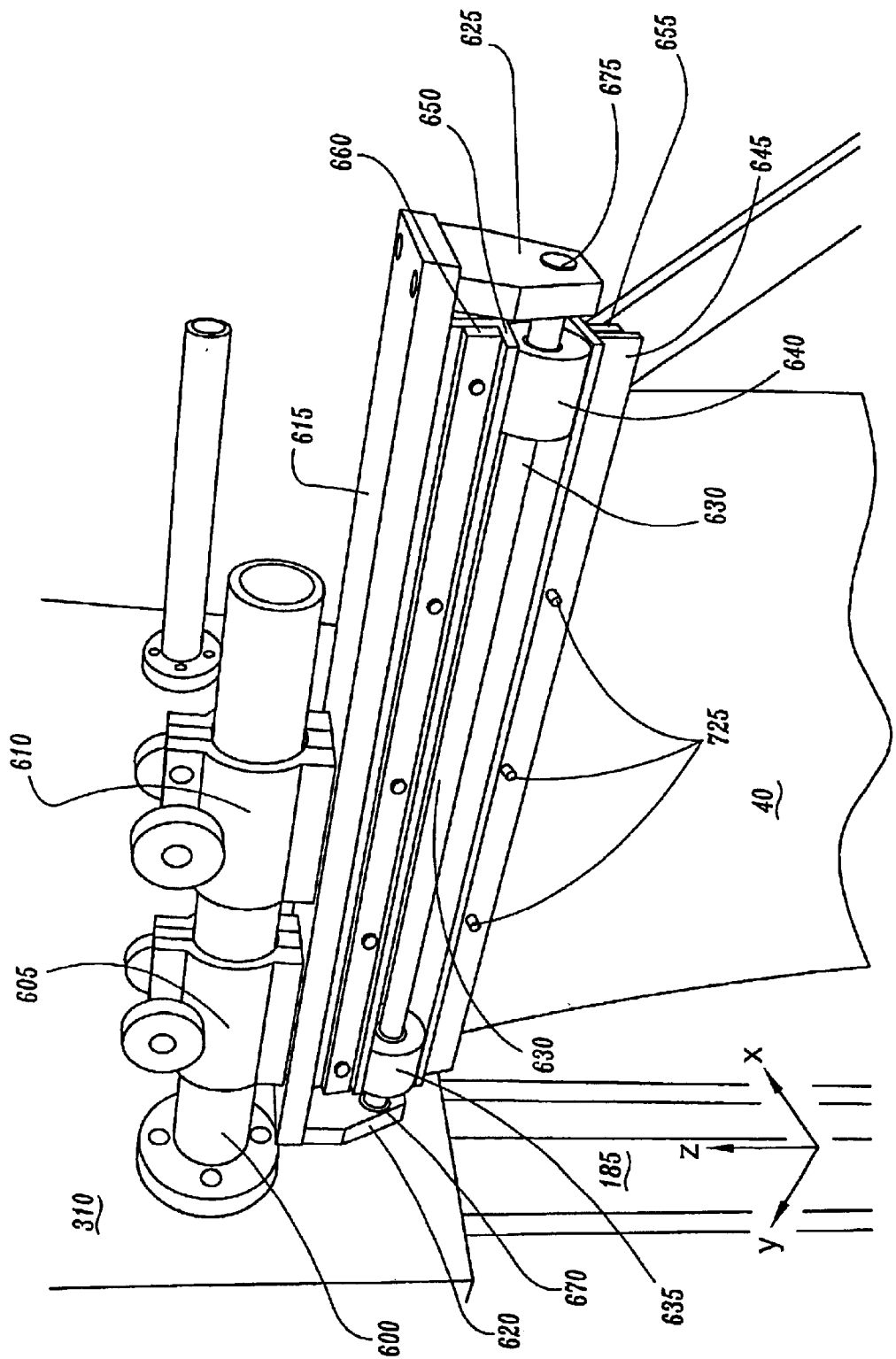
FIG. 16 is a three-dimensional view of the upper stamp clamp as it appears when mounted in the printing machine.

FIG. 16 shows an embodiment of an upper stamp clamp 130 (from FIG. 3) looking in the positive x direction (see FIG. 4 for definition of the x axis). The upper stamp clamp shown comprises a cantilevered rod 600, two rod clamps 605 and 610, a base plate 615, two side plates 620 and 625, a precision shaft 630, two ball-bushings assemblies 635 and 640, two T-bars 645 and 650, and two clamp strips 655 and 660.

Cantilevered rod 600, such as Model 45 available from Newport Corp. as used in the prototype, is rigidly affixed at its root end to faceplate 310 of z-stage 185. Rod clamp 605, such as Newport's Model 340C also used in the prototype, with its faceplate facing down, is clamped to rod 600, but is not attached to base plate 615. Rod clamp 610 (identical to 605), its faceplate also facing down, is rigidly affixed to base plate 615. Side plates 620 and 625, which comprise coaxial holes 670 and 675 respectively, are also rigidly affixed to base plate 615, such that precision shaft 630 (such as Thompson Model LRS-8-SS as used in the prototype) may be suspended, parallel to the y direction, between the coaxial holes 670 and 675, and affixed there by set screws. Ballbushing assemblies 635 and 640 ride on shaft 630, such that each assembly is free to rotate about the axis of shaft 630, and also to slide along the axis.

With the exception of the cantilevered rod 600 and the rod clamp 605, the remaining parts of the upper stamp clamp (610, 615, 620, 625, 630, 635, 640, 645, 650, 655, 660), hereafter referred to as the stamp carrier 680, may be removed from the printing machine 100 as a single unit, simply by releasing the clamp 610 and sliding it off the cantilevered rod 600.

Figure 17:
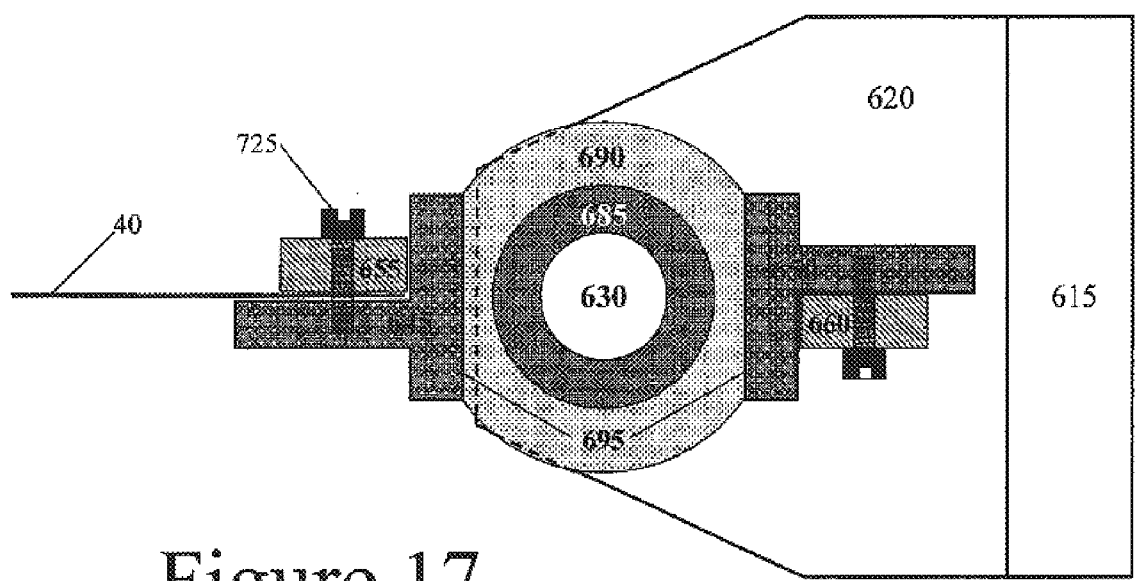
FIG. 17 is a cross-sectional diagram of the upper stamp clamp.

Referring to FIG. 17, there is shown a schematic, cross-sectional view of the upper-stamp-clamp assembly, perpendicular to the axis of shaft 630. (The rod 600 and rod clamps 605 and 610 are not shown in this Figure). Ball-bushing assembly 635 referred to in FIG. 16, actually comprises ball bushing 685, such as a Thompson Model A-81420-SS as used in the prototype, and housing 690, into which ball bushing 685 is affixed using C rings, press fit, or any other suitable manner. Housing 690 is provided with attachment surfaces 695 on opposite sides of its cylindrical surface. One end of the T-bars 645 and 650 is rigidly attached to attachment surfaces 695 by means of small bolts. The other ends of the two T-bars 645 and 650 are likewise attached to similar flats in the ball-bushing housing belonging to the other ball-bushing assembly 640. Thus T-bars 645 and 650 are affixed parallel to shaft 630, on opposite sides of it, and the whole assembly (ball-bushing assemblies 635 and 640 plus T-bars 645 and 650) can freely rotate about the axis of shaft 630, like a paddle wheel with two paddles, and can also freely translate along the axis of shaft 630. The latter degree of freedom prevents shear in the stamp 5, in the y direction, as it is laid down upon receiver 25 during the printing process.

Figure 18:
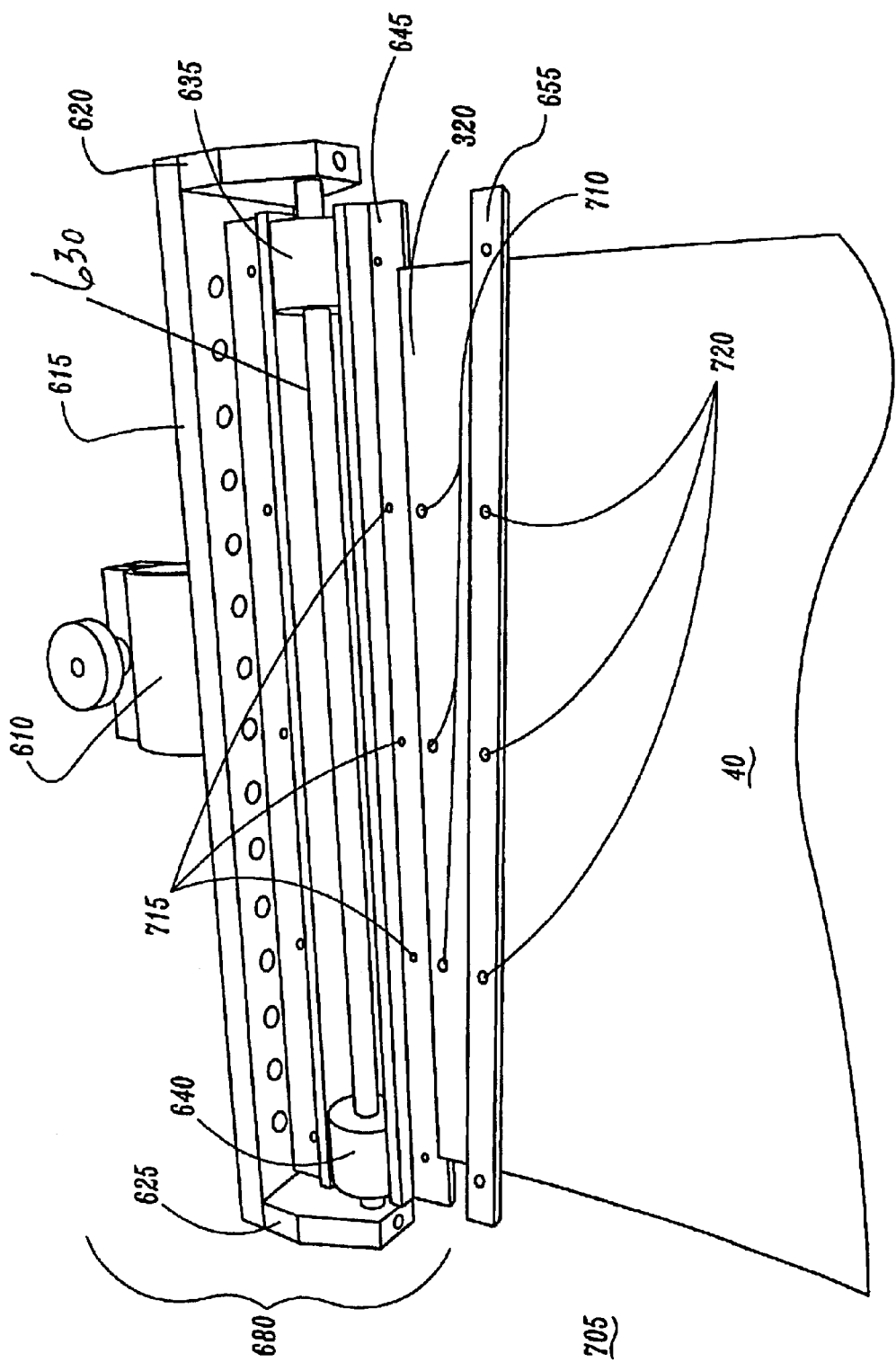
FIG. 18 is a three-dimensional view of the upper stamp clamp as it appears, remote from the printer, while attaching a stamp.

Referring to FIG. 18, the back-plane layer 40 of the stamp 5 is attached to the stamp carrier 680. This attachment is most conveniently done prior to the attachment of the back-plane layer 40 to lower stamp clamp 120, on some flat surface 705. For attaching the stamp to the stamp carrier, only one of the T-bars (either 645 or 650) and its associated clamp strips (655 or 660) need to be used. The unused T-bar and clamp strip exist merely for rotational balance. As shown in FIG. 18, suppose that T-bar 645 (and associated clamp strip 655) are selected for attaching the stamp. The stamp's back-plane 40 has been pre-punched, near its right end 320, with a plurality of holes 710 that align with threaded holes 715 in T-bar 645, and also with clearance holes 720 in clamp strip 655. To begin the attachment, the back-plane's holes 710 are manually aligned with the T-bar's threaded holes 715. Then the clamp strip 655 is laid on top of back-plane 40, thereby sandwiching the backplane between T-bar 645 and clamp strip 655 (as also shown in FIG. 17), and the clamp-strip's holes 720 are also aligned. Bolts 725 (shown in FIGS. 16 and 18) are then inserted manually through holes 720 and 710 and tightened into threaded holes 715.

Referring back to FIG. 16, the assembled stamp and the stamp carrier 680 may now be mounted on the printing machine by sliding rod clamp 610 onto cantilevered rod 600. To successfully complete the latter operation, surface 730 of base plate 615 must slide underneath faceplate 665 of rod clamp 605, which can only occur when the angular orientation of rod clamp 610 matches that of clamp 605. This insures that the stamp carrier is always returned to the same angular orientation about the axis of the cantilevered rod 600, because the orientation of clamp 605 is set once and never changed.

2.5 Carriage

As disclosed above with respect to FIG. 3, the carriage 125 comprises three components: a mechanical frame 255, a print-force-application system 260, and a stamp-control system 265. These three components are now described in detail.

2.5.1 Carriage: Mechanical Frame

Figure 19:
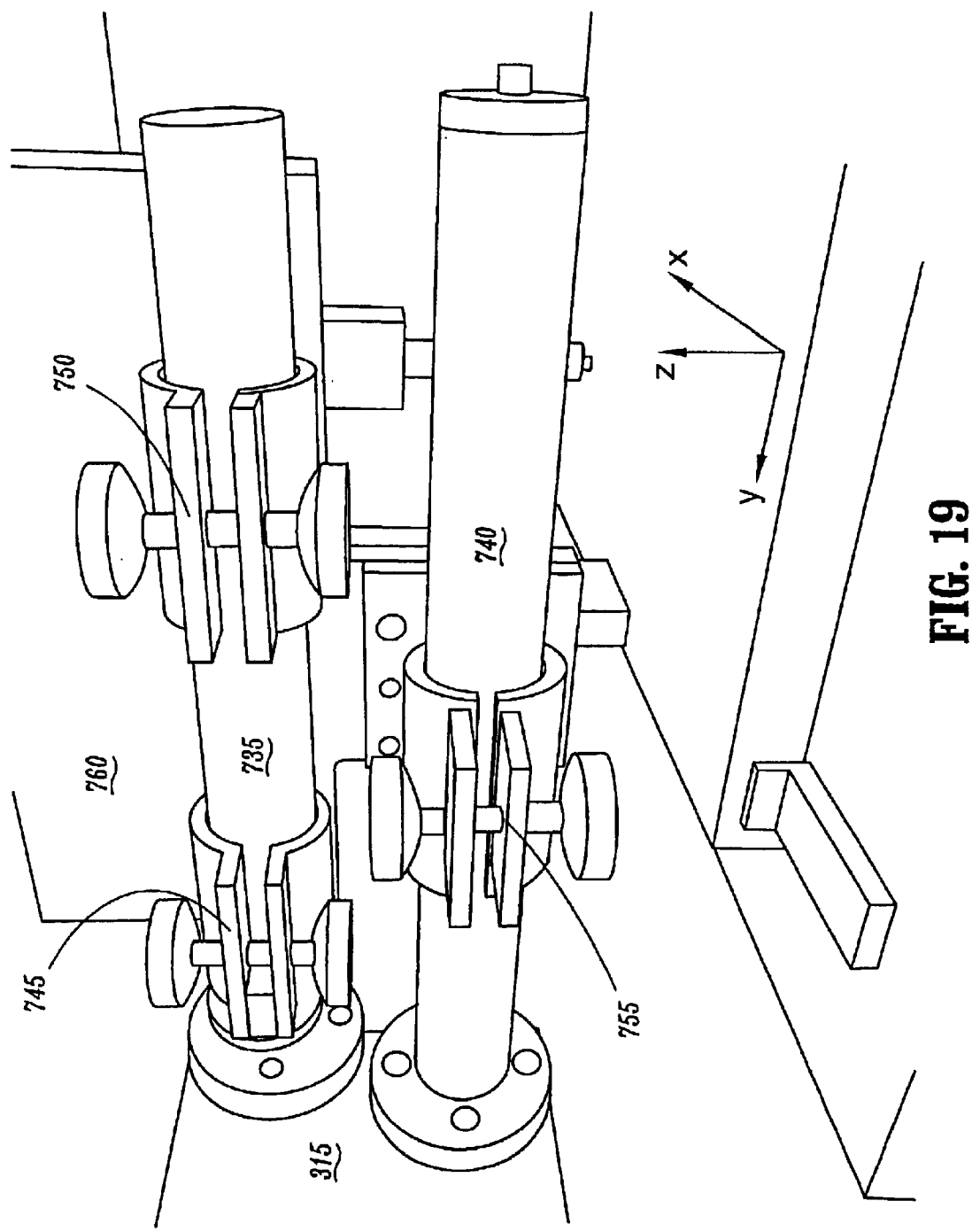
FIG. 19 is a three-dimensional view of a carriage.
Figure 20:
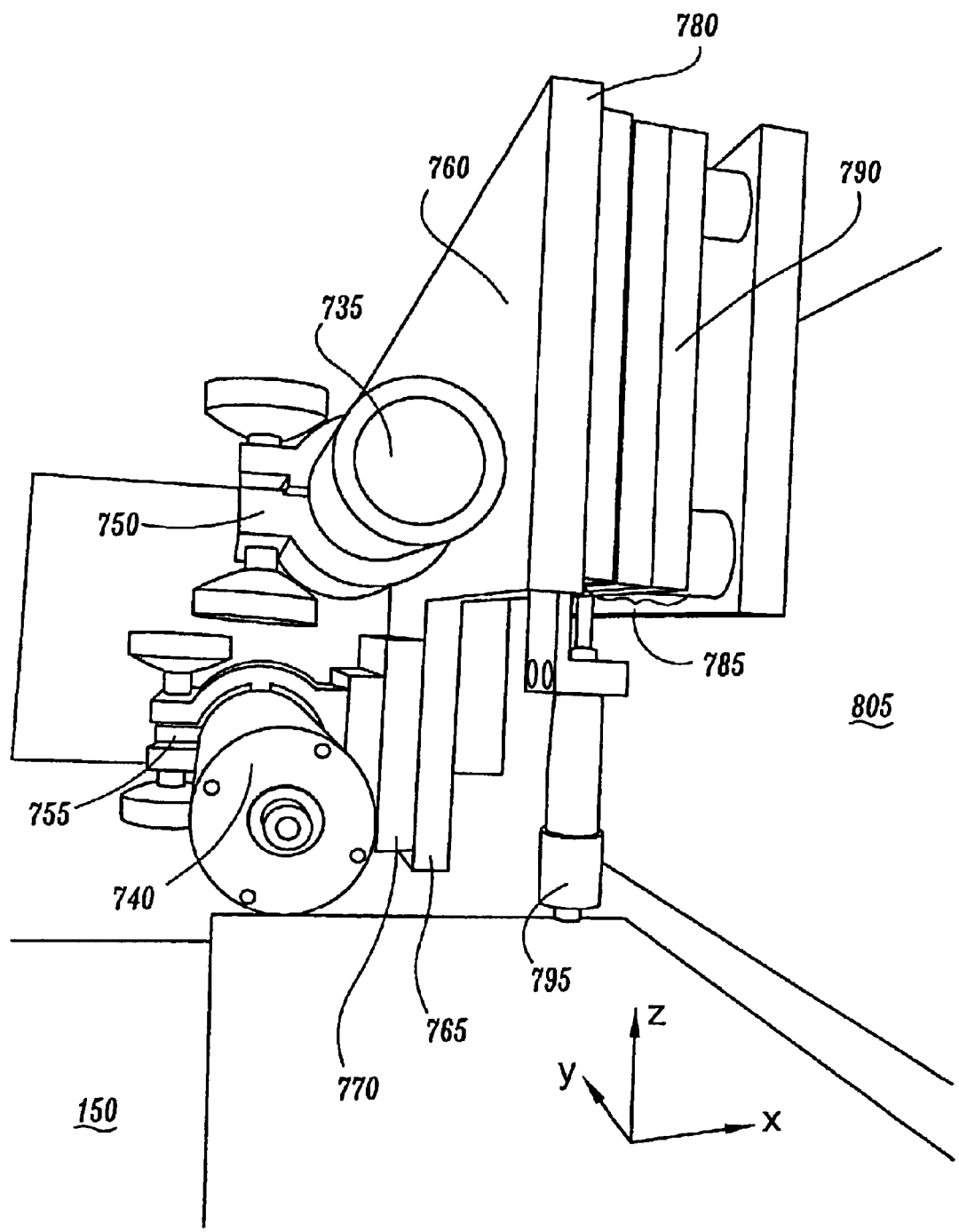
FIG. 20 is another three-dimensional view of the carriage.
Figure 21:
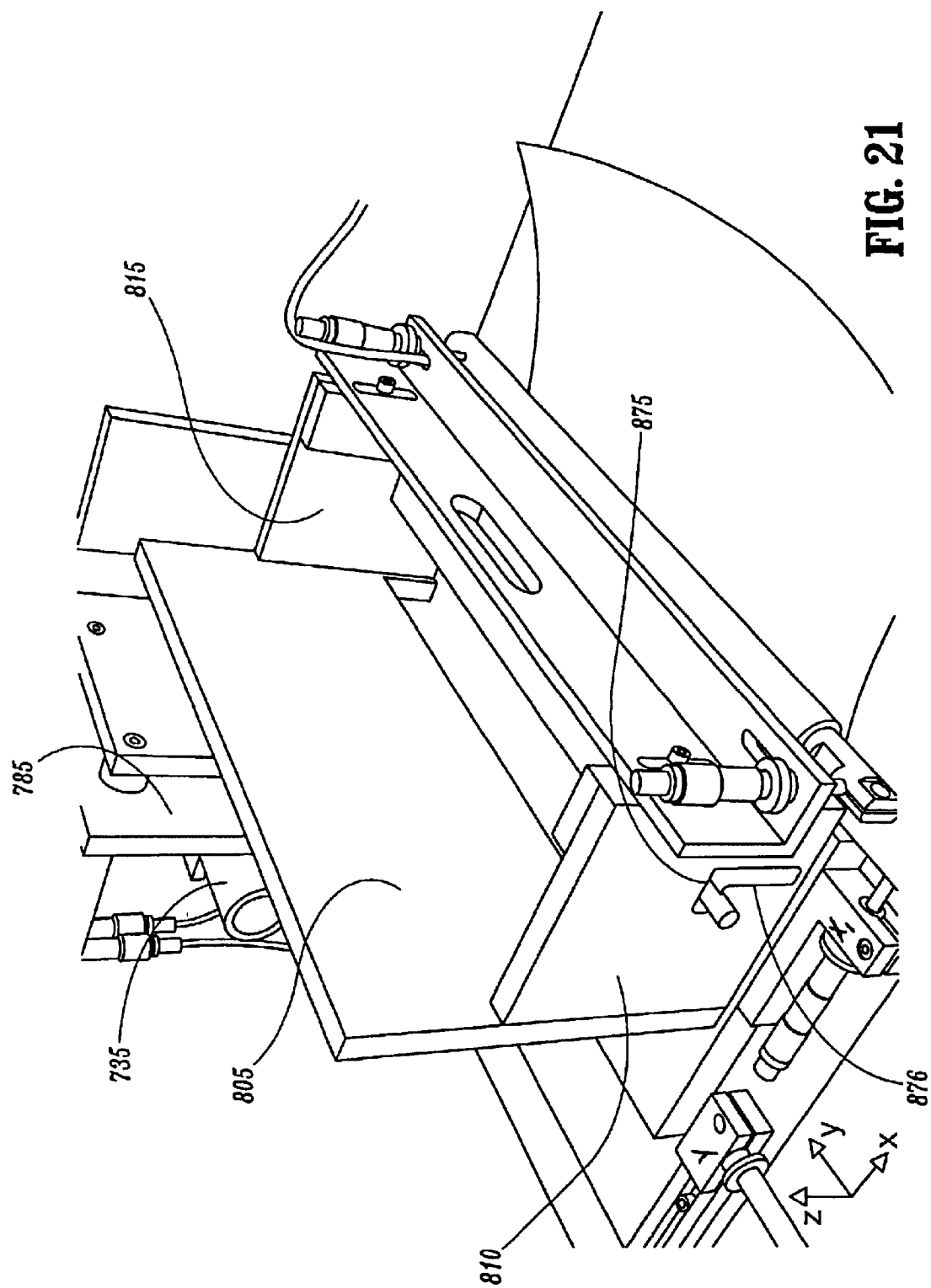
FIG. 21 is yet another three-dimensional view of the carriage.

Referring to FIGS. 19 through 21, the mechanical frame 255 (from FIG. 3) is shown in detail from various viewpoints. In FIG. 19, the entire assembly is cantilevered from faceplate 315 of $x_2$-stage 205 by means of two stiff rods (such as Newport Corp. Model 45 rods as used in the prototype), including the upper cantilevered rod 735 and the lower cantilevered rod 740. Two rods rather than one are used for improved stiffness, and also to insure that the assembly is aligned parallel to the print table 150, as explained presently. Rod clamps 745, 750, and 755 (such as Newport Corp. Model 340C as used in the prototype) are used to grip the rods and allow the position of the entire assembly to be adjusted in the y direction.

Referring to FIG. 20, there is provided a T-shaped plate 760, shown to better advantage in FIG. 20, which binds the two cantilevered rods (735 and 740) together into one, stiff unit by virtue of attaching to all the rod clamps. In the embodiment shown, to allow for the staggered arrangement of the rods, a spacer plate 770 is interposed between the descending tongue 765 of T-shaped plate 760 and rod clamp 755. If the bolt that ties the descending tongue 765 to spacer plate 770 is removed and the rod clamps 745 and 750 are loosened, the T-shaped plate 760 may be freely rotated about the axis of the upper cantilevered rod 735. This rotation is useful for servicing, because the carriage's entire front-end assembly 775, described in more detail below, is suspended from front surface 780 of T-shaped plate 760, such that the rotation provides access to the underside of assembly 775. After servicing, the T-shaped plate 760 and the assembly 775 may be easily returned to the original position, because the spacer plate 770 acts as a stop that limits rotation in the clockwise direction: the thickness of spacer plate 770 has been machined such that, when the tongue 765 of T-plate 760 rests against the spacer plate 770, the assembly 775 is accurately aligned parallel to the print table 150.

Affixed to the front of the T-shaped plate 760 is a micrometer-driven stage 785 (such as that sold under the tradename Melles Griot Model 07 XSC 007 as used in the prototype), the faceplate of which, 790, may be adjusted in the z direction by means of micrometer 795. Affixed to the faceplate 790 of the stage 785 (and thereby adjustable by its micrometer 795) is a three-sided frame 800, shown to better advantage in FIG. 21, that resembles the frame of a sofa. The frame 800 comprises a back plate 805 and two J-slotted side plates 810 and 815 that are rigidly affixed to back plate 805 at right angles.

2.5.2 Carriage: Need for Print-Force-Application System and Stamp-Control System The side plates 810 and 815 carry two systems important for printing; namely, the print-force-application system 260 and the stamp-control system 265.

Figure 22:
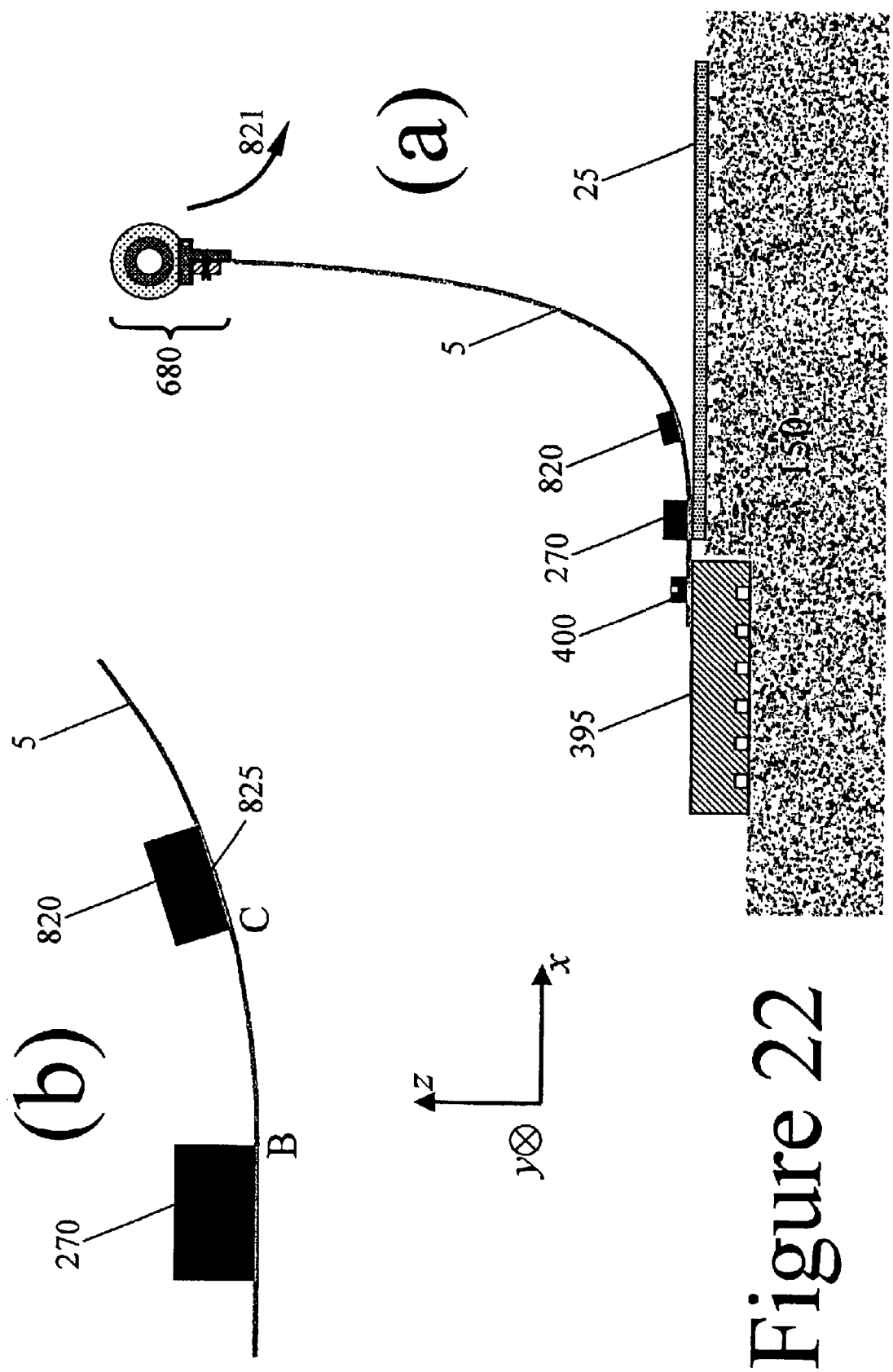
FIG. 22 is a schematic diagram of the system, showing rationale for a flat-iron and a vacuum bar.

Referring to FIG. 22, there is shown an embodiment wherein the print-force-application system 260 is embodied in a flat-iron 270, and the stamp-control system 265 is embodied in a vacuum-bar 820, which is part of the vacuum-bar assembly 280.

The simplest embodiment of the invention comprises neither the print-force-application system 260 nor the stamp-control system 265. In such a simplified system, the upper stamp clamp 130 shown in FIG. 22 would simply move in a trajectory 821 downward and to the right during the printing process, causing the inked stamp 5 to be draped upon the receiver 25 in a manner such that the curvature of the stamp at or near the contact front is substantially constant throughout the trajectory. However, it has been found experimentally that, when the stamp's back-plane layer 40 is 150-$\mu$m thick metal (e.g., Invar 36) and the lateral stamp dimensions are 381×381 mm, such a simplified system does not reliably produce uniform, intimate contact between the stamp 5 and the receiver 25, and thus does not reliably provide uniform transfer of the ink from stamp to receiver. Apparently, although the stiffness of the stamp's back-plane layer 40 does induce some vertical reaction force between stamp 5 and receiver 25 as they come into contact, for the dimensions stated, this reaction force is insufficient for reliable printing.

Thus, to obtain intimate contact reliably between stamp 5 and receiver 25, it is necessary to introduce the print-force application system 260 comprising the flat-iron 270 depicted in FIG. 22. Riding atop the stamp during the printing process, the flat-iron 270 is essentially a bar that moves horizontally in coordination with the motion of the upper stamp clamp 130, as described below in great detail. By virtue of its weight, the flat-iron 270 "irons" the stamp 5 onto the receiver 25. The y dimension of the flat-iron is substantially equal to that of the polymer layer 35 of stamp 5, such that the stamp is "ironed" by a uniform weight across it's entire width. The preferred embodiment of the print-force application system 260, of which the flat-iron 270 is the main constituent, is described in detail below in connection with FIGS. 23 through 25.

Regarding the vacuum bar 820 in FIG. 22a, the invention will function without it, but printing accuracy is improved by its addition. The vacuum bar 820, having a vacuum chuck in its lower surface 825, attracts the backplane layer 40 of stamp 5 upward against this vacuum surface 825, thereby creating, in the critical vicinity where the stamp 5 and the receiver 25 meet, a segment of the stamp BC, shown in FIG. 22b, having a well determined geometry that is constant both in time (throughout the printing process) and in space (across the width of the stamp). As long as the vacuum bar 820 retains its vacuum hold on the back-plane 40, the geometry of segment BC is guaranteed to remain constant throughout the printing process because it is determined by the fixed geometrical relationship between the flat-iron 270 and the vacuum bar 820. The geometry of segment BC is also guaranteed to be uniform across the width of the stamp (in the y direction) because the rigidity of the short segment BC prevents stamp sag across the width. By thus controlling stamp geometry, the stamp-control system 265, whose payload is the vacuum bar 820, has been found to improve markedly the accurate (undistorted) placement of the stamp's raised pattern 15 onto receiver surface 30 of receiver 25. Details of the stamp-control system are described below in connection with FIGS. 26–30.

2.5.3 Carriage: Print-Force Application System

Figure 23A:
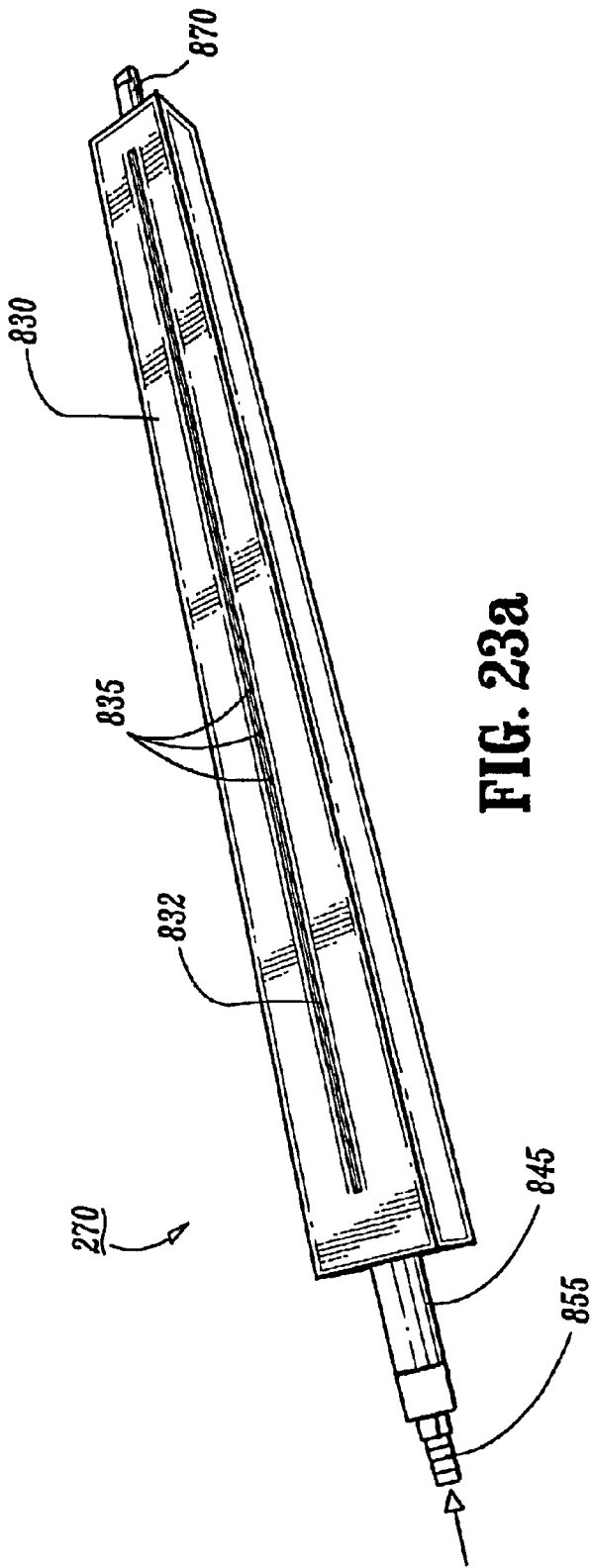
FIG. 23a and 23b are, respectively, a three-dimensional and an orthographic view of the flat-iron.
Figure 23B:
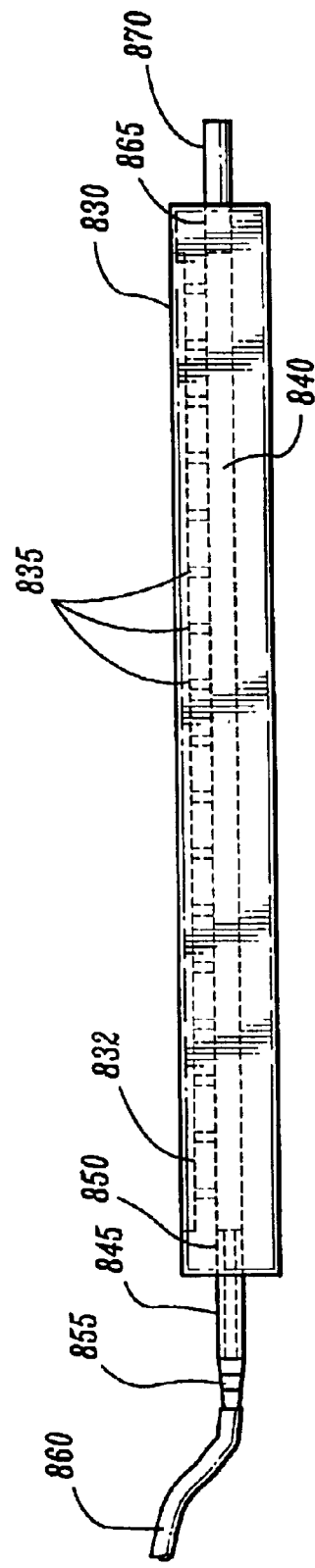

Although contact force between stamp 40 and receiver 25 may be applied in a variety of ways (such as by a roller), in the preferred embodiment force is applied using the flat-iron 270, which is constructed as shown in FIGS. 23a and 23b.

Referring to FIG. 23a, the disembodied flat-iron is shown three-dimensionally and inverted; in FIG. 23b, it is shown as an orthographically projected side view (also inverted). During printing and peeling, the bottom surface 830 of the flat-iron 270 floats over the surface of the stamp's back-plane 40 on a cushion of compressed gas (e.g., air or clean nitrogen) emanating from one or more double-blind grooves 832 cut along the centerline of surface 830. Thus, the weight of the flat-iron is supported by gaseous pressure. The compressed gas may be supplied to the groove 832 via a series of small, equally spaced bleed holes 835 that connect the groove 832 to a plenum chamber 840, a hole drilled parallel to the long axis of the flat-iron 270. Compressed gas may be supplied to the plenum chamber 840 via an annular pin 845 whose proximal end is pressed into a precisely bored hole 850 that terminates one end of the plenum chamber 840. The distal end of the annular pin 845 is fitted with a pneumatic fitting 855 suitable for attachment of a flexible hose 860. The opposite end of the plenum is also terminated with a precisely bored hole 865, which is precisely co-axial with hole 850. Pressed into hole 865 is a solid pin 870 that seals the plenum chamber 840.

Referring back to FIG. 21, the flat-iron's pins 845 and 870, described above, will preferably ride in J-shaped slots 875 cut into side plates 810 and 815. Thus, during printing the flat-iron's motion is not constrained in the vertical direction; rather, its lower surface 830 is free to float over the surface of the stamp's back-plane 40 as the stamp is laid upon the receiver 25. The flat-iron floats on the cushion of compressed gas as described above. At the same time, by virtue of being captured in the front and rear J-shaped slots 875, the flat-iron 270 is forced, during printing, to move with the carriage in the +x direction at the print speed v. During times other than printing, the short vertical segments 876 of J-shaped slots 875 provide a resting place for the flat-iron's pins 845 and 870, so that the flat-iron's lapped surface 830 is protected from inadvertent contact with other surfaces. In an alternative, more sophisticated, embodiment, the flat-iron would be moved automatically between the active (down) position and inactive (up) position by means of a computer-controller cam or other effective mechanism.

Figure 24:
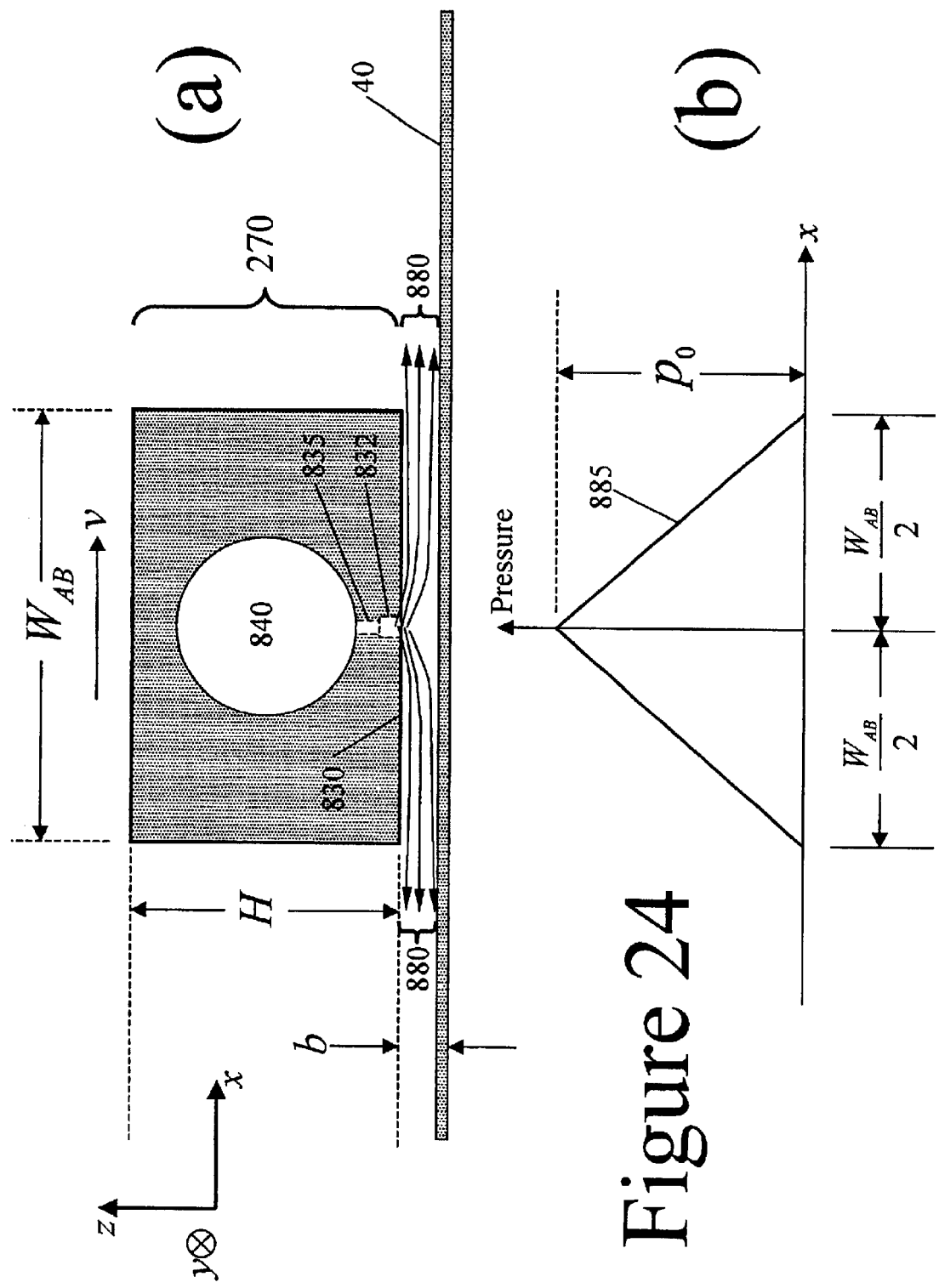
FIG. 24a is a cross-sectional schematic diagram of the flat-iron.
FIG. 24b shows the pressure profile in the air bearing.
Figure 25:
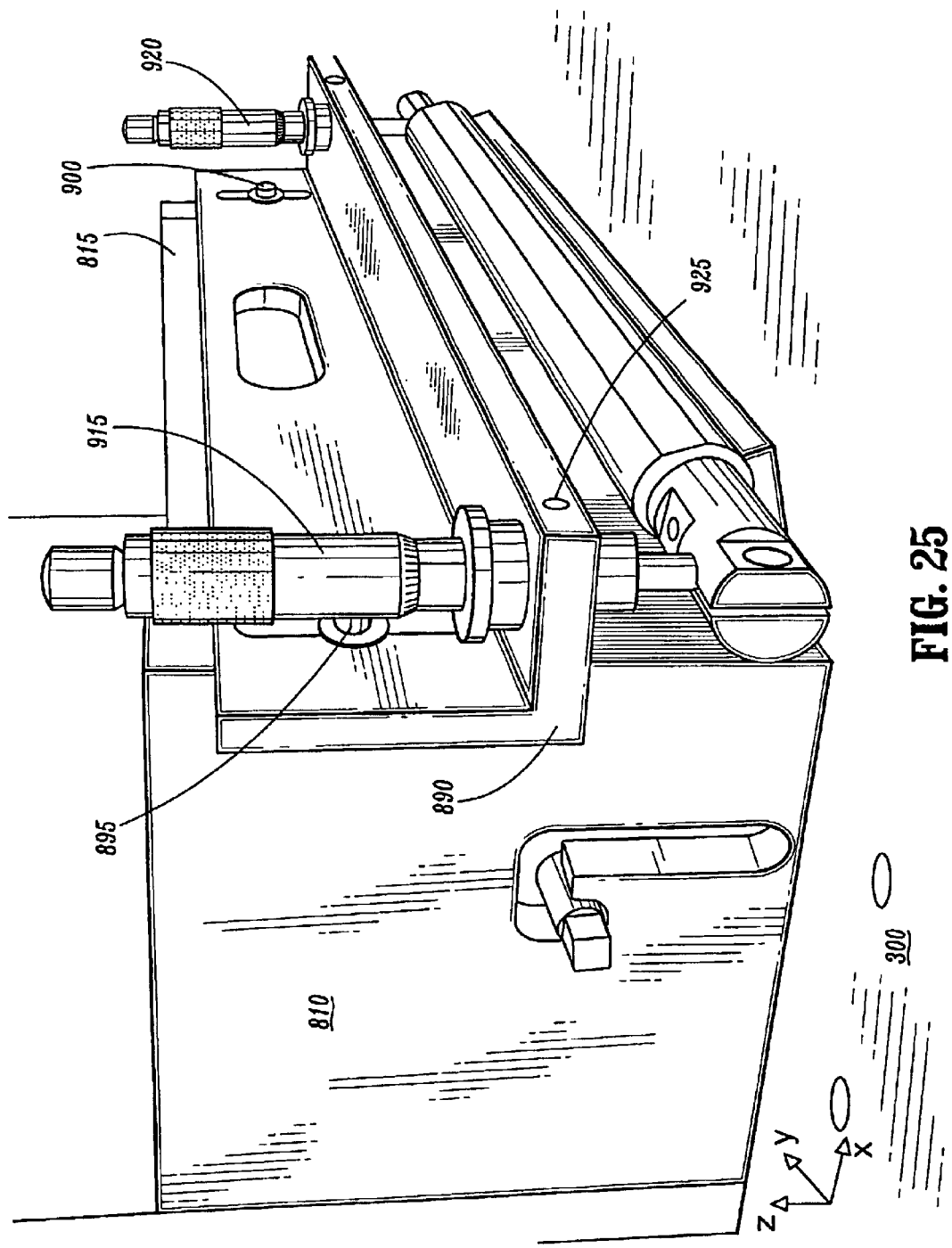
FIG. 25 is a three-dimensional view of the vacuum-bar assembly.

Referring to FIG. 24, the print-force application system 260 insures that the peak contact pressure between the stamp 5 and the receiver 25 is uniform. FIG. 24a shows a typical cross section of the flat-iron 270 as it moves over the stamp's back-plane 40 at velocity v (the print velocity). A cushion of compressed gas 880 emanates from double-blind groove 832 and flows in both the positive and negative x directions as shown. We assume simple Couette flow (and therefore, uniform pressure gradient) in each direction, as described, for example, in *Boundary Layer Theory*, by H. Schlichting, McGraw Hill (1968), the disclosures of which are incorporated by reference herein in their entirety. Thus, the pressure distribution 885 under the flat-iron is substantially triangular in shape as shown in FIG. 24b: the gage pressure is $p_0$ at the slit (x=0) and decreases to zero (atmospheric pressure) at the edges of the flat-iron (i.e., at $x=\pm W_{AB}/2$). The pressure causes the flat-iron to float a distance b above the surface of the stamp's back-plane 40. The integral of the gage pressure over x (i.e., the area of the triangle in FIG. 24b) equals the weight-per-unit-length of the flat-iron in the y direction, denoted σ, which is uniform because the flat-iron's height H and width $W_{AB}$ are uniform. Thus, $$p_0 = \frac{2\sigma}{W_{AB}}. \qquad (1)$$

From Couette theory, it may easily be shown that $\dot{Q}$, the volumetric flow rate of gas per unit length in the y direction, is related to $p_0$ and to the gap size b by $$\dot{Q} = \frac{b^3}{6\mu_g} \frac{p_0}{W_{AB}}, \qquad (2)$$

where $\mu_g$ is the viscosity of the gas. Comparing Equations (1) and (2) yields $$\dot{Q} = \frac{b^3}{3\mu_g} \frac{\sigma}{W_{AB}^2}, \qquad (3)$$

which implies that the gap size b may be controlled by the volumetric flow rate $\dot{Q}$. In the preferred embodiment, $\dot{Q}$ is controlled directly by a flow-control device, such as a rotameter (e.g., Omega Engineering Inc., Model FL-102, as used in the prototype). In the prototype of the invention, the flat-iron was made of hardenable stainless steel such as 17-4 PH, the air-bearing surface 830 was surface ground, the width of groove 832 was 1.5 mm, the flow rate per unit depth was $\dot{Q}$=0.93 cm$^2$/sec, and the cross-sectional dimensions of the flat-iron 270 were H=19 mm and $W_{AB}$=31 mm, such that the weight per unit length was σ=4.5×10$^4$ dyne/cm. If the gas is air, then $\mu_g$=2×10$^{-4}$ dyne-s/cm$^2$, so the air-bearing gap for this set of parameters, according to Equation (3), is b=49.2 μm.

2.5.4 Carriage: Stamp-Control System

The rationale for the stamp-control system 265 has been stated above in connection with FIG. 22. The stamp may be urged upward against the surface 825 shown in FIG. 22b by a variety of means, such as magnetically if the stamp's back-plane 40 is ferromagnetic. In the preferred embodiment it is held by vacuum, and thus the bar 820, which spans the width of the stamp in the y direction, we refer to herein as the "vacuum bar".

Figure 26:
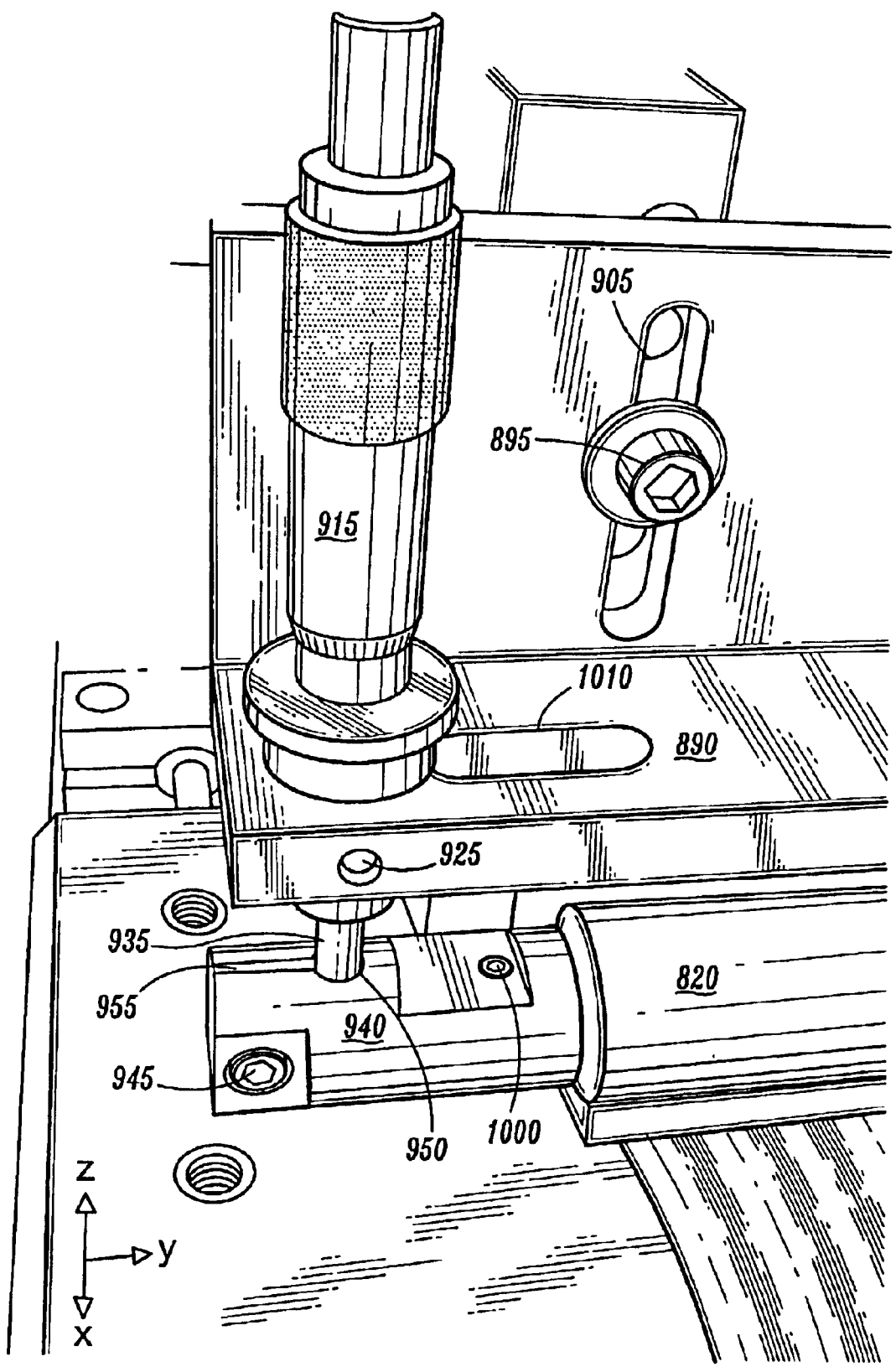
FIG. 26 is a three-dimensional close-up view of the front end of the vacuum-bar assembly.
Figure 27:
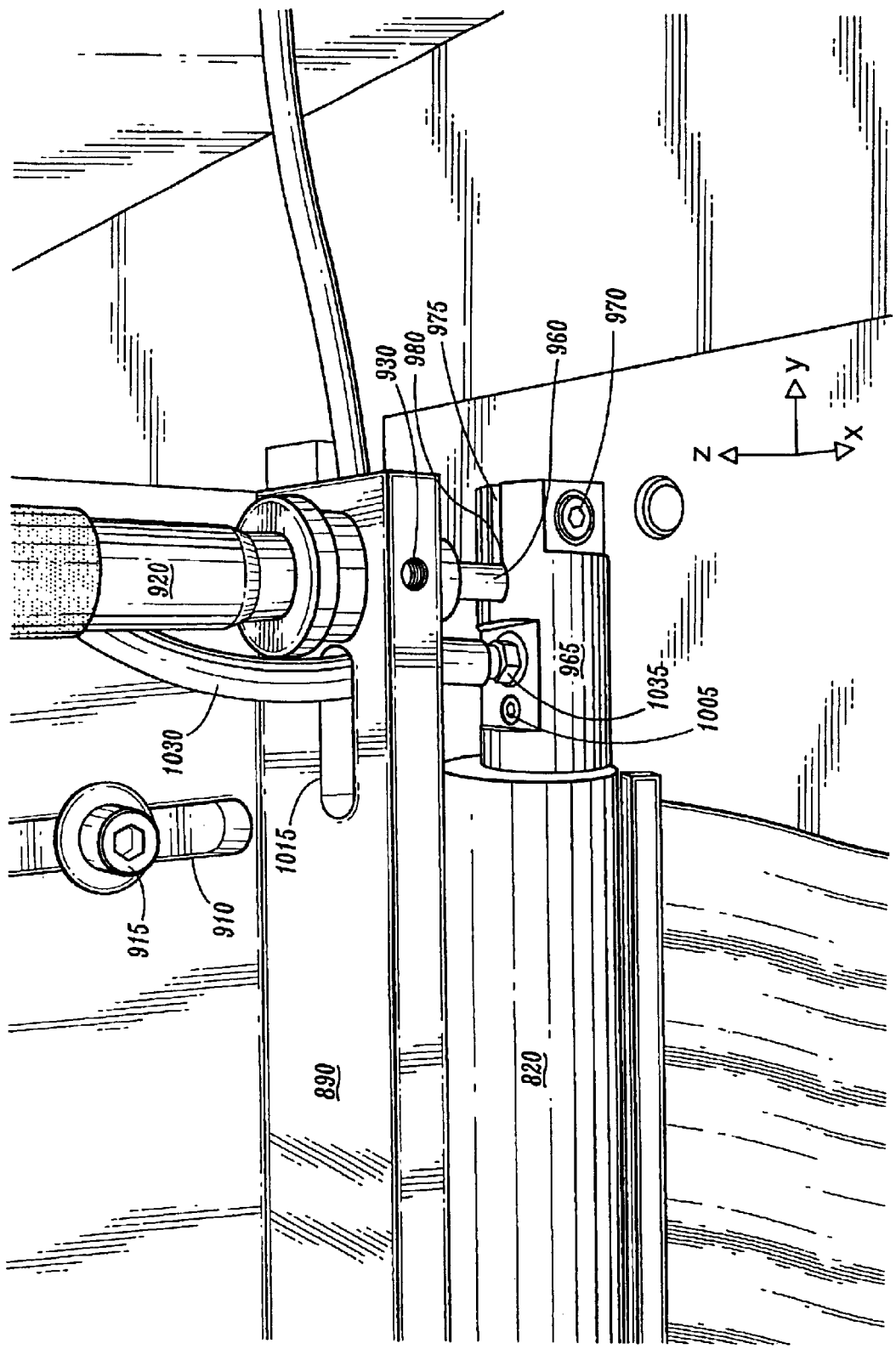
FIG. 27 is a three-dimensional close-up view of the rear end of the vacuum-bar assembly.

Referring to FIGS. 25 through 29, an aluminum L-beam 890 or equivalent spans the distance between side plates 810 and 815 of the three-sided frame 800. The L-beam 890 may be, attached to these side plates by means of bolts 895 and 900, which pass through slots 905 and 910 (visible in FIGS. 27 and 28 respectively) into threaded holes in side plates 810 and 815, thereby allowing coarse height and parallelism adjustment of vacuum bar 820 with respect to receiver surface 300 of print table 150. Finer (and more convenient) adjustment of height and parallelism is preferably provided by micrometer heads 915 and 920 (such as Model 262 from The L. S. Starrett Co. as used in the prototype) that are mounted in the horizontal flange of L-beam 890, near each end of the L-beam and fixed by setscrews 925 and 930 or equivalent means. As shown in FIG. 26, the non-rotating spindle 935 of the first micrometer head 915 may be affixed to a first axle clamp 940 by means of clamp screw 945. That is, after spindle 935 is inserted into hole 950, clamp screw 945 is tightened, causing the width of slot 955—and hence the diameter of hole 950—to be reduced, thereby clamping spindle 935 firmly to the first axle clamp 940. Likewise, as shown in FIG. 27 (and also in FIGS. 29a and 29d), the non-rotating spindle 960 of the second micrometer head 920 is affixed to the second axle clamp 965 by means of clamp screw 970, which reduces the width of slot 975—and hence the diameter of hole 980, thereby clamping spindle 960 firmly to the second axle clamp 965.

Figure 28:
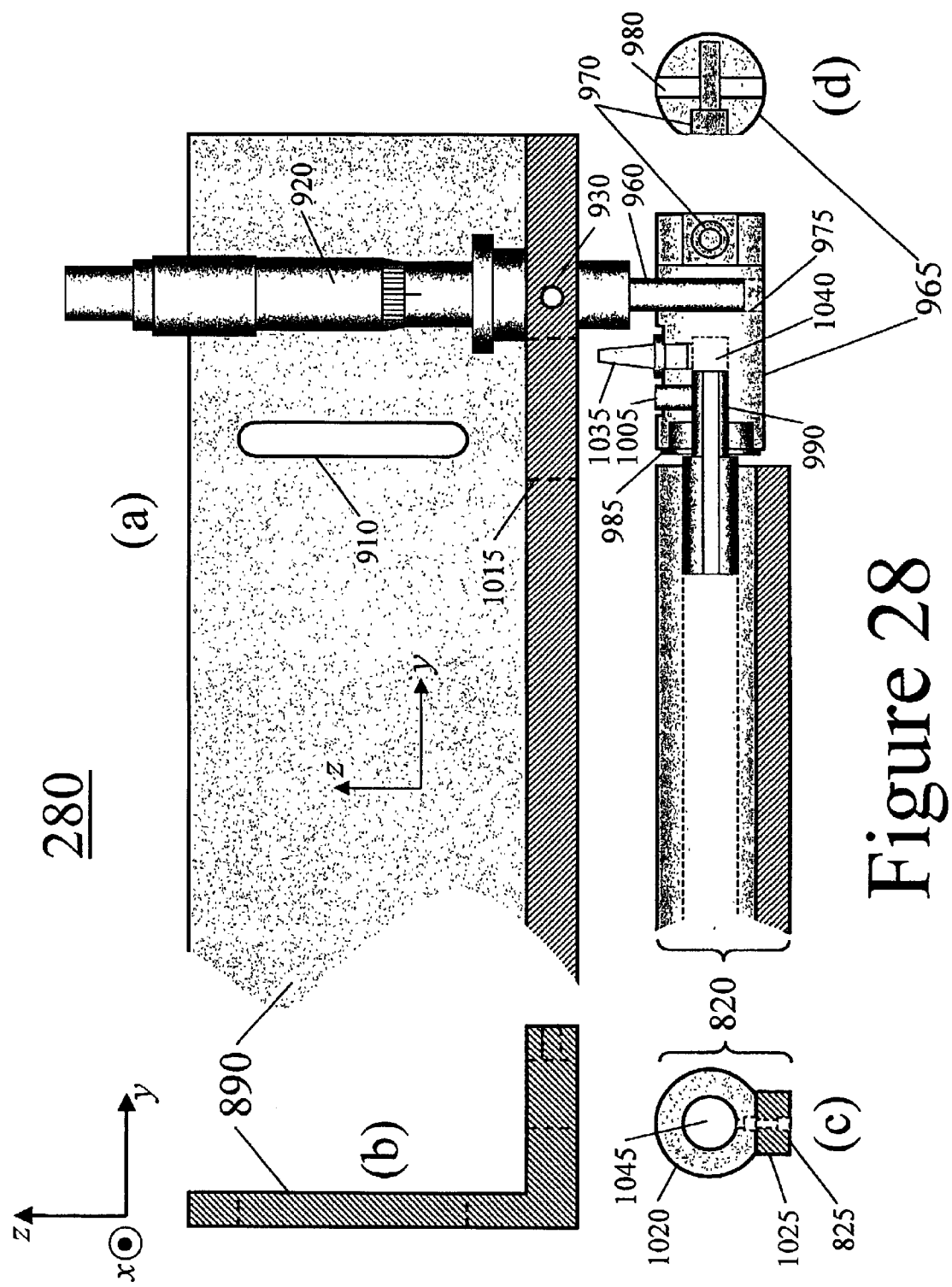
FIG. 28 shows various orthographic projections of the rear end of the vacuum-bar assembly.

Referring to FIG. 28, axle clamps 940 and 965, in addition to grasping the micrometer spindles 935 and 960 also serve to hold the vacuum bar 820 in such a way as to allow rotational adjustment of the vacuum bar about an axis parallel to the y direction. As shown in FIG. 28a, a flanged ball-bearing 985 is pressed into the rear axle clamp 940. This ball bearing 985 faces the vacuum bar 820, and its inner race receives an annular pin 990 that forms the rear end of the vacuum-bar's axis. Likewise, a similar ball bearing (not shown) is pressed into the front axle clamp, and receives a similar (although solid rather than annular) pin 995 (not shown) that forms the front end of the vacuum-bar's axis. Thus the vacuum bar 820, suspended between the two axle clamps 940 and 965, rotates freely about the axis formed by pins 990 and 995, thereby allowing angular adjustment of the vacuum bar 820 about an axis parallel to the y direction. After such an adjustment, the vacuum bar's angular position $\theta_{CD}$ may be locked, such as by tightening nylon-tipped set screws 1000 and 1005 that are threaded into the front and rear axle clamps, respectively. The setscrews' nylon tips insure that pins 990 and 995 are not scored when the setscrews are tightened. Slots 1010 (FIG. 26) and 1015 (FIGS. 28 and 29) provide access to the setscrews 1000 and 1005, so that they may be tightened or loosened.

Figure 29:
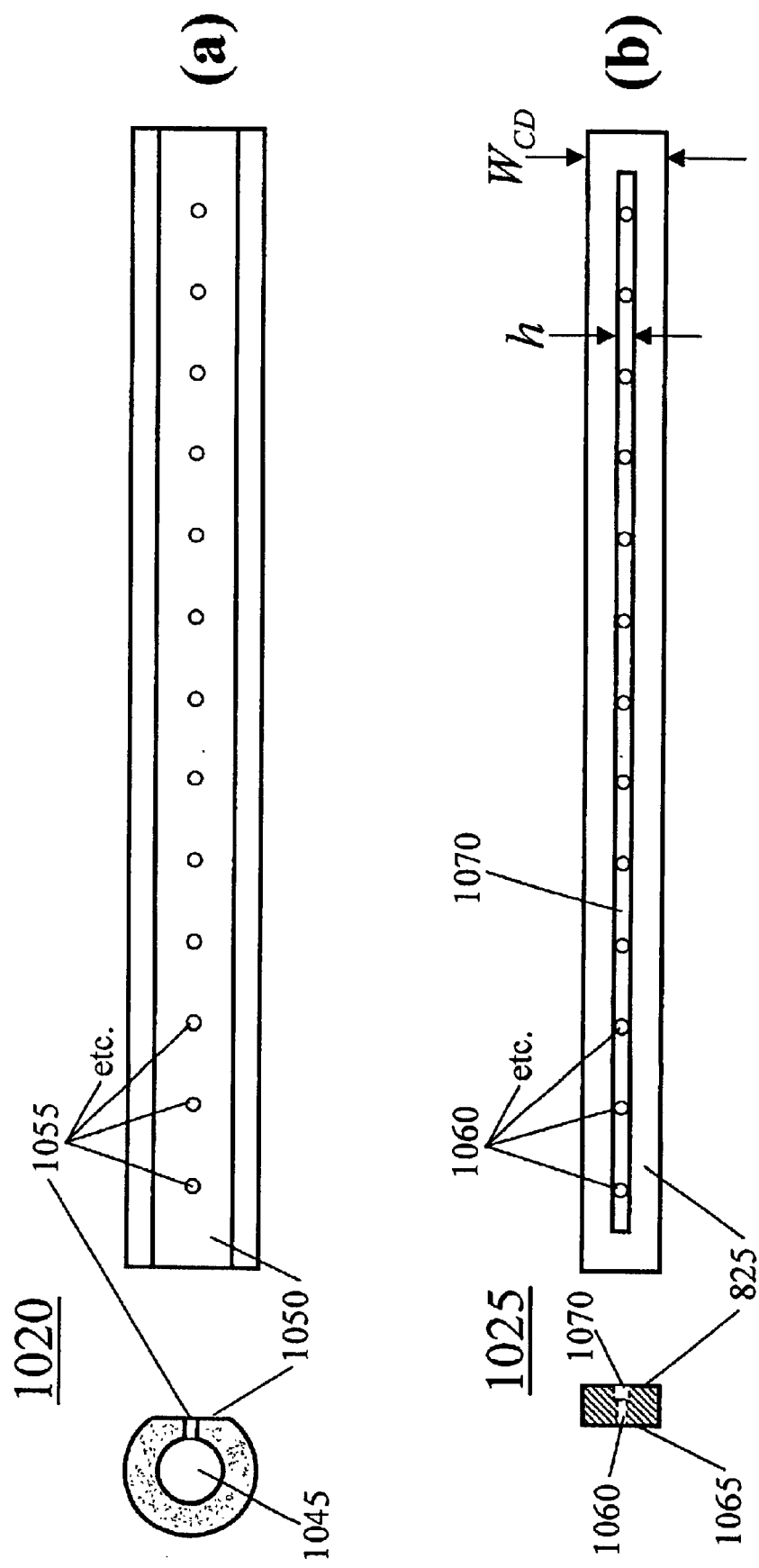
FIG. 29 shows orthographic projections of the vacuum bar.
Figure 30:
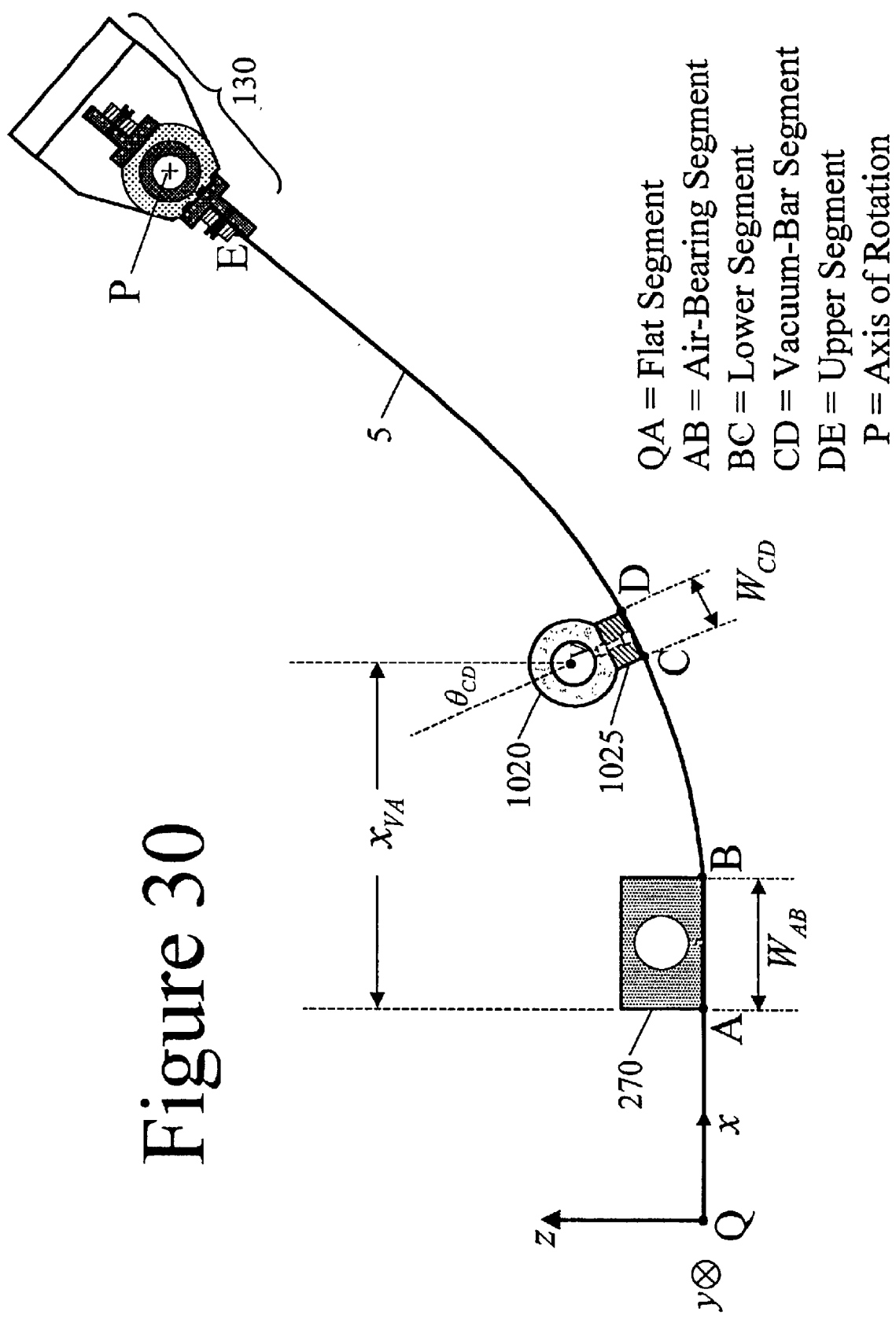
FIG. 30 is a schematic diagram showing the various stamp segments used in the mathematical analysis of the invention.

Referring to FIGS. 29a, 29c, and 30, the vacuum bar 820 comprises two pieces: the main body 1020 and the wear layer 1025. As described above in connection with FIG. 22, the bottom surface 825 of the vacuum bar 820 (i.e., the bottom surface of the wear layer 1025) is in sliding contact with the stamp's back-plane 40 during printing, thereby holding the stamp up, against the force of gravity, by means of vacuum suction. The wear layer 1025 will preferably be made of a low-friction material (such as polyethylene terephthalate, fluoropolymer, or the like) in order to minimize friction during the aforementioned sliding contact, thus eliminating "stick-slip" vibration that would compromise the accuracy of the printing process. Moreover, from a manufacturing viewpoint, the wear layer 1025 is a sacrificial medium that protects the main body 1020 from sliding-contact wear; after many printing cycles, the easy-to-fabricate wear layer 1025, preferably attached to the main body 1020 with double-stick tape, may be simply and economically replaced.

Referring to FIGS. 28 and 29a, a vacuum hose 1030 is threaded through slot 1015 and is attached to fitting 1035, thereby providing vacuum to cavity 1040 of rear-axle clamp 965, thence to the axial hole of annular pin 990, and thence to plenum 1045 of the vacuum-bar's main body 1020. The plenum 1045—an axial hole that runs the length of the vacuum-bar's main body 1020—is bored precisely coaxial near the two ends, such that, when the plenum is sealed by pins 990 and 995 pressed into the precisely bored ends, these pins form an axis that is precisely straight. As shown in FIG. 29, the vacuum-bar's main body 1020 has a flat surface 1050 along whose centerline is drilled a plurality of bleed holes 1055, each of which connects the plenum 1045 to the flat surface 1050. Wear layer 1025, which has the same rectangular dimensions as flat surface 1050, also comprises a plurality of bleed holes 1060 disposed in the same pattern as the holes 1055 in the main body 1020, such that when surface 1065 of the wear layer 1025 is aligned and affixed to flat surface 1050 of the main body 1020 using double-stick tape (the tape having been perforated at the location of each of the bleed holes 1060) or other suitable attachment means, bleed holes 1055 align with bleed holes 1060, and the vacuum pressure is thus communicated from the main-body's plenum 1045 to the wear layer's bleed holes 1060. A shallow, double-blind vacuum groove 1070 is cut along the centerline of wear-layer 1025's bottom surface 825. The vacuum groove 1070 is said to be "double-blind" because it does not extend all the way to the ends of surface 825. Because the vacuum groove 1070 intersects the bleed holes 1060, vacuum is communicated to this groove, and thus vacuum pressure acts on the whole area of the groove to lift the stamp's backplane 40 against the vacuum surface 825.

In the preferred embodiment, the vacuum pressure thus supplied to groove 1070 in surface 825 is variable, so that the force that lifts the stamp's backplane 40 against surface 825 may be adjusted high enough to hold the backplane reliably, yet low enough to avoid excessive drag as the vacuum bar's wear layer slides across the backplane 40. Toward this end, the vacuum-bar pneumatics 285, mentioned above in connection with FIG. 3, will preferably comprise a venturi-based vacuum pump (such as that used in the prototype, an Edco C4M10N-A), whose vacuum pressure output can be controlled by the venturi's supply pressure, which in turn is controlled by a conventional pressure regulator.

2.6 Linear-Motion System: Hardware

Referring again to FIGS. 3 and 4, stages 165, 185, and 205, which convert the rotary motion of motors 170, 190, and 210 into linear motion along axes $x_1$, z, and $x_2$ respectively, are high quality, medium-precision stages. Suitable stages for use with the invention, such as used in the prototype, are manufactured by Parker/Daedal, with the following model numbers:

Stage 165 ($x_1$ axis): 406600XR-MS-D3H3L2C4M4E1B1R1P2

Stage 185 (z axis): 406600XR-MS-D3H3L2C4M4E1B2R1P2

Stage 205 ($x_2$ axis): 406600XR-MS-D3H3L2C4M4E1B1R1P1.

Details about these stages are given in Parker/Daedal Manual No. 100-9313-01, the disclosures of which are incorporated by reference herein in their entirety.

Absolute accuracy of the stages is not critical in the quest for printed accuracy, because the placement accuracy of printed features of the stamp's raised pattern 15, although critically dependent on the integrity of the stamp's backplane layer 40 as it is laid upon the receiver 25, does not depend on the precise motion of the stages. For example, the Parker stages cited above have an absolute accuracy of only 50 microns, yet the embodiment shown in FIG. 4 can faithfully replicate printed features over an area of 271 by 203 mm with an absolute, three-sigma accuracy of less than 3 microns.

It is desirable to avoid vibration in the stages. For this reason, in the preferred embodiment, motors 170, 190 and 210 are high-quality DC-servo motors rather than stepper motors. DC-servo motors have been found to produce much smoother motion of the stamp and the carriage as they execute the three-axis coordinated motion required to lay the stamp on the receiver. Motors suitable for use with the invention are Parker Gemini Series motors, model SM233AE-NGSN, driven by Parker Gemini drivers, model GV-L3E, such as are used in the prototype. Detailed instructions for operating the motors are in Parker manual 88-017790-10C; instructions for operating the drivers are in Parker manuals 88-017778-10B and 88-017791-10C, the disclosures of which are incorporated by reference herein in their entirety.

The motor controller 220 directs the motor drivers to turn the motors as required to create the coordinated, three-axis motions of the upper end of the stamp (axes $x_1$ and z) and the carriage (axis $x_2$), as required for printing and peeling. Such motor controllers are well known in the art. A suitable motor controller for use with the invention is that used in the prototype, a Parker model 6K8, which is described in Parker manual 88-017547-10A, the disclosures of which are incorporated by reference herein in their entirety. The Parker 6K8 controller may be programmed using the 6K Programming Language, as documented in two Parker publications "6K Programmer's Guide" (88-017137-10A) and "6000 Series Software Reference" (88-012966-01), the disclosures of which are incorporated by reference herein in their entirety. For manual control of the stacked pair of stages 165 and 185, it is convenient to use a hardware joystick 240, such as that used in the prototype, a Parker model JS-6000.

The information required to create the three-axis coordinated motions of axes $x_1$, z, and $x_2$ (i.e., 160, 180, 200) originates in the computer 225, which for example may be an IBM-compatible Personal Computer, or any other suitable computer system. The required information is generated by software 235, which will be described in detail presently. Typically, the entire series of coordinates required to specify the $x_1$, z, and $x_2$ motions are calculated once by the software 235, and then downloaded to the motor controller 220. Subsequently, the motors may be repeatedly driven directly from the controller 220 without further computation in the computer 225.

The computer hardware 230 comprises, in addition to the usual components (microprocessor, memory, storage, I/O), a communications port such as an RS-232 port or other I/O means by which the computer 225 communicates with the motor controller 220.

2.7 Linear-Motion-System Software

The software 235, provides mathematical means to specify—for virtually any type and size of stamp 5—the proper, three-axis coordinated motions that must be executed along axes $x_1$, z, and $x_2$ during the printing process to lay the stamp 5 progressively upon the receiver 25 and subsequently to peel the stamp from the receiver. These three-axis coordinated motions will hereinafter be called "the printing trajectory" and "the peeling trajectory" respectively.

2.7.1 Software: Motivation for a Mathematical Solution

Referring to FIG. 30, the printing trajectory must be arranged such that the curved shapes that the stamp assumes throughout the trajectory, such as those shown in FIGS. 6a, 6b, and 6c, allow the lower surface 825 of the vacuum bar 820 (from FIG. 22) to retain its vacuum hold upon the stamp 5. That is, as the carriage 125 moves the flat-iron 270 and the vacuum bar 820 left-to-right along axis $x_2$ at a uniform rate, the upper stamp clamp 130 must move the upper end of the stamp along axes $x_1$ and z smoothly downward and to the right so that, at every instant, the curve of the stamp "kisses" the vacuum bar.

It may be appreciated intuitively that if the upper end of the stamp is moved downward too slowly, the vacuum bar, moving rightward, will eventually stretch and kink the stamp. Conversely, if the upper end of the stamp is moved-downward too quickly, it will eventually, by virtue of the stamp's stiffness, pull way from the vacuum bar's hold. Preventing the latter is typically the more difficult requirement, because the vacuum-bar's vacuum chuck (i.e., the double-blind groove 1070 in wear layer 1065 from FIG. 29) is deliberately weak so as to minimize sliding friction between the stamp 5 and the vacuum-bar's wear surface 1025. Therefore, the printing trajectory will be specified rather carefully to insure that the stamp's natural shape remains tangent to the vacuum bar throughout the motion.

Retaining this vacuum attachment enhances printed accuracy because holding the stamp's shape constant in the segment BC ensures constant curvature near the contact line (where the stamp and receiver meet, near or at point B in FIG. 22), and thereby provide uniform tensile strain in the stamp's raised pattern 15. If the printing trajectory is incorrectly specified, the stamp will assume incorrect shapes during the printing process, eventually causing the stamp to break away suddenly from the vacuum bar's vacuum hold. If this happens, the accuracy of printing is ruined for two reasons: first, the printing process is violently disturbed when the vacuum suddenly breaks and the stamp suddenly changes its shape and, second, the stamp segment BC will thereafter assume unknown and variable geometry throughout the remainder of the printing process such that the curvature near the contact line, and therefore the tensile strain induced there in the stamp's raised pattern 15, will not be constant.

Correct specification of the printing trajectory requires a mathematical understanding of the bending mechanics of the stamp. The analysis given below is based on Euler's famous work on the problem of "the elastica", as described in articles 262 and 263 of *A Treatise on the Mathematical Theory of Elasticity*, by A. E. H. Love, ISBN: 0486601749, the disclosures of which are incorporated by reference herein in their entirety. Euler's analytical solution predicts the static shape assumed by a uniform thin elastic object, such as the stamp 5, when forces are applied to its ends only. The problem considered here is more general, because two additional elements are included: (1) the force of gravity on the stamp, and (2) the mid-span forces applied to the stamp by the flat-iron and vacuum bar. Consequently, the solutions obtained here must be numerical rather than analytical, but such numerical solutions are rapidly generated by the computer 225.

2.7.2 Software: Formulation of the Mathematical Solution

The stamp 5 is considered, like Euler's elastica, to be a thin, elastic object of uniform cross section, as suggested by FIG. 30. Thus, each labeled point on FIG. 30 actually represents a line in the y direction. Point Q, which is fixed in space, is the lower edge of the stamp that is attached to the vacuum plate 395. Point E is the upper edge of the stamp that is attached to the upper stamp clamp 130 along an upper-clamp line$_E$ parallel to the y axis, which translates via crossed stages 165 and 185 along axes $x_1$ and z, as previously described. Point P is the axis of rotation of the upper stamp clamp's shaft 630. Points A and B are the points on the stamp that at time t are nearest, respectively, to the edges of the air-bearing-supported flat-iron 270; while at the same time points C and D touch the edges of the vacuum bar's wear layer 1025. As explained above, the flat-iron 270 and the vacuum-bar assembly 280 move in unison along axis $x_2$. The vacuum-bar angle $\theta_{CD}$ and the height of the vacuum bar above z=0, although adjustable, are fixed throughout a trajectory. Hereinafter, we refer to the various segments of the stamp as follows: QA is the "flat segment", AB is the "air-bearing segment", BC is the "lower segment", CD is the "vacuum-bar segment", and DE is the "upper segment." By referring to QA as the "flat segment", we implicitly assume that the flat-iron 270 is heavy enough to force all of segment QA flat onto the receiver 25. In practice, some or all of segment AB may also be flattened onto the stamp, as discussed presently.

During the printing process, point A (together with points B, C, and D, whose geometry is fixed relative to A) moves along the $x_2$ axis at a constant rate by virtue of the motor-driven $x_2$ stage 205. Each position $x_A$ of point A, together with coordinates $(x_P, z_P)$ of point P (the upper pivot), will be referred to as a "configuration". That is, a configuration is specified by the three numbers $(x_A, x_P, z_P)$. If a configuration satisfies all the constraints of the problem—the differential equation of the stamp and boundary conditions, then it is considered a "viable configuration". A printing trajectory is simply an ensemble of viable configurations having monotonically increasing values of $x_A$. That is, the printing trajectory is formed by "connecting the dots" between viable configurations—by moving stages $(x_1, z, x_2)$ (i.e., 165, 185, 205) in coordination with each other, with point A moving continually rightward and point P moving continually rightward and downward, so as to perform piecewise linear interpolation between a set of viable configurations. Thus, the objective of the following mathematical analysis is to specify, for each given value of $x_A$, the required location $(x_P, z_P)$ of pivot P to produce a viable configuration.

Figure 31:
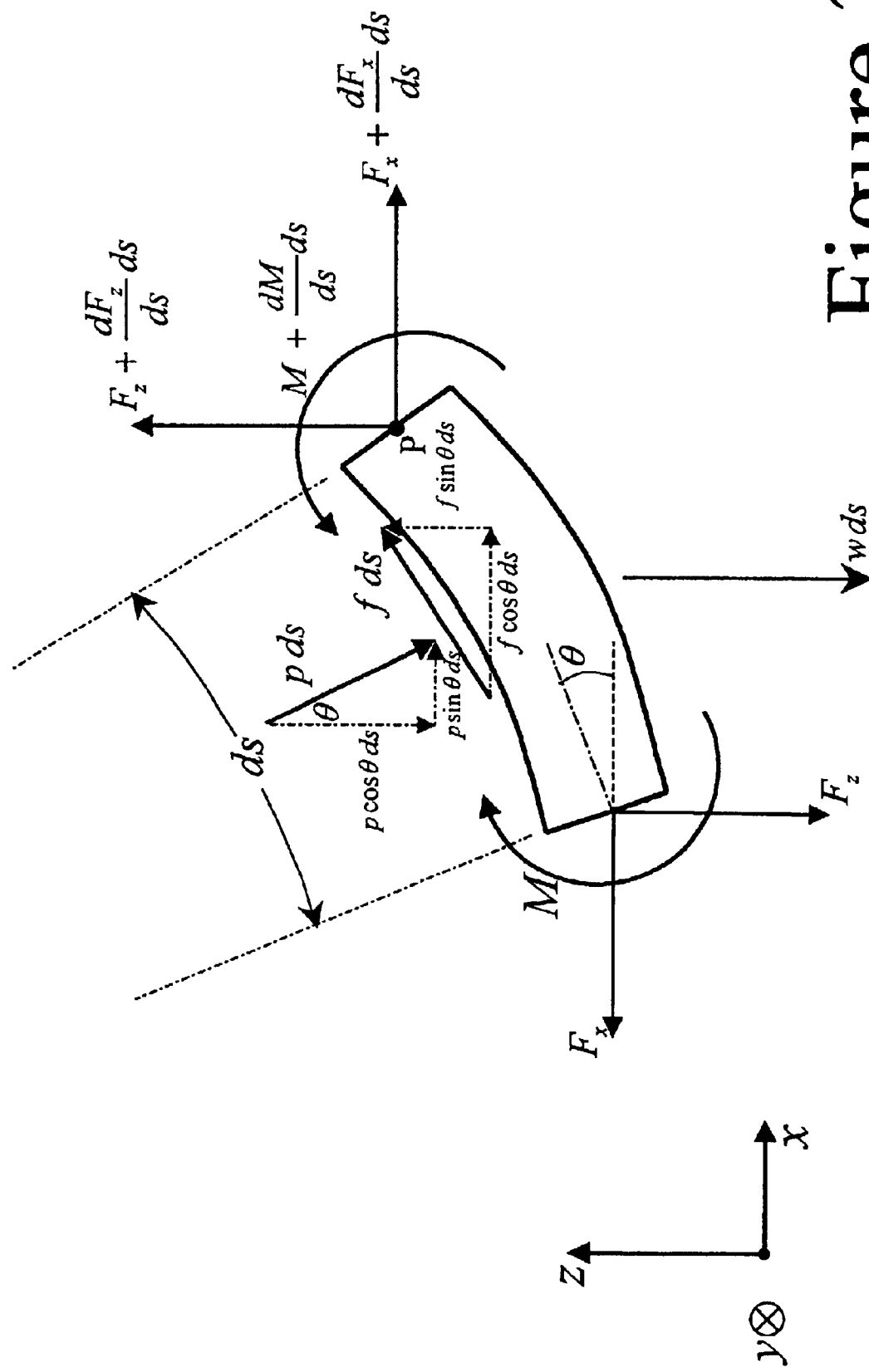
FIG. 31 is a free-body diagram of a differential element of the stamp.

The differential equation of the stamp, as well as the various boundary conditions, are specified in the ensuing analysis. Following Euler, we treat the stamp as a bending beam that transmits an internal bending moment, a shear force, and an axial (tangential) force. Referring to FIG. 31, we use curvilinear coordinates s and $\theta$, where s is arc length along the stamp, measured rightward from point Q. There is shown in the drawing a differential element of the stamp, of infinitesimal length ds and unit depth normal to the plane of the drawing. The angle $\theta$, measured counterclockwise from horizontal, is the angle of this differential element ds. Thus, $\theta$ is a function of s; that is, the stamp hangs in a curve. The weight per unit area of the stamp is denoted w, and so the force w ds acts downward on the differential element.

Also, acting internally on the stamp's cross-sectional face at each end of the differential element, are the forces-per-unit-depth $F_x$ and $F_z$, as well as the internal bending-moment-per-unit-depth M. These internal loads are the resultants of internal, tensile/compressive stresses tangential to the stamp and shear stresses normal to it. To simplify the mathematics, however, the loads $F_x$ and $F_z$ are resolved along the x and z axes rather than tangential and normal to the stamp.

Surface stresses acting transverse to the surface of the stamp are also included in this analysis. The stress normal to the face, positive downward, is denoted p (i.e., the normal force per unit depth is p ds); the stress tangential to the surface, positive toward positive s, is denoted f (i.e., the tangential force per unit depth is f ds). For segments BC and DE, p=f=0, because no surface stresses act in these regions.

Figure 33:
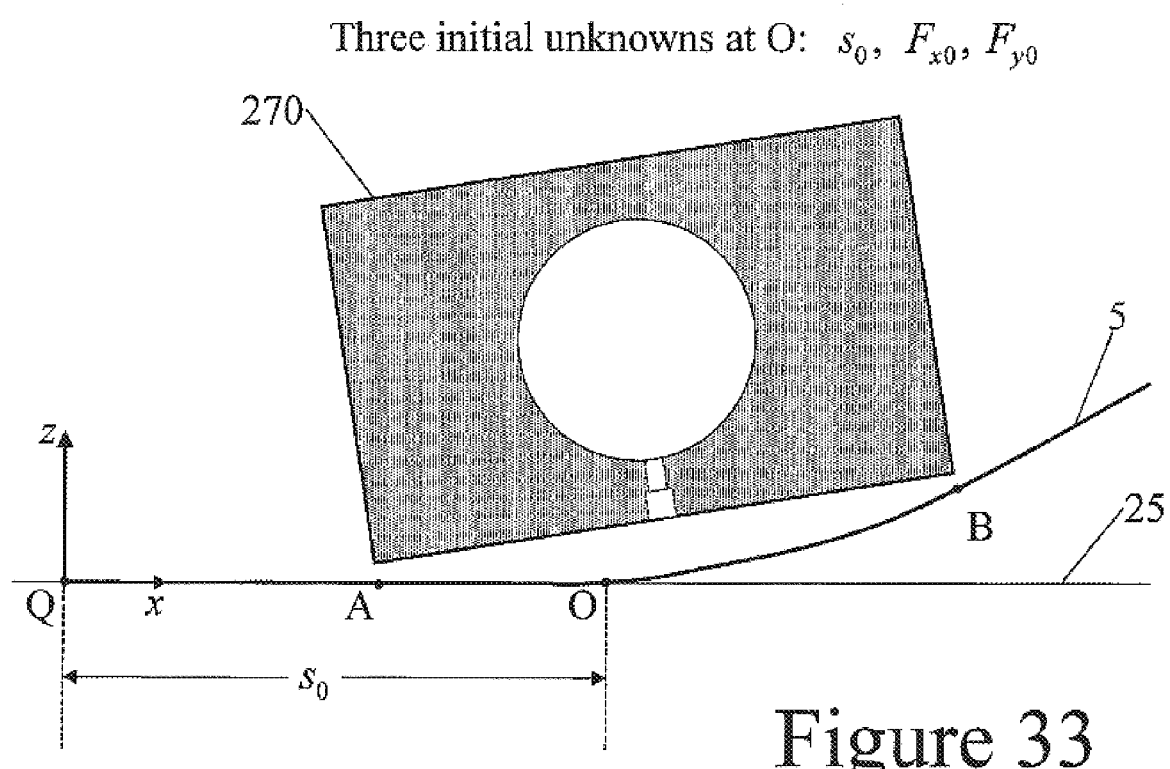
FIG. 33 is a close-up diagram of stamp segment AB.

For the air-bearing segment AB, the tangential stress f is negligible because the air-bearing's coefficient of friction is nearly zero. The normal pressure distribution $p_{AB}(s)$ acting in the air-bearing segment AB comprises both a positive (i.e., downward) pressure $p_{AIR}(s)$ from the air bearing and a negative (i.e., upward) reaction pressure $p_R(s)$ from the receiver 25. The air-pressure profile, shown in FIG. 24b, may assumed to be $$p_{AIR}(s) = \begin{cases} \dfrac{2p_0}{s_B - s_A}(s - s_A), & s_A \leq s \leq \dfrac{s_A + s_B}{2} \\ \dfrac{2p_0}{s_B - s_A}(s_B - s), & \dfrac{s_A + s_B}{2} \leq s \leq s_B \end{cases} \quad (4a)\ (4b)$$

where the relationship between $p_0$ and the weight per unit length $\sigma$ the flat-iron 270 is given by Equation (1) above. The reaction pressure $p_R(s)$ may be assumed to be equal and opposite to $p_{AIR}(s)$ over the segment AO where, as shown in FIG. 33, the stamp 5 is assumed to be in contact with the receiver 25. Thus $$p_R(s) = \begin{cases} -p_{AIR}, & s_A \leq s \leq s_0 \\ 0, & s_0 \leq s \leq s. \end{cases} \quad (4c)\ (4d)$$

The net pressure in the air-bearing segment AB is therefore $$p_{AB}(s) = p_{AIR}(s) - p_R(s). \quad (4e)$$

Figure 32:
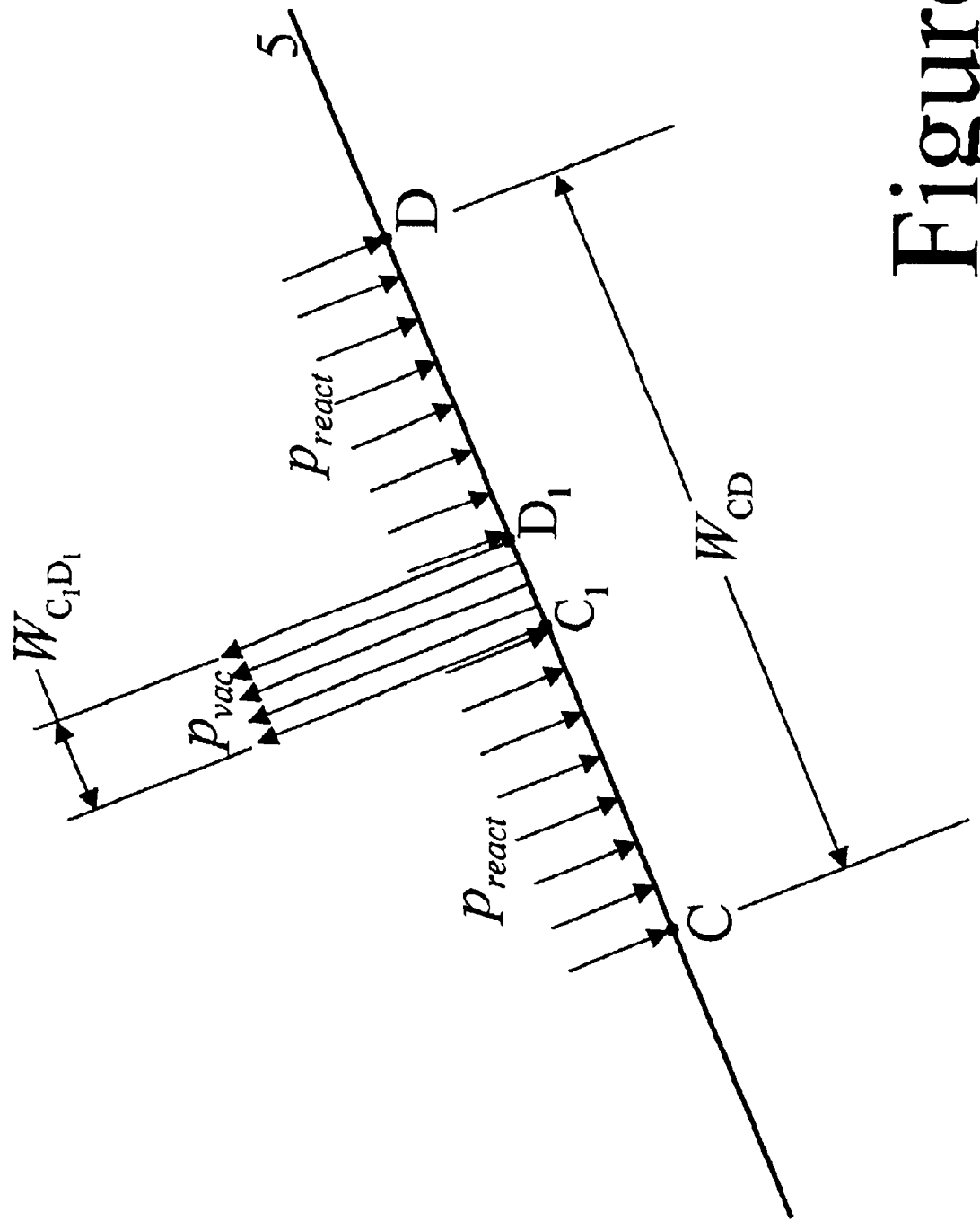
FIG. 32 is a diagram showing forces and dimensions on the lower surface of the vacuum bar.

Referring to FIG. 32, the normal-pressure distribution $p_{CD}(s)$ acting in the vacuum-bar segment CD comprises both the negative (i.e., upward) vacuum pressure, $-p_{vac}$, acting over the area $C_1 D_1$ of the double-blind groove 1070 in wear layer 1025, as well as the positive (i.e., downward) reaction pressure $p_{react}$ acting over the lower surface 825 ($CC_1$ and $D_1 D$) of wear layer 1025. Thus, assuming that $p_{react}$ is a uniform load, $$p_{CD}(s) = \begin{cases} -p_{vac} & s_{C_1} \leq s \leq s_{D_1} \\ p_{react} & s_C \leq s < s_{C_1} \text{ and } s_{D_1} < s \leq s_D. \end{cases} \quad (5a)$$

Assuming further that the positive and negative normal forces due to these pressures balance each other, $$p_{react} = \left(\dfrac{W_{C_1 D_1}}{W_{CD} - W_{C_1 D_1}}\right) p_{vac}, \quad (5b)$$

where, as shown in FIG. 32, $W_{CD}$ is the width of segment CD, and $W_{C_1 D_1}$ is the width of the double-blind groove 1070. The tangential stress distribution $f_{CD}(s)$ acting in the vacuum-bar segment CD is the frictional stress associated with the reaction forces $p_{react}$. Thus $$f_{CD}(s) = \begin{cases} 0 & s_{C_1} \leq s \leq s_{D_1} \\ \mu\, p_{react} & s_C \leq s < s_{C_1} \text{ and } s_{D_1} < s \leq s_D, \end{cases} \quad (5c)$$

where $\mu$ is the coefficient of friction between the stamp 5 and the wear layer 1025.

Although the stamp is in motion during the printing process, mathematically we assume that the process is quasi-static; that is, that inertia forces are negligible compared to other forces. Therefore, the equations that describe the differential stamp element in FIG. 31 at any time t during the printing process (i.e., for any configuration) are the equations of static equilibrium:

$\Sigma$Horizontal Forces=0 (6a)

$\Sigma$Vertical Forces=0 (6b)

$\Sigma$Counterclockwise moments (about left end of element ds)=0 (6c)

By inspection of FIG. 31, ignoring terms of order $ds^2$, these equations are:

$$\dfrac{dF_x}{ds} = -p\sin\theta - f\cos\theta \quad (7a)$$

$$\dfrac{dF_z}{ds} = w + p\cos\theta - f\sin\theta \quad (7b)$$

$$\dfrac{dM}{ds} + F_z \cos\theta - F_x \sin\theta = 0. \quad (7c)$$

The relation between moment M and curvature $\frac{d\theta}{ds}$ in a beam is $$M = EI\frac{d\theta}{ds} \quad (8)$$

as derived in many standard engineering texts; for example, in Section 3-5 of *The Analysis of Stress and Deformation*, by George W. Housner and Thad Vreeland, Jr., Library of Congress Catalog Card Number 65-22615 (1975), the disclosures of which are incorporated by reference herein in their entirety. In Equation (8), E is the Young's modulus of the stamp, and I is the area moment of inertia of the stamp's cross section per unit depth in the y direction (see FIG. 30). Although the stamp 5 may comprise two layers, the back-plane layer 40 is typically so much stiffer than the polymer layer 35 that, to an excellent approximation, E and I may be taken to be the modulus and the moment of inertia of the back-plane layer 40 only.

Introducing Equation (8) into Equation (7c) yields:

$$EI\frac{d^2\theta}{ds^2} + F_z\cos\theta - F_x\sin\theta = 0. \quad (9)$$

The solution for the shape of the stamp, $\theta(s)$, is obtained by piecewise (i.e., segment-wise) numerical integration of Equations (7a), (7b) and (9). The numerical solution is obtained by defining the vector u of unknowns as $$u \equiv \begin{Bmatrix} u_1 \\ u_2 \\ u_3 \\ u_4 \end{Bmatrix} \equiv \begin{Bmatrix} \theta \\ \frac{d\theta}{ds} \\ F_x \\ F_z \end{Bmatrix} \quad (10)$$

Then Equations (7a), (7b) and (9) may be written as $$\frac{du}{ds} = F(u), \quad (11a)$$

where $$F(u) \equiv \begin{Bmatrix} u_2 \\ \frac{u_3}{EI}\sin u_1 - \frac{u_4}{EI}\cos u_1 \\ -p\sin u_1 - f\cos u_1 \\ w + p\cos u_1 - f\sin u_1 \end{Bmatrix} \quad (11b)$$

Given the stamp's physical properties E, I, and w, and the surface-loading conditions p and f for each segment, Equations (11) describe how $\theta$ (as well as $F_x$ and $F_z$) vary as functions of arc-length s throughout the various segments. The surface-loading conditions p and f in the various segments were discussed previously in connection with Equations (4) and (5). To solve for the shape of the stamp in a given configuration, therefore, it remains only to specify the initial values of the variables $u_1$ at some starting point $s_0$, and then to integrate numerically the differential equations (11a) starting at $s=s_0$. Numerical integration of these nonlinear differential equations may be carried out using various methods, such as fourth-order Runge-Kutta integration. Such methods are described, for example, in *Numerical Recipes in C*, by William H. Press et al., the disclosures of which are incorporated by reference herein in their entirety. When the right end of a segment is reached, the values of the $u_1$ obtained at the final point (e.g., point B in segment AB) are used as the initial conditions for integration of the next segment (e.g., segment BC).

The arc-length coordinates of points A, B, C, D, and E, denoted $s_A$, $s_B$, $s_C$, $s_D$, and $s_E$ respectively, must be known a priori for straightforward integration of the differential equations (11a). Of course, because segment QA is flat, $$s_A = x_A. \quad (12a)$$

Although the exact arc-lengths of segments AB, BC, and CD are not precisely known a priori, these segments are typically short and the stamp's curvature therein is low. Therefore, to an excellent approximation, $$s_B \approx x_A + W_{AB}; \quad (12b)$$

that is, the arc length $s_B - s_A$ (i.e. $s_B - x_A$) of segment AB is assumed to be equal to the width $W_{AB}$ of the flat-iron itself (see FIG. 30). The arc length of segment BC, $s_C - s_B$, is approximately that of the straight line connecting points B and C, thus $$s_C \approx s_B + \sqrt{(x_C - x_B)^2 + (z_C - z_B)^2}. \quad (12c)$$

where the differences under the radical in Equation (12) are known by direct measurement of the apparatus. The arc length of segment CD is assumed to be equal to the width $W_{CD}$ of the vacuum bar, thus $$s_D \approx s_C + W_{CD}. \quad (12d)$$

Finally, $$s_E \approx L, \quad (12e)$$

where L is the total length L of the stamp, from point Q to point E which is known by direct measurement of the stamp.

As shown in FIG. 32, point O, with arc-length coordinate $s_0$, is the point where the stamp first departs from the flat condition $\theta=0$, and thus is the starting point for integration of the differential equations (11a). Unfortunately, the location of point O is unknown a priori. However, as suggested by FIG. 32, it is typically in the segment AB. For integration of the differential equations, the initial conditions at point O (i.e., the values of the $u_1$ at $s=s_0$) are:

$$u_0 \equiv \begin{Bmatrix} u_{10} \\ u_{20} \\ u_{30} \\ u_{40} \end{Bmatrix} \equiv \begin{Bmatrix} \theta_0 \\ \frac{d\theta}{ds}\big|_0 \\ F_{x0} \\ F_{z0} \end{Bmatrix} = \begin{Bmatrix} 0 \\ 0 \\ F_{x0} \\ F_{z0} \end{Bmatrix} \quad (13)$$

On the right side of Equation (13), the first two components are zero because, by hypothesis, segment AO is completely flat.

Figure 34:
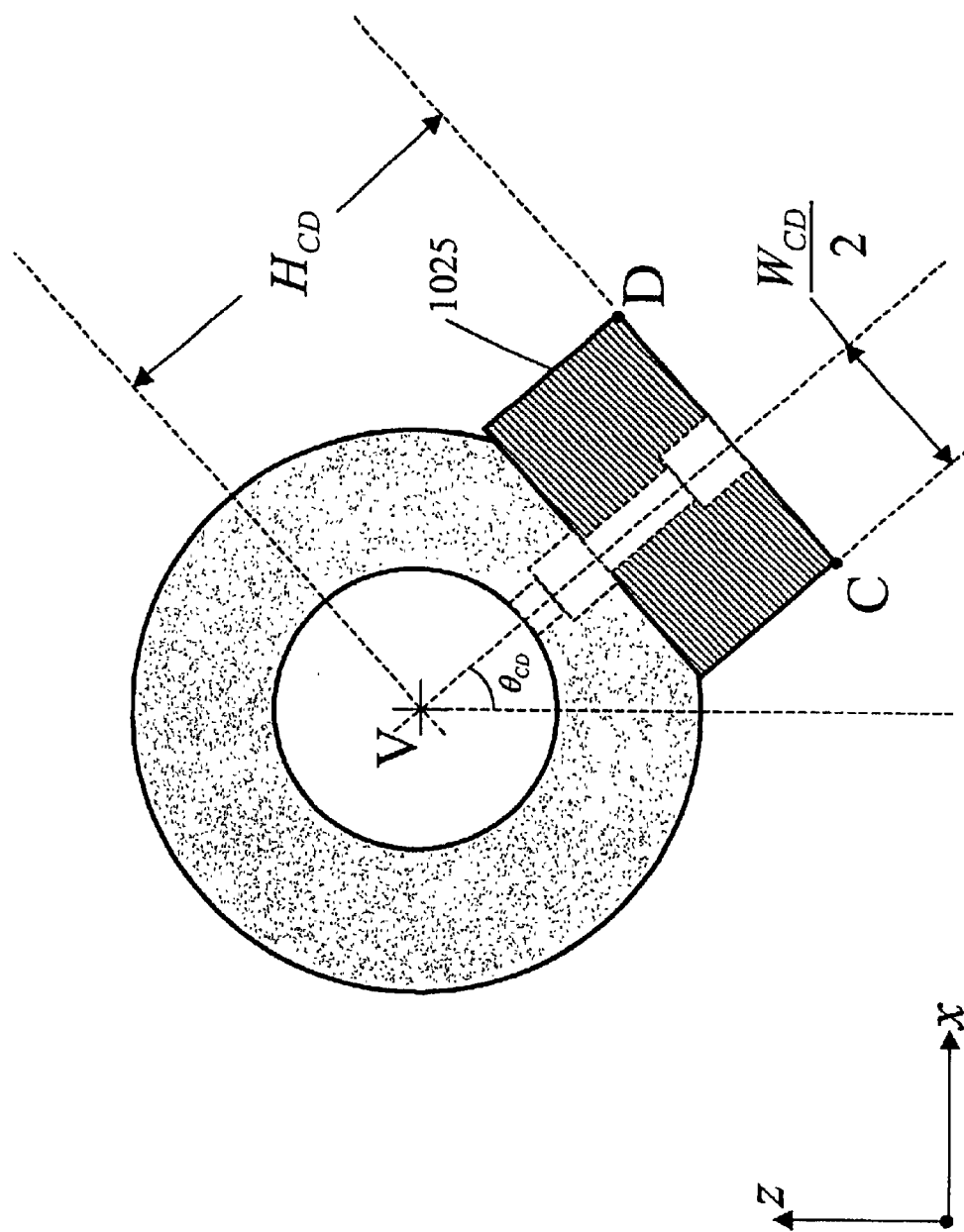
FIG. 34 is a close-up diagram of stamp segment CD.

Thus there are three unknown parameters, $s_0$, $F_{x0}$, and $F_{z0}$, that must be determined for each integration of the differential equations (11a) (i.e., for each configuration). To operate the printing machine 100, it is necessary, for each configuration, to determine values of these three parameters that satisfy the following three conditions:

1. Stamp passes through point C. To guarantee that the stamp remains attached to the vacuum bar throughout the trajectory, each stamp configuration should pass through the point C (i.e., the trailing edge of the vacuum bar's wear layer 1025). As shown in FIG. 34, the coordinates ($x_C, z_C$) of point C are given in terms of the coordinates ($x_V, z_V$) of the vacuum-bar's center of rotation and the hardware-adjustable rotation angle $\theta_{CD}$ by $$x_C = x_A + x_{VA} + H_{CD}\sin\theta_{CD} - \frac{W_{CD}}{2}\cos\theta_{CD} \quad (14a)$$

$$z_C = z_V - H_{CD}\cos\theta_{CD} - \frac{W_{CD}}{2}\sin\theta_{CD} \quad (14b)$$

where, in Equation (14a), $x_V$ has been replaced by its equivalent $x_A + x_{VA}$, where $x_{VA}$ is the constant distance shown in FIG. 30.

To determine whether a candidate stamp shape $\theta(s)$ passes through point C, the stamp's curvilinear coordinates ($\theta, s$) must be converted to Cartesian coordinates (x,z) using the relations $dx = \cos\theta ds$ and $dz = \sin\theta ds$. First, $s_C$ is determined either approximately using Equation (12c) or more accurately as the value for which $$x_C = \int_0^{s_C} \cos\theta(s)ds. \quad (15a)$$

Once $s_C$ is determined, the curve $\theta(s)$ is deemed to pass through point C if, to some tolerance, $$z_C = \int_0^{s_C} \sin\theta(s)ds. \quad (15b)$$

The integrations in Equations (15a) and (15b) must be done numerically using, for example, the well-known trapezoidal rule, which is described in many standard texts such as *Numerical Recipes in C*, previously cited.

2. Stamp angle at point C equals $\theta_{CD}$. To guarantee that the stamp remains attached to the vacuum bar, the stamp's angle at point C, $\theta_C$, should equal the preset value $\theta_{CD}$ discussed above in connection with Equations (14). That is, $$\theta(s_C) = \theta_C = \theta_{CD} \quad (16)$$

where $s_C$ is determined either by Equation (14c) or more accurately by Equation (15a).

Figure 35:
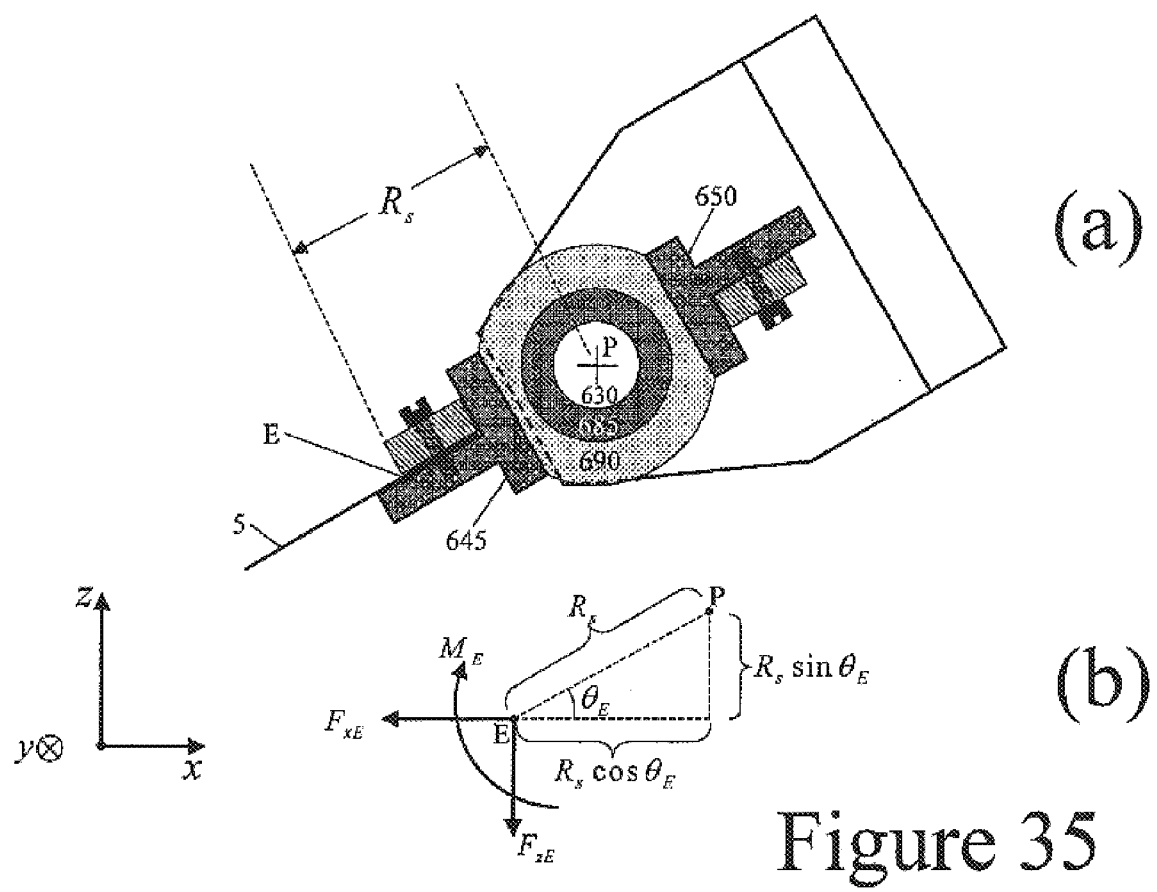
FIG. 35 is a close-up diagram illustrating the stamp's top-end boundary condition.

3. Stamp rotates freely at point E. The upper stamp clamp 130, discussed previously in connection with FIG. 17, imposes a free-rotation condition at point E. The appropriate mathematical condition is derived from FIG. 35. As illustrated in FIG. 35a, the ball-bushing assemblies 635 and 640 (e.g., ball bushing 685 and ball-bushing housing 690), as well as T-bars 645 and 650, rotate freely about axis P of shaft 630, like a paddle wheel with two paddles. Because the stamp 5 exerts forces-per-unit-y-length $F_{xE}$, $F_{zE}$, and bending-moment-per-unit-y-length $M_E$ upon this assembly, the condition for free rotation demands that the sum of the moments exerted by these loads about axis P must be zero. That is, by inspection of FIG. 35b, which is a mathematical representation of the situation:

$$M_E + F_{xE}R_s \sin\theta_E - F_{zE}R_s \cos\theta_E = 0. \quad (17a)$$

Substituting Equation (8) for bending-moment-per-unit-length $M_E$ yields $$EI\frac{d\theta}{ds}\bigg|_E + F_{xE}R_s\sin\theta_E - F_{zE}R_s\cos\theta_E = 0 \quad (17b)$$

which is a relationship between the stamp's angle and its curvature at point E.

To summarize, the three conditions (15b), (16), and (17b) are used to determine the three unknown parameters $s_0$, $F_{x0}$, and $F_{z0}$. This determination can only be made by numerical iteration. To describe this process, let $\beta$ be the vector of the three unknown parameters, $$\beta = \begin{Bmatrix} s_0 \\ F_{x0} \\ F_{z0} \end{Bmatrix}, \quad (18)$$

and let the three conditions (15b), (16), and (17) be expressed as the vector condition $$T = 0, \quad (19)$$

where T is defined as $$T(\beta) \equiv \begin{Bmatrix} z_C - \int_0^{s_C} \sin\theta ds \\ \theta_C - \theta_{CD} \\ EI\frac{d\theta}{ds}\bigg|_E + F_{xE}R_s\sin\theta_E - F_{zE}R_s\cos\theta_E \end{Bmatrix}. \quad (20)$$

As indicated in Equation (20), T is a function of $\beta$ because the solution $\theta(s)$ to the differential Equations (11a), and hence $\theta_C$, $\theta_E$, and $$\frac{d\theta}{ds}\bigg|_E,$$

depend on the components of $\beta$.

To determine the correct value of $\beta$—that is, the values of $s_0$, $F_{x0}$, and $F_{z0}$ that will yield a viable configuration—an initial guess, $\beta^{(0)}$, is made, the differential Equations (11a) are integrated, and the resulting value of T in Equation (20) is evaluated. In general, the initial guess $\beta^{(0)}$ will not produce the desired result T=0, but the correct value of $\beta$ may be found from the initial guess (provided the initial guess is close enough to the correct value) by means of the well-known root-finding method known as Newton-Raphson. This entire scenario—seeking a solution satisfying given conditions (that can not be evaluated a priori) by guessing initial parameters, integrating, evaluating the conditions, and then iterating using the Newton-Raphson method—is a technique called the "shooting method", which is well known in the art of numerical solutions for differential equations. The shooting method, as well as the Newton-Raphson method which it employs, are described more fully, for example, in *Numerical Recipes in C*, previously cited.

In terms of the notation introduced above, the Newton-Raphson iteration step that produces the new approximation for $\beta$, $\beta^{(n+1)}$, from the existing one $\beta^{(n)}$, is $$\beta^{(n+1)} = \beta^{(n)} - \left[\frac{\partial T}{\partial \beta}\right]_{\beta=\beta^{(n)}}^{-1} T(\beta^{(n)}), \quad (21a)$$

and the iteration is assumed to have converged when two consecutive iterates are sufficiently close to each other; that is, when $$\frac{\|\beta^{(n+1)} - \beta^{(n)}\|}{\|\beta^{(n)}\|} < \varepsilon_C \quad (21b)$$

for some small number $\varepsilon_C$. In Equation (21a), $$\left[\frac{\partial T}{\partial \beta}\right]^{-1}_{\beta=\beta^{(n)}}$$

is the inverse of the Jacobian matrix of partial derivatives $$\frac{\partial T_i}{\partial \beta_j}$$

evaluated at $\beta=\beta^{(n)}$. These partial derivatives must be approximated numerically by finite differences:

$$\frac{\partial T_i}{\partial \beta_j} = \frac{T_i(\beta_j + \varepsilon) - T_i(\beta_j)}{\varepsilon_D}, \quad i, j = 1,2,3 \quad (22)$$

where $\varepsilon_D$ is some small number. The above procedure—applying the shooting method to find $\beta$ that satisfies the conditions T=0—specifies a "viable stamp configuration" in the sense described previously in connection with FIG. 30. Thus, the correct shape of the stamp, $\theta(s)$, is determined for one particular position of the carriage 125; that is, for one particular value of $s_A = x_A$. As stated above, the objective of the mathematical analysis above is to specify, for each given value of $x_A$, the required location $(x_P, z_P)$ of pivot P to produce a viable configuration. The sought-after Cartesian coordinates $(x_P, z_P)$ may be determined from the stamp shape $\theta(s)$, using $dx = \cos\theta ds$ and $dz = \sin\theta ds$, as follows:

$$x_E = \int_0^L \cos\theta(s)ds \quad (23a)$$

$$z_E = \int_0^L \sin\theta(s)ds \quad (24b)$$

$$x_P = x_E + R_s \cos\theta_E \quad (23c)$$

$$z_P = z_E + R_s \sin\theta_E, \quad (23d)$$

where L is the total length of the stamp (from point Q to point E), and where Equations (23c) and (23d) make use of the geometry drawn in FIG. 35b. The integrations in Equations (23a) and (23b) are performed using the well-known trapezoidal rule, previously cited in connection with Equations (15).

To generate a printing trajectory, the above mathematical solution must be developed numerous times, once for each configuration, where a configuration is characterized by its value of $x_A$ (the position of the flat-iron 270). The array of configurations comprising a printing trajectory has the property that $x_A$ increases monotonically throughout the array. Let this array of $x_A$ values be denoted $\{x_{A1}, x_{A2}, x_{A3}, \ldots, x_{AN}\}$. Once the first viable configuration has been found, for the first value $x_{A1}$, the associated value of $\beta$—upon which the Newton-Raphson method converged—is used as the initial guess for the next configuration $x_{A2}$. As long as $x_{A2} - x_{A1}$ is not too large, this strategy guarantees that the Newton-Raphson method will easily converge for the $x_{A2}$ configuration. The same strategy is continued throughout the array: the value of $\beta$ found for configuration $x_{Ai}$ is used as the initial guess for configuration $x_{A,i+1}$, where $i=1, \ldots N-1$.

2.7.3 Software: Simplification of the Mathematical Solution

Experience with the prototype of the invention has shown that the goal of the mathematical analysis above—providing a printing trajectory in which the stamp 5 remains attached to the vacuum-bar's wear layer 1025 throughout the trajectory—can be achieved by a simpler embodiment of the mathematical solution above. Three simplifying assumptions are made:

1. Known location of point O. First, assume that the contact point O is coincident with B (i.e., all of the air-bearing segment AB is flat). Then $$s_O = s_B. \quad (24)$$

Integration of the differential equations can thus proceed from a known starting point, point B.

2. Known conditions at point B. Further assume that the vertical component of stamp force at B is zero, and that the curvature of the stamp at B may be specified a priori to be a known value $\kappa_B$. That is, $$F_{zB} = 0 \quad (25)$$

and $$\left.\frac{d\theta}{ds}\right|_B = \kappa_B (\kappa_B \text{ specified, hence known}) \quad (26)$$

3. Stamp segment CD lies flat on vacuum bar. Finally, assume that over the vacuum-bar segment CD, the stamp is not curved, but rather lies flat on the surface of the vacuum-bar's wear layer 1025; that is, $$\theta(s) = \theta_{CD} = \text{constant}, \quad s_C \leq s \leq s_D. \quad (27)$$

The first two simplifying assumptions above, embodied in Equations (24) through (26), are the most essential ones. They imply that the initial conditions for integrating the differential equations (11b) are, in place of Equation (13), $$u_B \equiv \begin{Bmatrix} u_{1B} \\ u_{2B} \\ u_{3B} \\ u_{4B} \end{Bmatrix} \equiv \begin{Bmatrix} \theta_B \\ \left.\frac{d\theta}{ds}\right|_B \\ F_{xB} \\ F_{zB} \end{Bmatrix} = \begin{Bmatrix} 0 \\ \kappa_B \\ F_{xB} \\ 0 \end{Bmatrix}. \quad (28)$$

That is, because $\kappa_B$ is known, there is now only one unknown initial parameter, $F_{xB}$, instead of three as there were in Equation (13). Thus we may impose only one of the three conditions (15b), (16), and (17). We choose to impose (17b), a natural boundary condition that is essential. The rest of the analysis proceeds as described previously, excepting that the three-component vectors $\beta$ and T, previously defined by Equations (18) and (20), here reduce to scalars $\beta$ and T:

$$\beta = F_{xB} \quad (29a)$$

$$T(\beta) \equiv EI\left.\frac{d\theta}{ds}\right|_E + F_{xE}R_S \sin\theta_E - F_{zE}R_S \cos\theta_E = 0, \quad (29b)$$

and the Newton-Raphson iteration (21) reduces to a simple, scalar Newton iteration:

$$\beta^{(n+1)} = \beta^{(n)} - \left(\frac{dT}{d\beta}\right)^{-1}_{\beta=\beta^{(n)}} T(\beta^{(n)}). \quad (30)$$

Figure 36:
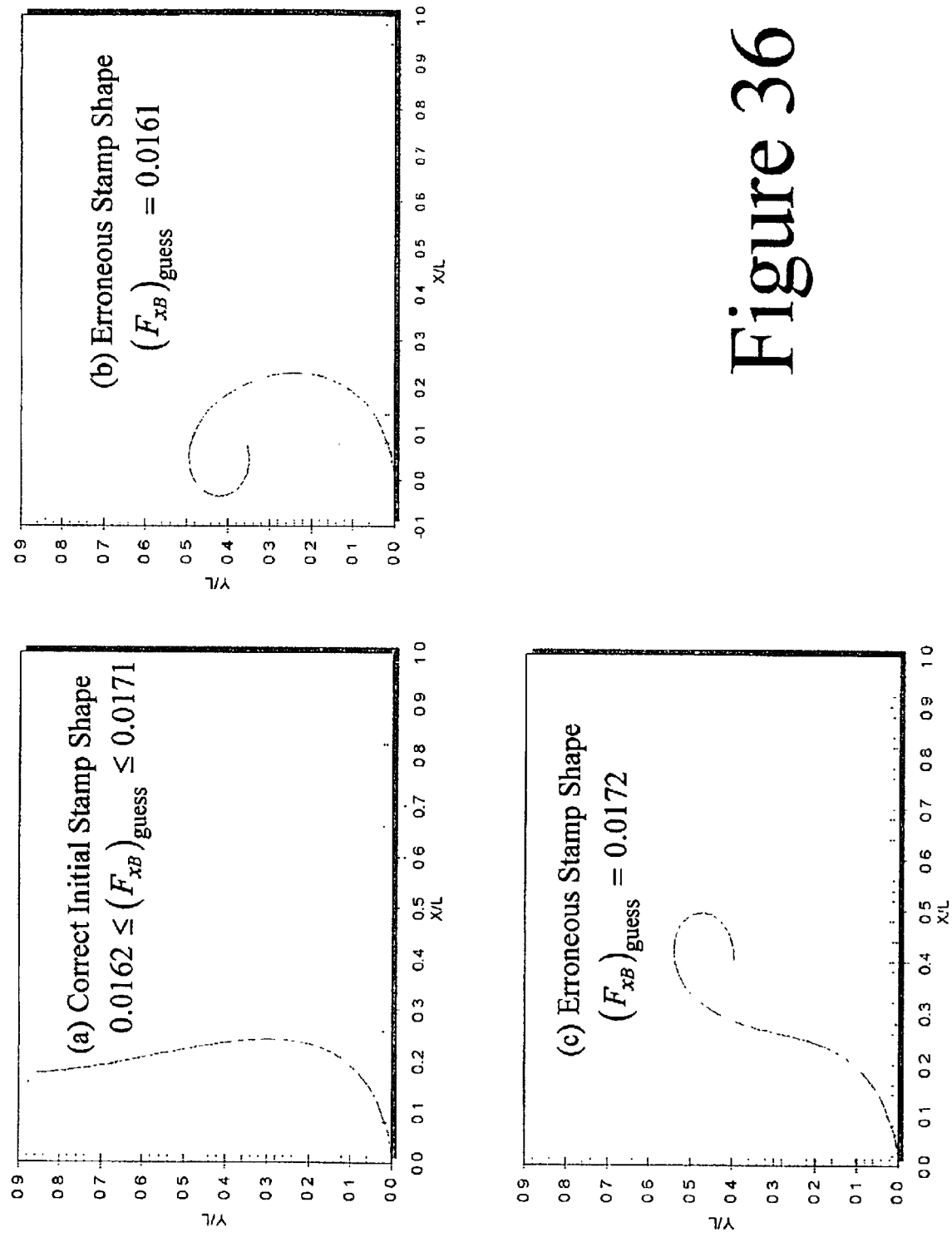
FIG. 36 shows various mathematically generated solutions for the shape of a stamp.

Thus the advantage of the first two simplifying assumptions above, embodied in Equations (24) through (26), is that the guesswork involved in initiating the Newton iteration, as well as the subsequent calculation, is minimized. Nevertheless, as is typical with finding the roots of nonlinear equations, if the initial guess for $F_{xB}$ is too far away from the solution, the Newton iteration will not converge, or worse, will converge to a bizarre stamp shape θ(s) that is physically impossible. Examples of such bizarre shapes are shown in FIG. 36. Blindly commanding the servomotors 170, 190, and 210 to execute a trajectory composed of such bizarre stamp shapes is extremely unwise. Therefore, in the preferred embodiment, the various stamp shapes θ(s) in a trajectory are first plotted graphically, thereby simulating the trajectory visually before executing it in hardware.

The third simplifying assumption above, embodied in Equation (27), allows the differential equations (11a) to be integrated analytically in the vacuum bar segment CD. The scalar form of these equations is Equations (7). Integrating the latter:

$$F_{xD} - F_{xC} = -\int_{s_C}^{s_D} p_{CD}(s)\sin\theta(s)ds - \int_{s_C}^{s_D} f_{CD}(s)\cos\theta(s)ds \quad (31a)$$

$$F_{zD} - F_{zC} = w(s_D - s_C) + \int_{s_C}^{s_D} p_{CD}(s)\cos\theta(s)ds - \quad (31b)$$
$$\int_{s_C}^{s_D} f_{CD}(s)\sin\theta(s)ds$$

$$M_D - M_C = -\int_{s_C}^{s_D} F_z(s)\cos\theta(s)ds + \int_{s_C}^{s_D} F_x(s)\sin\theta(s)ds \quad (31c)$$

By virtue of assumption (27), the stamp angle θ between points C and D is a constant, $\theta_{CD}$, and $s_D - s_C = W_{CD}$. Thus Equations (31) become $$F_{xD} - F_{xC} = -\sin\theta_{CD}\int_{s_C}^{s_D} p_{CD}(s)ds - \cos\theta_{CD}\int_{s_C}^{s_D} f_{CD}(s)ds \quad (32a)$$

$$F_{zD} - F_{zC} = wW_{CD} + \cos\theta_{CD}\int_{s_C}^{s_D} p_{CD}(s)ds - \quad (32b)$$
$$\sin\theta_{CD}\int_{s_C}^{s_D} f_{CD}(s)ds$$

$$M_D - M_C = -\cos\theta_{CD}\int_{s_C}^{s_D} F_z(s)ds + \sin\theta_{CD}\int_{s_C}^{s_D} F_x(s)ds \quad (32c)$$

In connection with Equations (5), the positive and negative normal forces due to pressure $p_{CD}(s)$ were assumed to balance each other, implying $$\int_{s_C}^{s_D} p_{CD}(s)ds = 0. \quad (33a)$$

Further, with the help of Equations (5b) and (5c), $$\int_{s_C}^{s_D} f_{CD}(s)ds = \mu p_{react}(W_{CD} - W_{C_1D_1}) = \mu W_{C_1D_1}p_{vac}. \quad (33b)$$

Thus, Equations (32a) and (32b) reduce to $$F_{xD} - F_{xC} = -\mu W_{C_1D_1}p_{vac}\cos\theta_{CD} \quad (34a)$$

$$F_{zD} - F_{zC} = -\mu W_{C_1D_1}p_{vac}\sin\theta_{CD} + wW_{CD} \quad (34b)$$

Moreover, because segment CD is fairly short, the integrals in (32c) may be approximated by the trapezoidal rule, using only the values of $F_x(s)$ and $F_z(s)$ at the endpoints C and D. Using the moment-curvature relation (8), Equation (32c) reduces to $$\left.\frac{d\theta}{ds}\right|_D - \left.\frac{d\theta}{ds}\right|_C = \frac{W_{CD}}{2EI}\{(F_{xD} + F_{xC})\sin\theta_{CD} - (F_{zD} + F_{zC})\cos\theta_{CD}\}, \quad (34c)$$

which is a statement of how the stamp's curvature at D relates to that at C. We also recall Equation (27), which implies $$\theta_D = \theta_C = \theta_{CD}. \quad (34d)$$

By virtue of Equations (34), all four components of u, defined in Equation (10) as θ, $$\frac{d\theta}{ds},$$

$F_x$, and $F_z$, are known at point D as soon as they are known at C. Therefore, no integration of the differential equations (11a) is required in segment CD; rather, the difference conditions (34) are applied.

An additional advantage of the simplifications above is that only two stamp segments, BC and DE, remain over which the differential equations (11a) must be numerically integrated. Because p=f=0 for both these segments, the third and fourth components of Equations (11a) may be written $$\frac{du_3}{ds} = \frac{dF_x}{ds} = 0 \quad (35a)$$

$$\frac{du_4}{ds} = \frac{dF_z}{ds} = w \quad (35b)$$

whence $$u_3 = F_x = \text{constant} = F_{xB} \quad (36a)$$

$$u_4 = F_z = w(s - s_B) \quad (36b)$$

where Equation (36b) uses the simplifying assumption (25). Thus Equations (10) and (11b) may be replaced by the simpler equations $$u \equiv \begin{Bmatrix} u_1 \\ u_2 \end{Bmatrix} = \begin{Bmatrix} \theta \\ \frac{d\theta}{ds} \end{Bmatrix} \quad (37a)$$

and $$F(u) \equiv \begin{Bmatrix} u_2 \\ \frac{F_{xB}}{EI}\sin u_1 - \frac{w(s - s_B)}{EI}\cos u_1 \end{Bmatrix}. \quad (37b)$$

That is, the dimensionality of the system of differential equations (11a) has been reduced from four to two, thereby eliminating unnecessary calculations.

Of course, the simplifications (24) through (27) above are approximations, and reality differs from the assumptions. First, for a prototype of the invention, the stamp under segment AB is seen to violate slightly the simplifying assumption, stated in Equation (24), that segment AB is entirely flat. That is, in reality the stamp's stiffness often raises point B slightly off the surface of the receiver 25, and the contact front is actually somewhere in the segment AB, as assumed by the unsimplified, full theory (see FIG. 33). Moreover, because the simplified theory does not impose the conditions (15b) and (16), there is no guarantee that the various stamp configurations throughout the trajectory will accommodate the fixed geometrical relationship between points B, C, and D. In other words, there is no guarantee that the stamp will remain attached to the vacuum bar, because the stamp's stiffness may break the vacuum seal if the stamp's shape θ(s) is too far wrong. However, because the simplified solution does insist, via Equation (26), that the theoretical curvature of the stamp at B, $\kappa_B$, remains constant throughout the trajectory, the shape of the stamp near B tends to remain constant from one configuration to another. Experience has shown that, because C is relatively near B for the prototype system, the simplified solution works—the stamp does remain attached to the vacuum bar throughout the printing trajectory, even though only a partial vacuum (e.g., $p_{vac}$=0.2 to 0.4 atmospheres) is used, and even though the vacuum bar is explicitly adjusted to "kiss" the stamp's shape only at the beginning of the trajectory.

The "kissing" adjustment proceeds as follows. After a printing trajectory is calculated for the first time using the simplified solution given in Equations (24)–(26), the stamp 5 and the carriage 125 are moved to their calculated starting positions with the vacuum-bar's micrometer heads 915 and 920 initially adjusted all the way up, to insure that the vacuum bar does not initially hit the stamp. Then the height $z_C$ and the angle $\theta_{CD}$ of the vacuum bar are adjusted so that, at the starting position, the vacuum bar is tangent to the natural curve of the stamp. The height $z_C$ is adjusted via the micrometer heads 915 and 920; in the prototype, $\theta_{CD}$ is adjusted by loosening the nylon-tipped set screws 1000 and 1005, rotating the vacuum bar manually until its lower surface is tangent to the stamp, and then re-tightening the set screws. Once this is done, these adjustments never have to be altered unless a new trajectory is computed—whenever the vacuum-bar's vacuum suction is turned on at the beginning of the print cycle, the suction naturally "grabs" the stamp as desired. Thus printing and peeling can be done time after time, as they would be in a manufacturing environment.

A typical set of parameters used in the prototype was as follows:

$E = 147 \times 10^9 \ N/m^2$ $I = 2.8125 \times 10^{-13} \ m^3$ $w = 19.55 \ N/m^2$ $\kappa_B = 8.333 \ m^{-1}$ $s_C - s_B = 0.048 \ m$ $s_E - s_B = 0.605 \ m$ (at start of print process)

$W_{CD} = 0.016 \ m$ (38a)

$W_{C_1 D_1} = 0.00159 \ m$ $\mu = 0.10$ $p_{vac} = 20{,}000 \ N/m^2$ $R_s = 0.037 \ m$ $\epsilon_C = 0.001$ $\epsilon_D = 0.0001$ (38a)

For this set of parameters, the associated solution $F_{xB}$ upon which the Newton iteration (30) converges is $F_{xB} = 1.67 \ N/m.$ (38b)

Thus at the beginning of the trajectory, the stamp near the contact line B is under slight tension (i.e., $F_{xB}$ is positive). Further computation shows that this tension at B gradually reduces as the printing process proceeds (i.e., as B moves rightward), becoming, for example, $F_{xB} = 1.27 \ N/m$ when 57 percent the stamp is flattened. These levels of tension have negligible effect on the raised pattern 15 of the stamp's polymer layer 35. For example, the thickness h of the stamp implied by the conditions given in Equation (38a) is h=$\sqrt[3]{12I}$=150×10$^{-6}$ m, so the associated tensile strain $\epsilon$ for the level of tension in Equation (38b) is $\epsilon = F_{xB}/hE = 0.076 \times 10^{-6}$ (i.e., 76 parts per billion), which is truly negligible.

The computed stamp shape associated with the solution associated with Equations (38) is plotted in FIG. 36a. For Newton's method to converge on this desired (i.e., physically realizable) answer, the initial guess for $F_{xB}$, denoted $(F_{xB})_{guess}$ must be in the range $0.0162 \leq (F_{xB})_{guess} \leq 0.0171$ (39)

Figure 37:
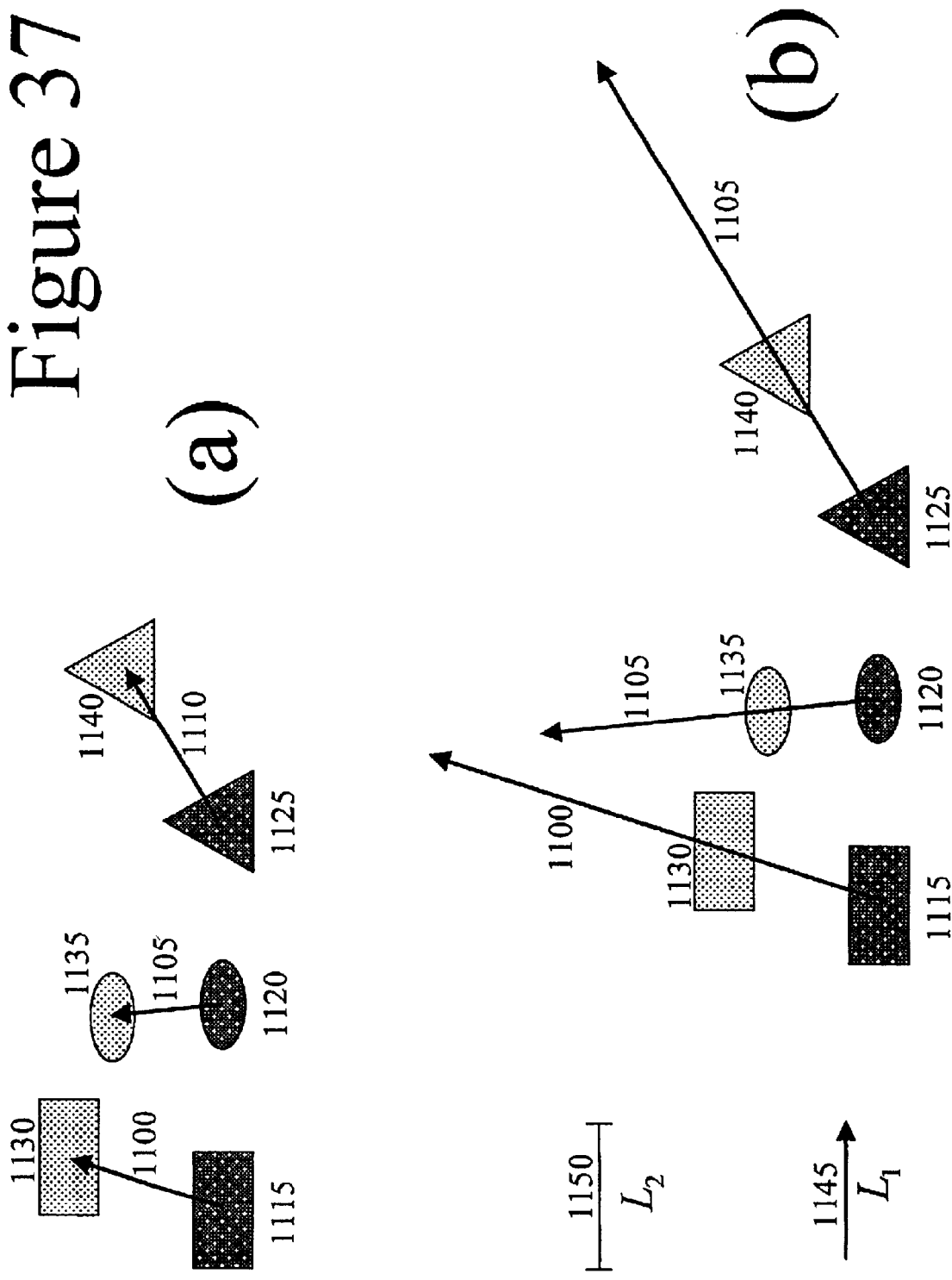
FIG. 37 is a schematic diagram explaining the graphical methodology used in FIGS. 38 through 42.
Figure 38:
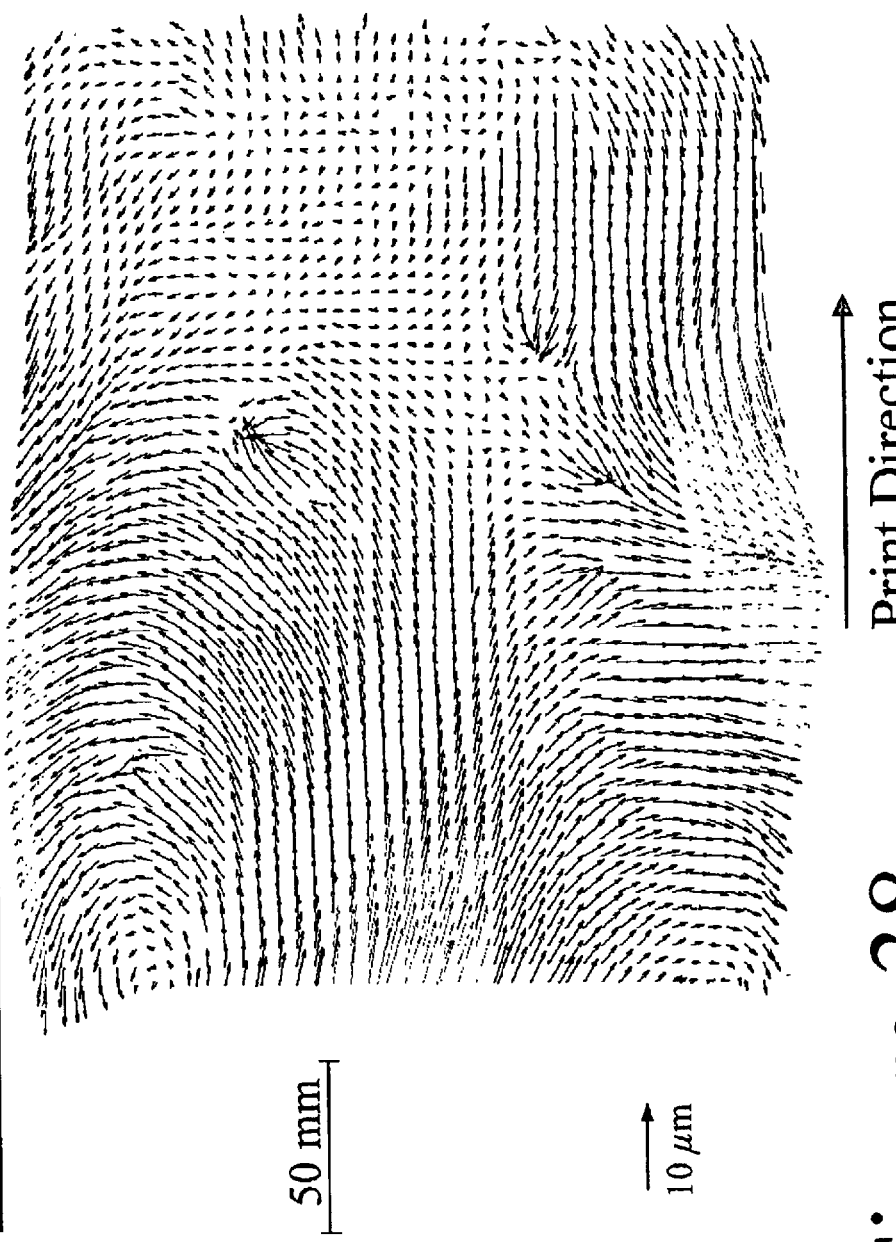
FIGS. 38 through 45 are various measurements of feature placement errors obtained with a prototype of the invention.
Figure 39:
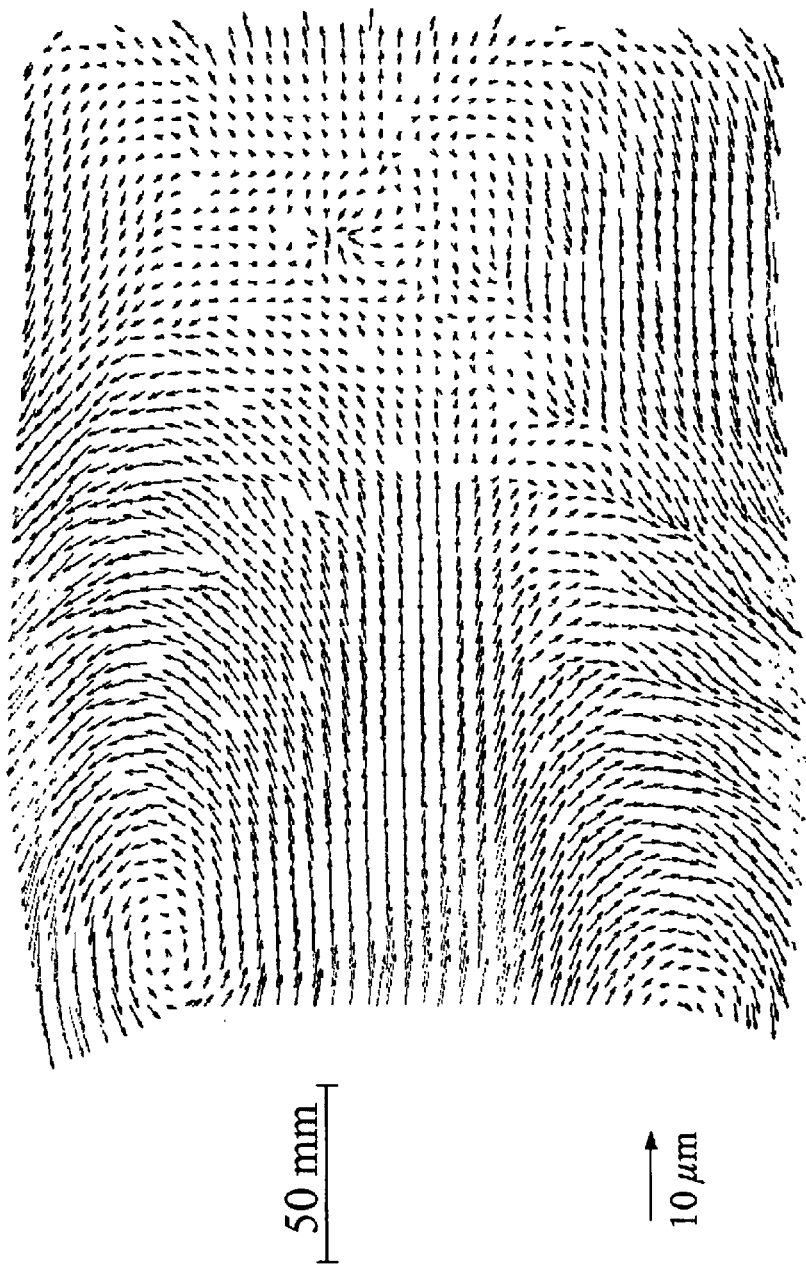
Figure 40:
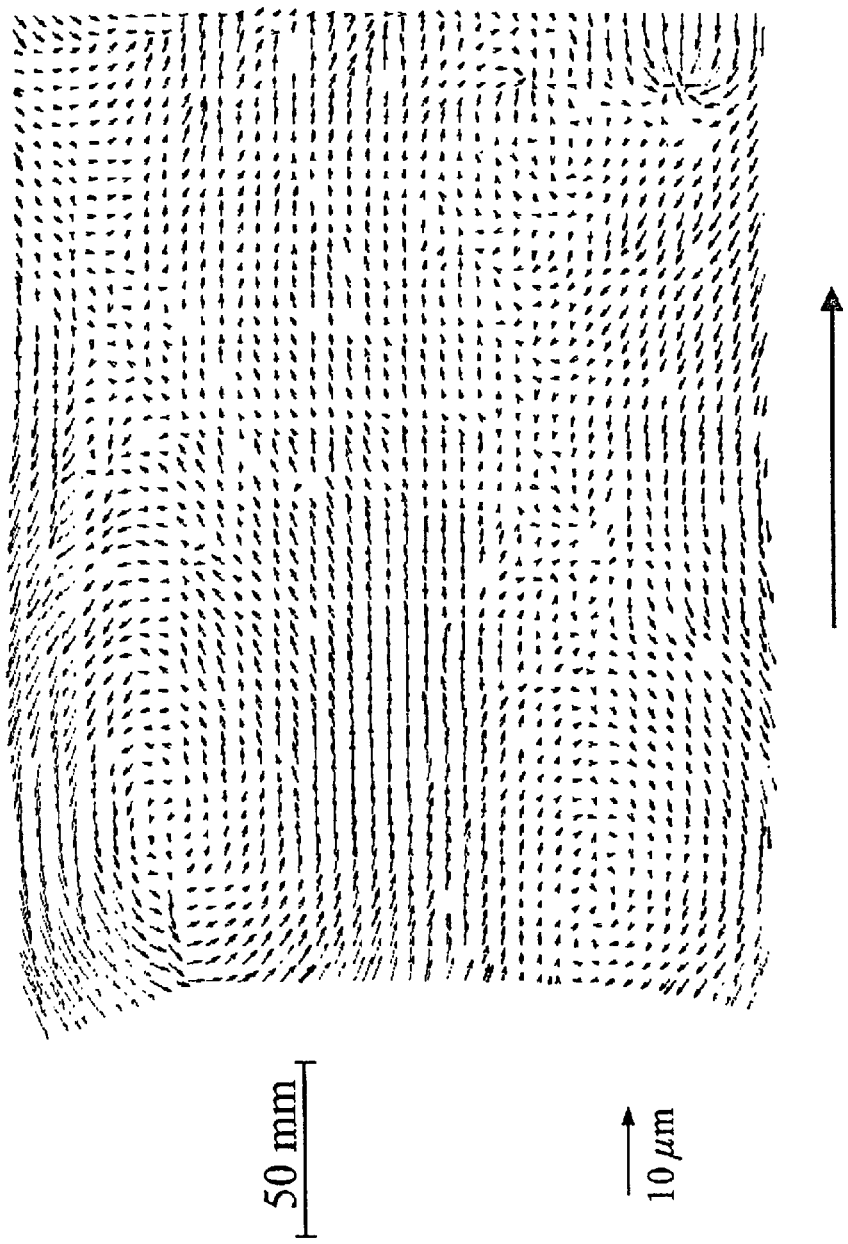

Otherwise, undesired solutions will be converged upon instead. For example, FIGS. 37b and 37c show the undesired solutions converged upon when $(F_{xB})_{guess} = 0.0161$ and $(F_{xB})_{guess} = 0.0172$ respectively, these values of $(F_{xB})_{guess}$ being just outside the narrow range given in Equation (39b). Thus, finding a desirable solution for $F_{xB}$ the first time can be tedious—which is why Equations (38) and (39) are given herein. However, once a desirable solution is found for some set of parameters, other solutions (for other sets of parameters) may be found by perturbation, wherein one of the parameters is perturbed, and $(F_{xB})_{guess}$ is taken to be the known solution $F_{xB}$ for the unperturbed set of parameters. This very process is used in developing a print trajectory, wherein the only parameter that changes from configuration to configuration is the stamp length $s_{E-sB}$ ahead of the flat-iron 270.

3. Results: Printed Accuracy

One of the objectives of the printing machine 100 is to obtain the greatest possible printing accuracy. Results shown below demonstrate the level of accuracy that has been achieved with a prototype of this invention. For reasons discussed below, it is anticipated that even greater accuracy is possible by using superior raw materials for the stamp's back-plane layer 40.

Perfect accuracy would be attained if the location of each printed feature on the receiver 25 were identical to that of the corresponding feature on a reference substrate. This reference substrate may be the stamp 5; alternatively, it may be the "master" from which the stamp is made. In reality, feature locations on the receiver 25 differ slightly, in both the x and y directions, from those on the reference substrate. Experimentally, these feature-placement errors may be measured using a high-precision, coordinate measuring machine such as a Nikon-3i, which is well known in the art of semiconductor lithography. Results of such measurements may be presented as an array of arrows, such as arrows 1100, 1105, and 1110 on FIG. 37a, that compare various feature locations on a printed receiver to their counterparts on the reference substrate. Such plots, well known in the art of semiconductor lithography, are described, for example, in J. D. Armitage Jr. and J. P. Kirk, *Proc. SPIE*, 921 (1988). The arrows' tails show the locations of features (such as 1115, 1120, and 1125) on the reference substrate. If drawn to scale as in FIG. 37a, the arrows' heads show the location of the corresponding features (such as 1130, 1135, and 1140) on the printed receiver. Thus the magnitude and direction of the arrows represent feature-placement error. In practice, however, the errors are so small compared to the size of the array that, in order to see the arrows graphically, it is necessary to exaggerate their size greatly, as suggested in FIG. 37b. In such a plot, the arrows only give the direction of the feature-placement error; the magnitude is given by comparison to a reference arrow 1145, which is annotated by the length $L_1$ that the reference arrow represents. In contrast, the actual scale of the substrate is given by the reference scale 1150, which is delimited by two tick marks and annotated with the dimension $L_2$ between the ticks.

If the stamp itself is used as the reference substrate, then measured errors are attributable solely to the printing process. However, if the reference substrate is the "master" from which the stamp is made, then measured errors are attributable to both the stamp-making process and the printing process together. In all of the results below, the latter technique was used, because the stamp was too large to measure in the Nikon-3i machine. Thus, stamp-making and printing errors are inextricably combined in the results below.

The prototype of the invention has been used to make a number of prototype prints of size 381×381 mm. In these prototypical prints, the receiver 25 is a piece of glass sputter-coated with a thin film of titanium/gold, the ink 20 is hexadecanethiol, and the stamp's polymer layer 35 is polydimethylsiloxane (PDMS). This combination of materials for receiver, ink and polymer layer is well-known in the art, of the type having been pioneered by Kumar and Whitesides, previously cited. The prototype stamps' polymer layer 35 is 750 µm thick; the back-plane layer 40, made of Invar 36, is 150 µm thick.

For each prototypical print, error measurements such as those described above have been made over an array of approximately 2200 features regularly distributed over a 271-by-203-mm rectangle that is centered on the print. The results of such measurements on eight such prints, made from two different stamps designated A and B, are shown as FIGS. 39 through 46. Occasionally there are missing data points (i.e., missing arrows) on these plots. This missing data has no significance except that the Nikon-3i could not optically interpret the features there. The data is summarized by statistics given in Table 1. For each of the prototypical prints listed, the print velocity v, defined above in connection with FIG. 24a, was 10 mm/s. However, other prints having v=40 mm/s were made and measured. At this higher print speed, the placement accuracy for a given stamp and print direction is nearly identical to that shown in Table 1.

TABLE 1

Measured Accuracy of Printing with a Prototype of the Invention

| Stamp | Print Table | Vacuum Bar? | FIG. No. | Receiver No. | Print Direction | Std. Deviations of Placement Error (µm) | |
|---|---|---|---|---|---|---|---|
| | | | | | | $\sigma_x$ | $\sigma_y$ |
| A | Al Ground | No | 38 | 1 | Forward | 2.58 | 2.07 |
| | | | 39 | 2 | Forward | 2.46 | 1.36 |
| | Al Granite | Yes | 40 | 3 | Forward | 1.61 | 0.65 |
| | | | 41 | 4 | Forward | 1.70 | 0.69 |
| | | | 42 | 5 | Reverse | 1.42 | 0.80 |
| B | Granite | Yes | 43 | 6 | Reverse | 0.99 | 0.93 |
| | | | 44 | 7 | Reverse | 1.08 | 0.97 |
| | | | 45 | 8 | Forward | 1.78 | 2.08 |

Column 2 of Table 1 specifies the type of print table used, thereby giving a qualitative assessment of its flatness, the importance of which has previously been discussed in connection with FIG. 9. The print table for receiver No. 1 was a piece of cast aluminum, commonly known as "jig plate". The improved, flatter print table used for receivers No. 2 and No. 3 was the same piece of aluminum after surface grinding. For receivers No. 4 through No. 8, a lapped granite print table, as described above for the preferred embodiment, was used to obtain the ultimate in flatness. Column 3 of Table 1 specifies whether or not the vacuum bar, described above in connection with FIGS. 26 through 30, was used during printing.

Figure 43:
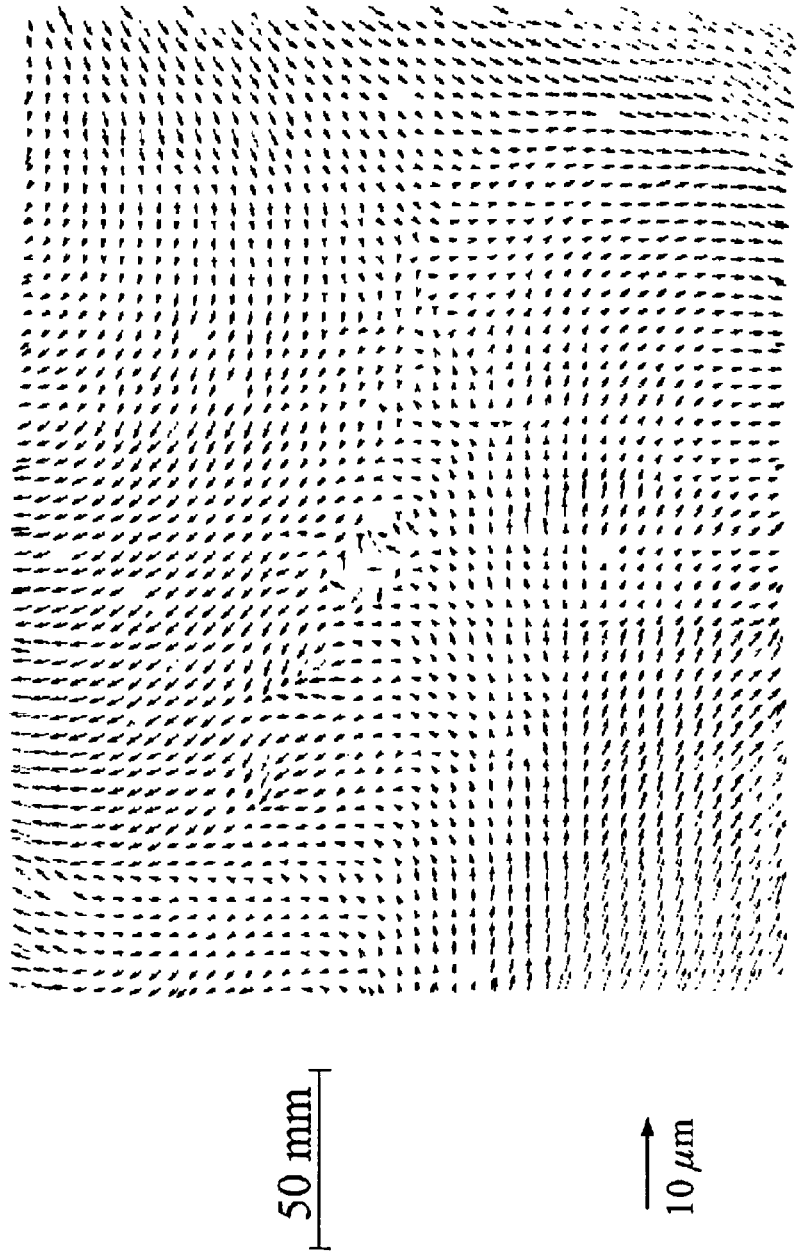

Column 6 of Table 1 specifies the "Print Direction", the meaning of which is explained by FIG. 43. As shown, let the two x-facing ends of the stamp 5 be denoted S and T respectively. Receivers 1, 2, 3, 4, and 8 in Table 1 were printed with their respective stamps mounted in the printing machine as shown in FIG. 43a—with the S end (at left in the drawing) mounted on the lower stamp clamp's vacuum plate 395, and the T end (at right in the drawing) mounted in the stamp carrier 680. This configuration is designated as the "forward" print direction. Receiver 5, 6, and 7 in Table 1 were printed with the stamps mounted in the reverse direction, as shown in FIG. 43b—with the T and S ends reversed. This reversal was possible because the stamps were made symmetrically left to right in the prototype, with appropriate mounting holes in both ends, and the appropriate extra length of back-plane (only required on the top end) on both ends. On FIGS. 39–46, the orientation of the printed pattern is presented as invariant from drawing to drawing, regardless of print direction. However, as shown on the figures, the direction of printing (motion of flat-iron 270 and vacuum bar 820) is left to right (forward) on FIGS. 39, 40, 41, 42 and 46, whereas it is right to left (reverse) on FIGS. 43, 44, and 45. Of course, in reality the motion and operation of the printing machine is always the same. It is only the stamp that is turned around.

Columns 7 and 8 of Table 1 give standard deviations of the placement-error measurements over the entire array of features. As is common in the art of such error measurements (see J. Kirk, previously cited), the rigid-body (x,y) displacements of the array as a whole, the rigid-body rotation of the array, and a uniform "magnification" error have all been statistically removed from the plots and from the standard deviations reported in Table 1, because these components of error, being easily compensated, are of little interest in practice. Inasmuch as the rigid-body components of error have been removed, the random variables whose standard deviations are reported in Table 1 have zero mean, such that "three sigma error bars" are simply ±3σ.

For the best print, receiver No. 6 (FIG. 43), these ±3σ error bars are slightly less than ±3 µm. To our knowledge, this is the most accurate, large-scale mechanical printing known in the art. Moreover, even greater accuracy should be attainable with improvements in stamp-making, as described below.

Furthermore, the error statistics quoted in Table 1 include a significant component of error called differential magnification (see J. Kirk, previously cited). If this component is removed for receiver No. 6, for example, the statistics are reduced to $\sigma_x=0.83$ μm and $\sigma_y=0.61$ μm. For some applications, the latter statistics are more relevant than those in Table 1. For example, when a pattern printed with the printing machine 100 is subsequently overlaid with another layer by means of standard step-and-repeat optical lithography, it has been found that the ±3σ overlay errors closely track the smaller numbers, such as those above, where the differential magnification error has been removed. The reason for this is that the optical stepper measures magnification anisotropy via three or more fiducials, and corrects for the differentiation magnification error by stepping anisotropically in the two directions. This correction works best if the stepper's shot size is small; worse if it is large. For the prototype prints (271×203 mm), the differential magnification error was found to be virtually eliminated from the overlay error when the optical stepper has a shot size of 32×32 mm.

Figure 41:
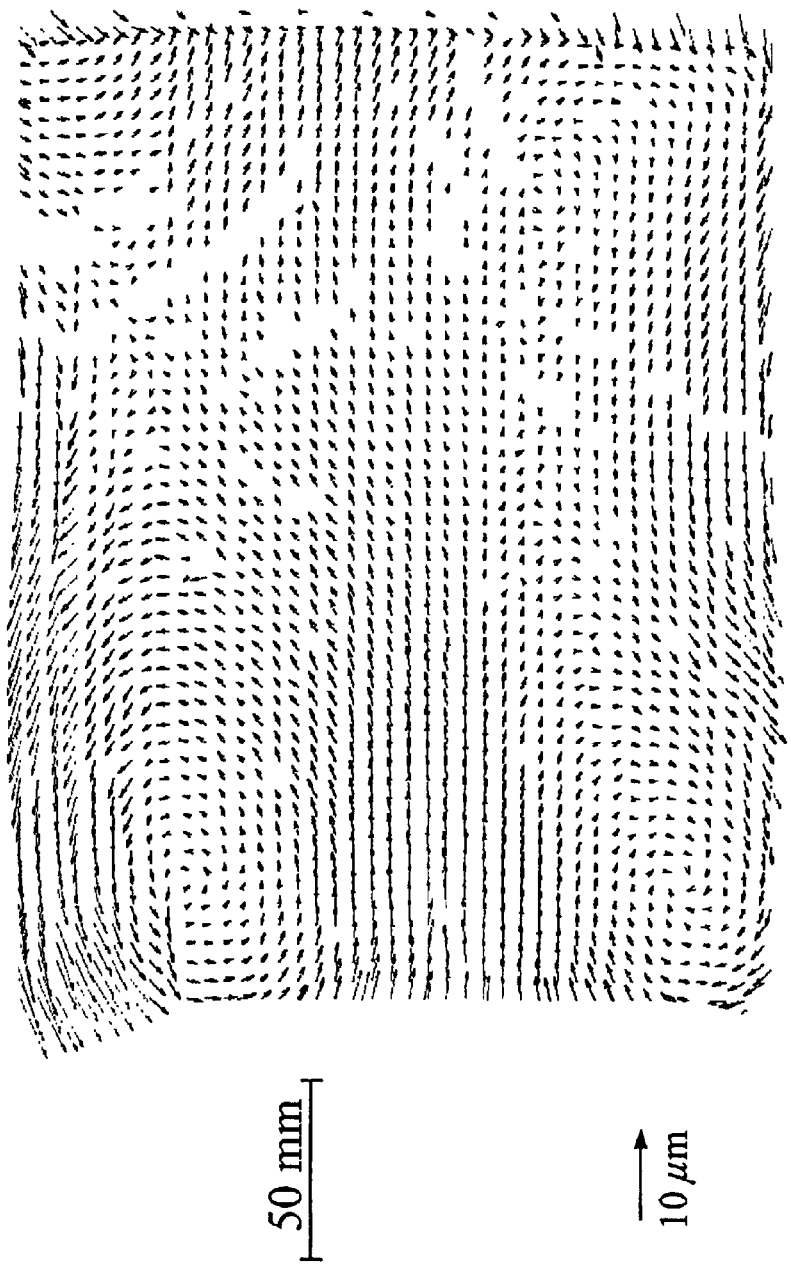
Figure 42:
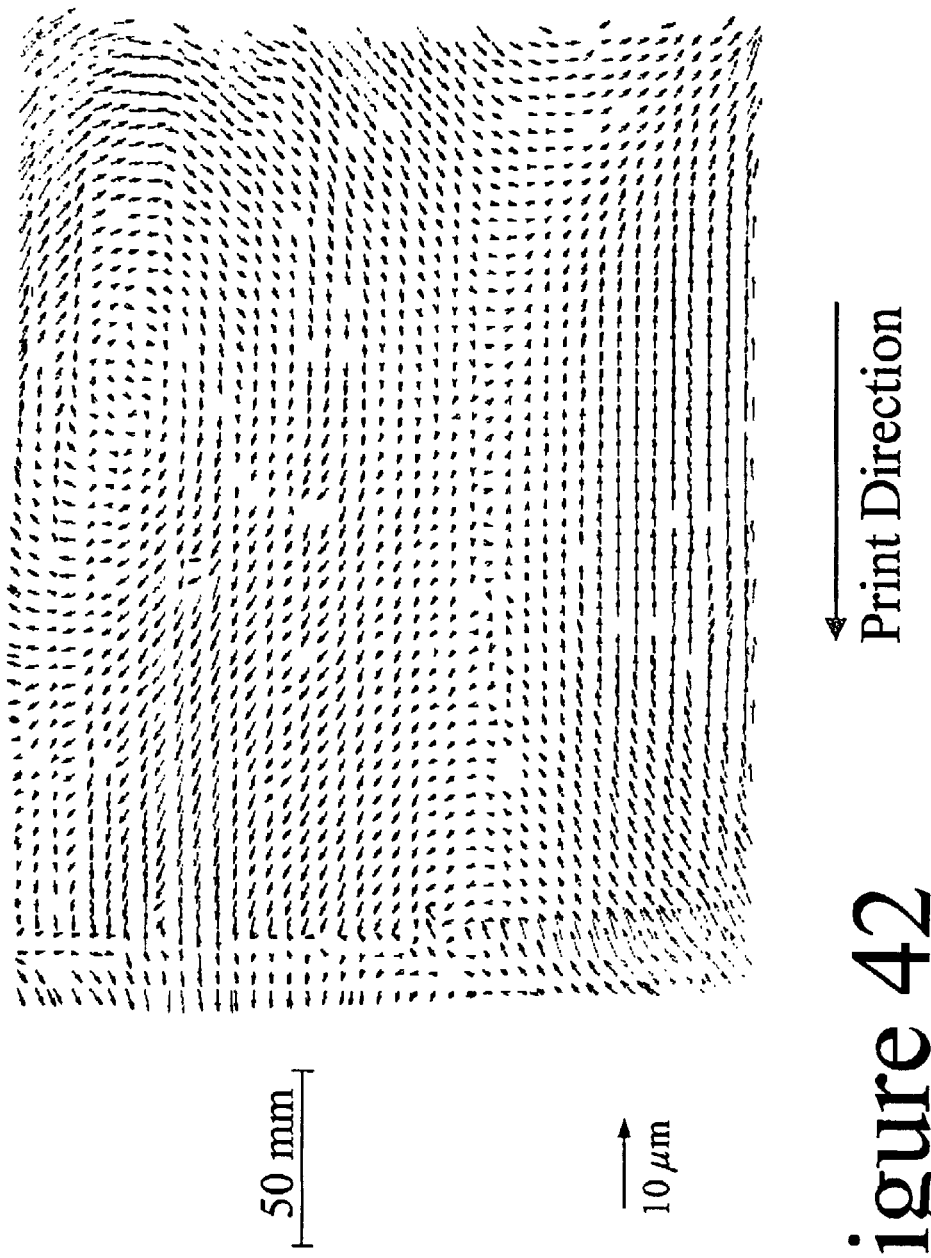
Figure 44:
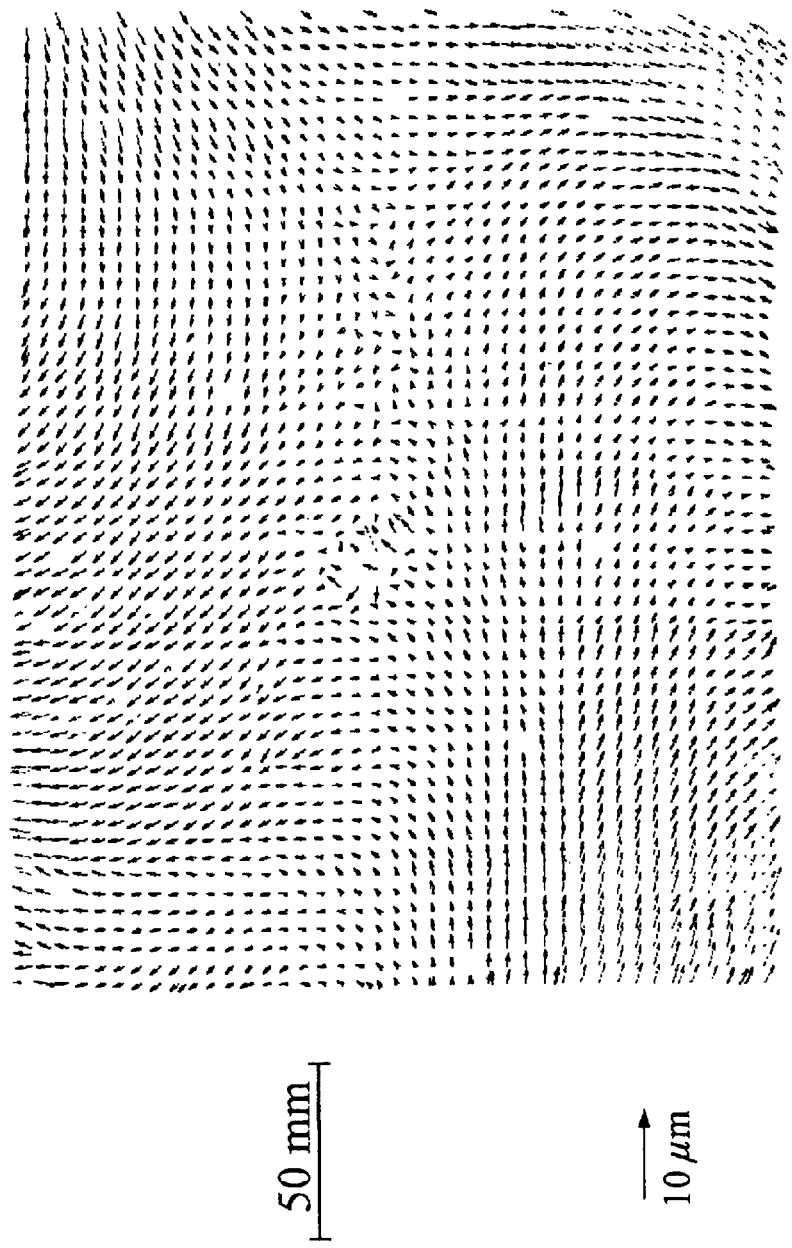
Figure 45:
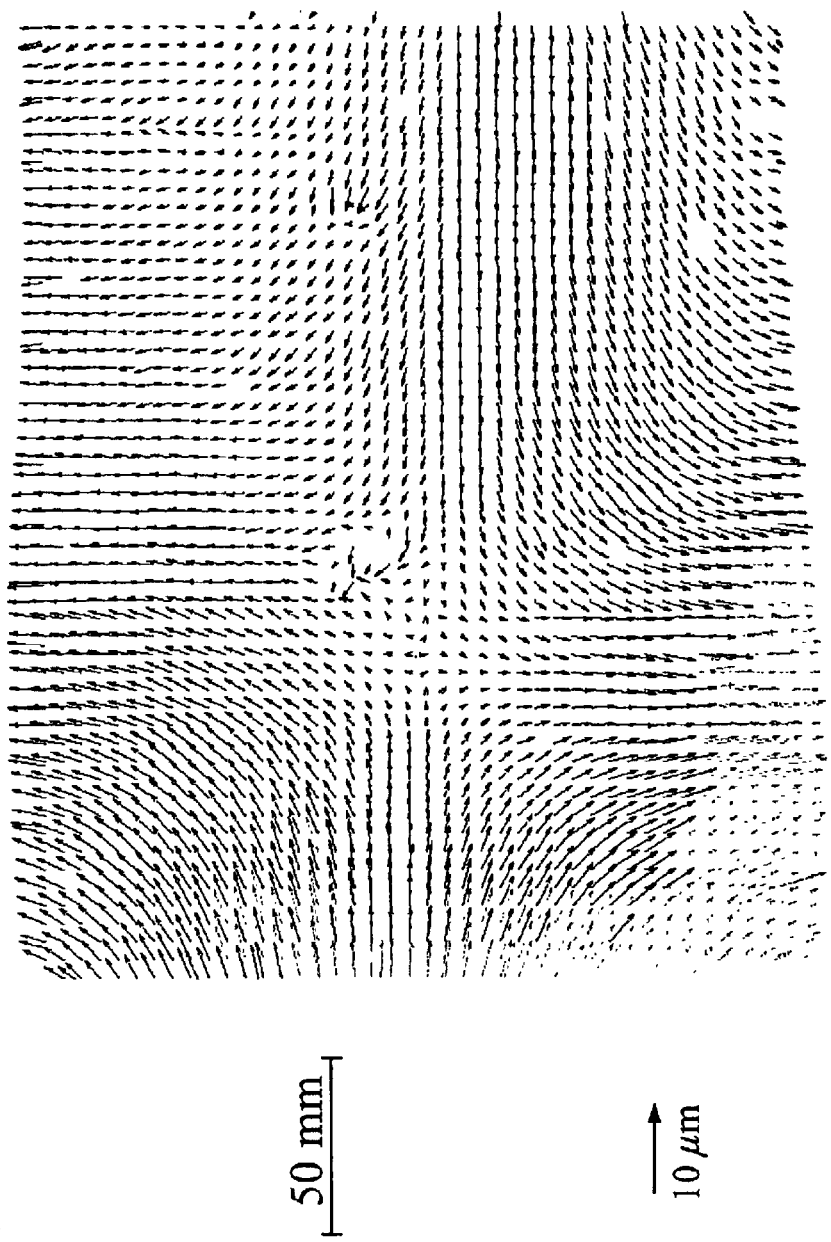

Based on experience with several hundred prints, four conclusions, illustrated by FIGS. 39–46, may be drawn:
1. The flatness of the print table is significant. This conclusion is illustrated by comparing FIGS. 39 and 40, which show errors for receiver 1 and 2 respectively. The only difference between these two cases is the flatness of the print table. As shown by the associated statistics in Table 1, the flatter, surface-ground aluminum print table, although it produced only a slight improvement in $\sigma_x$, produced a significant, 34-percent improvement in $\sigma_y$ (2.07 μm reduced to 1.36 μm). The granite table appears to have produced no further improvement vis-à-vis the ground aluminum, as shown by a comparison of FIGS. 41 and 42 (as well as the associated statistics), which are quite similar.
2. The stamp-control system, embodied in the vacuum bar, is important. This conclusion is illustrated by comparing FIGS. 40 and 41, where the only difference is the absence or presence of the vacuum bar. As shown by the associated statistics in Table 1, the vacuum bar produced a 35-percent improvement in $\sigma_x$ (2.46 μm reduced to 1.61 μm), and a 52-percent improvement in $\sigma_y$ (1.36 μm reduced to 0.65 μm).
3. With fixed conditions, printing repeatedly with the same stamp in the same direction always yields nearly identical results. This conclusion is illustrated by comparing FIGS. 44 and 45, which were both obtained by printing with stamp B in the "Reverse" direction. Notice that the "fingerprint" of errors—the shape of the vector map—is very similar for these two plots, and the statistics differ by only a few percent. Such repeatability (and often better) was observed consistently over dozens of prints, even for prints made months apart with the same stamp.
4. With fixed conditions, printing with different stamps, or even with the same stamp in opposite directions, yields significantly different results. This conclusion is illustrated by the following paired comparisons: FIG. 41 vs. 42 (same stamp A, opposite directions); FIG. 44 vs. 45 (same stamp B, opposite directions); FIG. 41 vs. 45 (different stamps, both printed in the forward direction); and FIG. 42 vs. 43 (different stamps, both printed in the reverse direction). In none of these cases do the error maps compare in any simple way. For example, when the print direction is reversed, the fingerprint is not simply rotated 180 degrees, as it would be if the errors were attributable to the printing process alone.

The most likely explanation for observations Nos. 3 and 4 above is that, for the prototype system, the sheet-metal material (Invar 36, 150-μm thick) from which the stamp's back-plane layer 40 is made is not perfectly planar. Rather, the metal has slight bumps caused by anomalies in its manufacture. With prototypical Invar sheets resting on a granite surface plate, bump amplitudes up to 2.8 mm and wavelengths from 90 to 200 mm have been measured. During printing, these bumps are "ironed out" by the flat-iron 270, thereby causing lateral displacement of material points on the surface of the polymer layer, since the polymer follows the much-stiffer metal.

Figure 46:
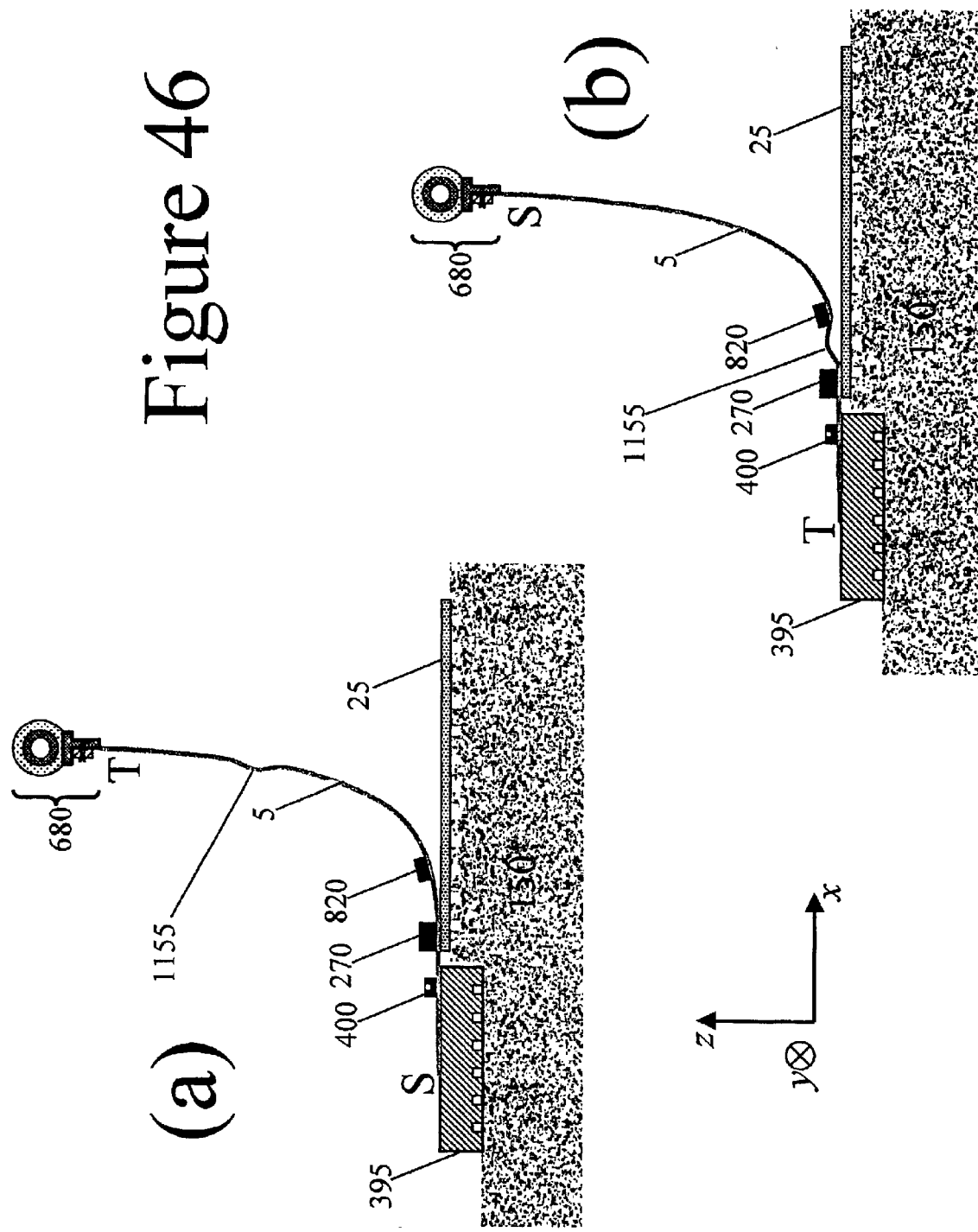
FIG. 46 shows the meaning of forward and reverse printing directions.

This mechanism easily explains the observation that different stamps have different error fingerprints, inasmuch as each stamp's back-plane is a unique piece of sheet metal having a unique distribution of bumps that are "ironed out" in unique ways. This mechanism also explains the excellent print-to-print repeatability when a given stamp is repeatedly printed in the same direction—apparently, the bumps "iron out" the same way every time. Less obviously, this mechanism also explains the observation that, with the same stamp, the error fingerprint depends on print direction. The reason for this is shown in FIG. 46. Suppose there is a single bump 1155 located near the T end of the stamp. When printing is performed from S to T, as in FIG. 46a, the bump 1155 will not affect printed errors except near the right end of the receiver 25, because the bump is not encountered by the flat-iron 270 until late in the printing process. However, if the same stamp is printed in the reverse direction, from T to S, as shown in FIG. 46b, bump 1155 is flattened by flat-iron 270 nearly at the outset of the printing process, and thus its effect can spread throughout the printed pattern on the receiver. With many bumps participating and interacting on a real stamp, it can be imagined that complex patterns of errors, such as those observed in FIGS. 42–46, may result, and may differ markedly for the two print directions.

For the above reasons, the accuracy of printing with the current invention may be improved, beyond that given for receiver No. 6 in Table 1, by improving the quality of the back-plane material 40. The prototype stamps were made with "off-the-shelf" material. However, as is well known in the art of sheet-metal manufacture, post-processing called "leveling" may be applied to reduce the bumpiness of metal sheets. The basic idea is to pull the material beyond its yield point in order to stretch out the extra arc length of material in the bumps. Various types of this procedure are described, for example, in *The Metals Handbook, Ninth Edition, Volume 14: Forming and Forging*, ASM International, S. L. Semiatin, Joseph R. Davis, et al., editors (1988), the disclosures of which are incorporated by reference herein in their entirety.

Although not mentioned in *The Metals Handbook*, a non-dimensional measure of bumpiness used by the sheet-metal industry is $$I \equiv 10^5 \frac{\Delta s}{\lambda}, \tag{40a}$$

where $\Delta s$ is the extra arc length in a sinusoidal bump of amplitude A and wavelength λ. This extra arc length may easily be shown mathematically to be related to the other parameters by $$\Delta s = \frac{\pi^2}{4}\frac{A^2}{\lambda}. \tag{40b}$$

By this measure, the off-the-shelf material referred to above—typical of that from which prototype stamps A and B were made—has worst-case bumps having I=10 to I=50. In contrast, industrial leveling of sheet-metal material is available to reduce such worst-case bumps by an order of magnitude, to I=1. Thus, although the current invention already has been demonstrated to yield the most accurate large-scale mechanical printing known in the art, further improvement in printed accuracy is available via a well-known industrial process.

Alternatively, the invention may be used with other backplane materials, such as thin sheets of glass or ceramic, whose inherent flatness may be superior to sheet metal. Although the use of such alternative materials may require slight changes in the above detailed description, these changes would not depart from the spirit and scope of the invention.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A printing apparatus, comprising:
   a print surface lying in a print plane defined by an imaginary x-axis and y-axis, the print surface having an outward normal pointing in the positive direction along an imaginary z-axis, such that the x-axis, y-axis, and z-axis are substantially orthogonal to one another;
   a lower stamp clamp disposed adjacent to the negative-x edge of the print surface;
   an upper stamp clamp, moveable in two dimensions in a trajectory plane defined by the x-axis and z-axis;
   a stamp comprising a flexible material, the stamp having a first end attached to the lower stamp clamp and a second end attached to the upper stamp clamp, such that a cross section of the stamp parallel to the trajectory plane forms an arc extending from an origin point Q on the lower stamp clamp having (x, z) coordinates (0, 0) to point E on the upper stamp clamp, this arc being described by the mathematical function $\theta(s)$, where s is the curvilinear distance along the arc measured from point Q, and $\theta$ is the angle between the print plane and an imaginary line, the imaginary line being tangent to the cross section of the stamp at s; and
   a stamp-control system movable along the x-axis,
   wherein, during a print operation, the upper stamp clamp is moved in a trajectory comprising a plurality of xz positions of the upper stamp clamp that blend into a substantially continuous motion, the trajectory being effective in laying the stamp down smoothly and flat upon the print surface in a manner such that a moving contact front between the stamp and the print surface is created, the contact front being disposed substantially along a line characterized by a contact-front coordinate $s_0 \equiv x_0$ that increases as the trajectory progresses, the trajectory also being effective in causing the curvature $$\frac{d\theta}{ds}$$

of the stamp at or near the contact front to be substantially constant throughout the motion; and
   wherein, throughout the trajectory, each xz position of the upper stamp clamp is a function of the displacement $x_C$ of the stamp-control system along the x-axis; the trajectory being effective in laying the stamp down upon the print surface such that the stamp is in continuous contact with a contact surface of the stamp-control system throughout the trajectory, the location of the contact surface being characterized by an arc-length coordinate $s_C$ that increases as the trajectory progresses.

2. The apparatus of claim 1 further comprising a print-force-application system effective in pressing the stamp against the print surface, and defining an approximate contact front disposed substantially along a line $_B$ parallel to the y-axis in the xy plane, the line $l_B$ intersecting the trajectory plane at $(x, z)=(x_B, 0)$, the approximate-contact-front x-coordinate $x_B$ increasing as the trajectory progresses and being substantially equal, at any stage of the trajectory, to the arc-length coordinate $s_B$ of point B, inasmuch as the arc of the stamp is assumed to be substantially flat over the segment from point Q to point B.

3. The apparatus of claim 2 wherein the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_P$ parallel to the y axis and intersecting the xz plane at point E having coordinates $x_E$ and $z_E$; the upper-clamp line $l_E$ being disposed on the upper stamp clamp at a radius $R_S$ from the pivot line $l_P$, such that the total arc length $s_E$ from the lower stamp clamp to the line $l_P$ is $s_E \equiv L$, where L is the known, free length of the stamp; and wherein the stamp attaches to the upper-clamp line $l_E$ at an angle $\theta_E \theta(L)$.

4. The apparatus of claim 3 wherein the trajectory comprises a plurality of configurations, each configuration described by the coordinate $s_B \equiv x_B$ of the approximate contact front and by corresponding coordinates $x_P, z_P$ of the pivot line given by the equations $$x_P = x_E + R_s \cos\theta_E$$
$$z_P = z_E + R_s \sin\theta_E$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s)=0 \text{ for } 0 \leq s \leq s_B,$$

whereas for $s > s^B$, $\theta(s)$ is determined by solution of the differential equations $$\frac{du}{ds} = F(u),$$

the lower-end boundary conditions $$u_B \equiv \left\{\begin{matrix} u_{1B} \\ u_{2B} \end{matrix}\right\} \equiv \left\{\begin{matrix} \theta_B \\ \frac{d\theta}{ds}\big|_B \end{matrix}\right\} = \left\{\begin{matrix} 0 \\ \kappa_B \end{matrix}\right\},$$

and the upper-end boundary condition $$T(\beta) \equiv EI\frac{d\theta}{ds}\bigg|_E + F_{XB}R_S\sin\theta_E - w(s - s_B)R_S\cos\theta_E = 0,$$

wherein $$u \equiv \left\{\begin{matrix} u_1 \\ u_2 \end{matrix}\right\} \equiv \left\{\begin{matrix} \theta \\ \frac{d\theta}{ds} \end{matrix}\right\},$$

$$F(u) \equiv \left\{\begin{matrix} u_2 \\ \frac{F_{XB}}{EI}\sin u_1 - \frac{w(s-s_B)}{EI}\cos u_1 \end{matrix}\right\},$$

$\kappa_B$ is a specified curvature at point B, the parameter $\beta \equiv F_{XB}$, unknown a priori, is the internal x-directed force acting on the stamp's cross section at $s=s_B$ per unit depth of the stamp in the y direction, E is Young's modulus of the stamp, I is the area moment of inertia of the stamp's cross section per unit depth in the y-direction, and w is the weight per unit area of the stamp; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined value $\beta^{(1)}$ of the unknown parameter $\beta$, whereupon the differential equations are solved again; this iteration procedure being applied repeatedly until the correct auxiliary boundary condition $T(\beta)=0$ is achieved to within some tolerance.

5. The apparatus of claim 2 wherein the print-force-application system comprises a flat-iron.

6. The apparatus of claim 2 wherein the stamp-control system is disposed along a line $l_C$ parallel to the y-axis, line $l_C$ intersecting the trajectory plane at point C having coordinates $x_C$ and $z_C$, where $z_C$ is a fixed, positive z-coordinate during any one printing operation, whereas $x_C$ increases as the trajectory progresses, in coordination with the contact-front coordinate $x_0$.

7. The apparatus of claim 6 wherein the contact surface of the stamp-control system is a plane delimited in the x direction by two lines $l_C$ and $l_D$ separated by a fixed distance $W_{CD}$, these lines being parallel to the y-axis and intersecting the trajectory plane at points C and D respectively, these points having coordinates $(x_C, z_C)$ and $(x_D, z_D)$ respectively, such that the contact surface is defined by the three parameters $(x_C, z_C, \theta_{CD})$, where $$\theta_{CD} \equiv \tan^{-1}\left(\frac{z_D - z_C}{x_D - x_C}\right)$$

is the angle between the contact surface and the print plane, and such that the stamp angle $\beta(s)$ between arc-length coordinates $s=s_C$ and $s=s_D$ is substantially equal to $\theta_{CD}$; that is, $$\theta(s) \approx \theta_{CD} \text{ for } s_C \leq s \leq s_D.$$

8. The apparatus of claim 7 wherein the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x_E$ and $z_E$; the upper-clamp line $l_E$ being disposed on the upper stamp clamp at a radius $R_s$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta_E \equiv \theta(L)$.

9. The apparatus of claim 8 wherein the trajectory comprises a plurality of configurations, each configuration described by the coordinate $s_0 \equiv x_0$ of the contact front and by corresponding coordinates $x_P$, $z_P$ of the pivot line given by the equations:

$$x_P = x_E + R_s \cos\theta_E$$

$$z_P = z_E + R_s \sin\theta_E$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s) = 0 \text{ for } 0 \leq s \leq s_0,$$

whereas for $s > s_0$, $\theta(s)$ is determined by solution of the differential equations $$\frac{du}{ds} = F(u),$$

the lower-end boundary conditions $$u_0 \equiv \left\{\begin{matrix} u_{10} \\ u_{20} \\ u_{30} \\ u_{40} \end{matrix}\right\} \equiv \left\{\begin{matrix} \theta_0 \\ \frac{d\theta}{ds}\big|_0 \\ F_{X0} \\ F_{Z0} \end{matrix}\right\} = \left\{\begin{matrix} 0 \\ 0 \\ F_{X0} \\ F_{Z0} \end{matrix}\right\},$$

and the auxiliary boundary conditions $$T(\beta) = 0,$$

wherein $$u_0 \equiv \begin{Bmatrix} u_1 \\ u_2 \\ u_3 \\ u_4 \end{Bmatrix} \equiv \begin{Bmatrix} \theta_0 \\ \dfrac{d\theta}{ds} \\ F_x(s) \\ F_z(s) \end{Bmatrix},$$

$$F(u) \equiv \begin{Bmatrix} u_2 \\ \dfrac{u_3}{EI}\sin u_1 - \dfrac{u_4}{EI}\cos u_1 \\ -p(s)\sin u_1 - f(s)\cos u_1 \\ w + p(s)\cos u_1 - f(s)\sin u_1 \end{Bmatrix},$$

$$T(\beta) \equiv \begin{Bmatrix} z_C - \displaystyle\int_0^{s_C} \sin\theta(s)\,ds \\ \theta_C - \theta_{CD} \\ EI\dfrac{d\theta}{ds}\bigg|_E + F_{XE}R_S\sin\theta_E - F_{ZE}R_S\cos\theta_E \end{Bmatrix},$$

and wherein $F_X(s)$ and $F_Z(s)$ are functions of s describing the internal x-directed and z-directed forces acting on the stamp's cross section at a per unit depth of the stamp in the y direction, $F_{XE} \equiv F_X(s_E)$, $F_{ZE} \equiv F_Z(s_E)$, $\beta$ is a vector of parameters that are unknown a priori, $$\beta = \begin{Bmatrix} s_0 \\ F_{X0} \\ F_{Z0} \end{Bmatrix},$$

$s_0$ is the aforementioned arc-length coordinate of the contact front, $F_{X0} \equiv F_X(0)$, $F_{Z0} \equiv F_Z(0)$, E is Young's modulus of the stamp, I is the area moment of inertia of the stamp's cross section per unit depth in the y-direction, w is the weight per unit area of the stamp, p(s) and f(s) are functions of s describing forces applied normal to the stamp and tangential to the stamp respectively by the print-force-application system, the stamp-control system and the print surface, $s_C$ is the value of arc-length coordinate sat point C, $\theta_C \equiv \theta(s_C)$ is the angle of the arc at point C, and $\theta_{CD}$ is the aforementioned angle of the stamp-control system's contact surface; and wherein for each configuration the solution for $x^P$ and $z_P$ is derived by means of the "shooting method", whereby an initial value $\beta^{(O)}$ of $\beta$ is guessed, the differential equations are solved to yield $T(\beta^{(O)})$ and $$\left[\dfrac{\partial T}{\partial \beta}\right]^{-1}_{\beta=\beta^{(0)}},$$

Newton-Raphson iteration $$\beta^{(n+1)} = \beta^{(n)} - \left[\dfrac{\partial T}{\partial \beta}\right]^{-1}_{\beta=\beta^{(n)}} T(\beta^{(n)})$$

is applied to obtain a refined vector $\beta^{(1)}$, whereupon the differential equations are solved again; this iteration procedure being applied repeatedly until the correct auxiliary boundary conditions $T(\beta)=0$ are achieved to within some tolerance.

10. The apparatus of claim 8 wherein the trajectory comprises a plurality of configurations, each configuration described by the coordinate $s_B \equiv x_B$ of the approximate contact front and by corresponding coordinates $x_P$, $z_P$ of the pivot line given by the equations $$x_P = x_E + R_s \cos\theta_E$$

$$z_P = z_E + R_s \sin\theta_E,$$

where $$x_E = \int_0^L \cos\theta(s)\,ds \text{ and } z_E = \int_0^L \sin\theta(s)\,ds,$$

and where the mathematical function $\theta(s)$ describing the shape of the arc for a given configuration is assumed to be $$\theta(s)=0 \text{ for } 0 \leq s \leq s_B,$$

whereas for $s > s_B$, $\theta(s)$ is determined in stamp segments OC and DE by solution of the differential equations $$\dfrac{du}{ds} = F(u),$$

the lower-end boundary conditions $$u_B \equiv \begin{Bmatrix} u_{1B} \\ u_{2B} \end{Bmatrix} \equiv \begin{Bmatrix} \theta_B \\ \dfrac{d\theta}{ds}\bigg|_B \end{Bmatrix} = \begin{Bmatrix} 0 \\ \kappa_B \end{Bmatrix},$$

and the upper-end boundary condition $$T(\beta) \equiv EI\dfrac{d\theta}{ds}\bigg|_E + F_{XE}R_S\sin\theta_E - F_{ZE}R_S\cos\theta_E = 0,$$

wherein $$u \equiv \begin{Bmatrix} u_1 \\ u_2 \end{Bmatrix} \equiv \begin{Bmatrix} \theta \\ \dfrac{d\theta}{ds} \end{Bmatrix},$$

$$F(u) \equiv \begin{Bmatrix} u_2 \\ \dfrac{F_x(s)}{EI}\sin u_1 - \dfrac{F_z(s)}{EI}\cos u_1 \end{Bmatrix},$$

$\kappa_B$ is a specified curvature at point B, E is Young's modulus of the stamp, I is the area moment of inertia of the stamp's cross section per unit depth in the y-direction, w is the weight per unit area of the stamp, $F_x(s)$ and $F_z(s)$ are the x-directed and z-directed stamp forces per unit length of stamp in the y direction, given by $$F_x(s) = \begin{cases} F_{x0}, & 0 \leq s \leq s_C \\ F_{x0} + \Delta F_x, & s_D \leq s \leq s_E, \end{cases}$$

and $$F_z(s) = \begin{cases} 0, & 0 \leq s \leq s_0 \\ w(s - s_0), & s_0 \leq s \leq s_C \\ w(s - s_0) + \Delta F_z, & s_D \leq s \leq s_E, \end{cases}$$

in which $F_{x0} \equiv F_x(s_0) \equiv \beta$ is a parameter that is unknown a priori, and the differences $\Delta F_x$ and $\Delta F_z$ are respectively the differences $$\Delta F_x \equiv F_x(s_D) - F_x(s_C)$$

$$\Delta F_z \equiv F_z(s_D) - F_z(s_C)$$

that occur across stamp segment CD where the stamp-control system contacts the stamp, the values of which differences, along with the value of the difference $$\Delta \kappa \equiv \frac{d\theta}{ds}\bigg|_D - \frac{d\theta}{ds}\bigg|_C,$$

may be calculated from the three equations of static equilibrium for the stamp under the action of forces applied to the stamp by the stamp-control system, these three differences together with $\theta_D = \theta_C$ permitting numerical integration for stamp segment DE to proceed immediately from the numerical-integration result obtained at the final point C in stamp segment OC; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined vector $\beta^{(1)}$, whereupon the differential equations are solved again; this iteration procedure being applied repeatedly until the correct auxiliary boundary conditions $T(\beta)=0$ are achieved to within some tolerance.

11. The apparatus of claim 1 wherein the stamp-control system is disposed along a line $l_C$ parallel to the y-axis, line $l_C$ intersecting the trajectory plane at point C having coordinates $x_C$ and $z_C$, where $z_C$ is a fixed, positive z-coordinate during any one printing operation, whereas $x^C$ increases as the trajectory progresses, in coordination with the contact-front coordinate $x_0$.

12. The apparatus of claim 11 wherein the contact surface of the stamp-control system is a plane delimited in the x direction by two lines $1_C$ and $l_D$ separated by a fixed distance $W_{CD}$, these lines being parallel to the y-axis and intersecting the trajectory plane at points C and D respectively, these points having coordinates $(x_C, z_C)$ and $(x_D, z_D)$ respectively, such that the contact surface is defined by the three parameters $(x_C, z_C, \theta_{CD})$, where $$\theta_{CD} \equiv \tan^{-1}\left(\frac{z_D - z_C}{x_D - x_C}\right)$$

is the angle between the contact surface and the print plane, and such that the stamp angle $\theta(s)$ between arc-length coordinates $s=s_C$ and $s=s_D$ is substantially equal to $\theta_{CD}$; that is, $$\theta(s) \approx \theta_{CD} \text{ for } s_C \leq s \leq s_D.$$

13. The apparatus of claim 12 wherein the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x_E$ and $z_E$; the upper-clamp line $l_E$ being disposed on the upper stamp clamp at a radius $R_S$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta_E \theta(L)$.

14. The apparatus of claim 13 wherein the trajectory comprises a plurality of configurations, each configuration described by the coordinate $s_0 \equiv x_0$ of the contact front and by corresponding coordinates $x_P$, $z_P$ of the pivot line given by the equations:

$$x_P = x_E + R_s \cos \theta_E$$

$$z_P = z_E + R_s \sin \theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s)=0 \text{ for } 0 \leq s \leq s_0,$$

whereas for $s > s_0$, $\theta(s)$ is determined by solution of the differential equations $$\frac{du}{ds} = F(u),$$

the lower-end boundary conditions $$u_0 \equiv \begin{Bmatrix} u_{10} \\ u_{20} \\ u_{30} \\ u_{40} \end{Bmatrix} \equiv \begin{Bmatrix} \theta_0 \\ \frac{d\theta}{ds}\big|_0 \\ F_{X_0} \\ F_{Z_0} \end{Bmatrix} = \begin{Bmatrix} 0 \\ 0 \\ F_{X_0} \\ F_{Z_0} \end{Bmatrix},$$

and the auxiliary boundary conditions $$T(\beta)=0,$$

wherein $$u \equiv \begin{Bmatrix} u_1 \\ u_2 \\ u_3 \\ u_4 \end{Bmatrix} \equiv \begin{Bmatrix} \theta \\ \frac{d\theta}{ds} \\ F_x(s) \\ F_z(s) \end{Bmatrix},$$

$$F(u) \equiv \begin{Bmatrix} u_2 \\ \frac{u_3}{EI}\sin u_1 - \frac{u_4}{EI}\cos u_1 \\ -p(s)\sin u_1 - f(s)\cos u_1 \\ w + p(s)\cos u_1 - f(s)\sin u_1 \end{Bmatrix},$$

$$T(\beta) \equiv \begin{Bmatrix} z_C - \int_0^{s_C} \sin\theta(s)ds \\ \theta_C - \theta_{CD} \\ EI\frac{d\theta}{ds}\big|_E + F_{XE}R_S\sin\theta_E - F_{ZE}R_S\cos\theta_E \end{Bmatrix},$$

and wherein $F_X(s)$ and $F_Z(s)$ are functions of s describing the internal x-directed and z-directed forces acting on the stamp's cross section at s per unit depth of the stamp in they direction, $F_{XE} \equiv F_X(s_E)$, $F_{ZE} \equiv F_Z(s_E)$, $\beta$ is a vector of parameters that are unknown a priori, $$\beta = \left\{ \begin{array}{c} s_0 \\ F_{X0} \\ F_{Z0} \end{array} \right\},$$

$s_0$ is the aforementioned arc-length coordinate of the contact front, $F_{X0} \equiv F_X(s_0)$, $F_{Z0} \equiv F_Z(s_0)$, E is Young's modulus of the stamp, I is the area moment of inertia of the stamp's cross section per unit depth in the y-direction, w is the weight per unit area of the stamp, p(s) and f(s) are functions of s describing forces applied normal to the stamp and tangential to the stamp respectively by the print-force-application system, the stamp-control system and the print surface, $s_C$ is the value of arc-length coordinate s at point C, $\theta_C \equiv \theta(s_C)$ is the angle of the arc at point C, and $\theta_{CD}$ is the aforementioned angle of the stamp-control system's contact surface; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[ \frac{\partial T}{\partial \beta} \right]^{-1}_{\beta = \beta^{(0)}},$$

Newton-Raphson iteration $$\beta^{(n+1)} = \beta^{(n)} - \left[ \frac{\partial T}{\partial \beta} \right]^{-1}_{\beta = \beta^{(n)}} T(\beta^{(n)})$$

is applied to obtain a refined vector $\beta^{(1)}$, whereupon the differential equations are solved again; this iteration procedure being applied repeatedly until the correct auxiliary boundary conditions $T(\beta) = 0$ are achieved to within some tolerance.

15. The apparatus of claim 12 wherein the stamp-control system comprises a vacuum bar.

16. The apparatus of claim 13 wherein the trajectory comprises a plurality of configurations, each configuration described by the coordinate $s_0 \equiv x_0$ of the contact front and by corresponding coordinates $x_P$, $z_P$ of the pivot line given by the equations:

$x_P = x_E + R_s \cos \theta_E$ $z_P = z_E + R_s \sin \theta_E,$ where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $\theta(s) = 0$ for $0 \leq s \leq s_0,$ whereas for $s > s_0$, $\theta(s)$ is determined in stamp segments OC and DE by solution of the differential equations $$\frac{du}{ds} = F(u),$$

the lower-end boundary conditions $$u_0 \equiv \left\{ \begin{array}{c} u_{10} \\ u_{20} \end{array} \right\} \equiv \left\{ \begin{array}{c} \theta_0 \\ \frac{d\theta}{ds}\big|_0 \end{array} \right\} = \left\{ \begin{array}{c} 0 \\ \kappa_0 \end{array} \right\},$$

and the upper-end boundary condition $$T(\beta) \equiv EI \frac{d\theta}{ds}\bigg|_E + F_{XE} R_S \sin\theta_E - F_{ZE} R_S \cos\theta_E = 0,$$

wherein $$u \equiv \left\{ \begin{array}{c} u_1 \\ u_2 \end{array} \right\} \equiv \left\{ \begin{array}{c} \theta \\ \frac{d\theta}{ds} \end{array} \right\},$$

$$F(u) \equiv \left\{ \begin{array}{c} u_2 \\ \frac{F_x(s)}{EI} \sin u_1 - \frac{F_z(s)}{EI} \cos u_1 \end{array} \right\},$$

$\kappa_0$ is a specified curvature at point O, E is Young's modulus of the stamp, I is the area moment of inertia of the stamp's cross section per unit depth in the y-direction, w is the weight per unit area of the stamp, $F_x(s)$ and $F_z(s)$ are the x-directed and z-directed stamp forces per unit length of stamp in the y direction, given by $$F_x(s) = \begin{cases} F_{x0}, & 0 \leq s \leq s_C \\ F_{x0} + \Delta F_x, & s_D \leq s \leq s_E, \end{cases}$$

and $$F_z(s) = \begin{cases} 0, & 0 \leq s \leq s_0 \\ w(s - s_0), & s_0 \leq s \leq s_C \\ w(s - s_0) + \Delta F_z, & s_D \leq s \leq s_E, \end{cases}$$

in which $F_{x0} \equiv F_x(s_0) \equiv \beta$ is a parameter that is unknown a priori, and the differences $\Delta F_x$ and $\Delta F_z$ are respectively the differences $\Delta F_x \equiv F_x(s_D) - F_x(s_C)$ $\Delta F_z \equiv F_z(s_D) - F_z(s_C)$ that occur across stamp segment CD where the stamp-control system contacts the stamp, the values of which differences, along with the value of the difference $$\Delta \kappa \equiv \frac{d\theta}{ds}\bigg|_D - \frac{d\theta}{ds}\bigg|_C,$$

may be calculated from the three equations of static equilibrium for the stamp under the action of forces applied to the stamp by the stamp-control system, these three differences together with $\theta_D = \theta_C$ permitting numerical integration for stamp segment DE to proceed immediately from the numerical-integration result obtained at the final point C in stamp segment OC; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined vector $\beta^{(1)}$, whereupon the differential equations are solved again; this iteration procedure being applied repeatedly until the correct auxiliary boundary conditions $T(\beta)=0$ are achieved to within some tolerance.

17. The apparatus of claim 1 wherein the upper stamp clamp is pivoted about a pivot line $l_P$ parallel to the y axis and intersecting the xz plane at point P having coordinates $x_P$ and $z_P$; the stamp attaching to the upper stamp clamp along an upper-clamp line $l_E$ parallel to the y axis and intersecting the xz plane at point E having coordinates $x^E$ and $z_E$; the upper-clamp line $l_E$ being disposed on the upper stamp clamp at a radius $R_S$ from the pivot line $l_P$, such that the total arc length $s_E$ from the lower stamp clamp to the line $l_E$ is $s_E \equiv L$, where L is the known, free length of the stamp; and wherein the stamp attaches to the upper-clamp line $l_E$ at an angle $\theta_E \equiv \theta(L)$.

18. The apparatus of claim 17 wherein the trajectory comprises a plurality of configurations, each configuration described by the coordinate $s_0 \equiv x_0$ of the contact front and by corresponding coordinates $x_P$, $z_P$ of the pivot line given by the equations $$x_P = x_E + R_s \cos \theta_E$$

$$z_P = z_E + R_s \sin \theta_E,$$

where $$x_E = \int_0^L \cos\theta(s)ds \text{ and } z_E = \int_0^L \sin\theta(s)ds,$$

and where the mathematical function $\theta(s)$ describing the shape of the arc for a given configuration is assumed to be $$\theta(s)=0 \text{ for } 0 \leq s \leq s_0,$$

whereas for $s > s_0$, $\theta(s)$ is determined by solution of the differential equations $$\frac{du}{ds} = F(u),$$

the lower-end boundary conditions $$u_0 \equiv \left\{\begin{matrix} u_{10} \\ u_{20} \end{matrix}\right\} \equiv \left\{\begin{matrix} \theta_0 \\ \frac{d\theta}{ds}\big|_0 \end{matrix}\right\} = \left\{\begin{matrix} 0 \\ \kappa_0 \end{matrix}\right\},$$

and the upper-end boundary condition $$T(\beta) \equiv EI\frac{d\theta}{ds}\bigg|_E + F_{X0}R_S\sin\theta_E - w(s-s_0)R_s\cos\theta_E = 0,$$

wherein $$u \equiv \left\{\begin{matrix} u_1 \\ u_2 \end{matrix}\right\} \equiv \left\{\begin{matrix} \theta \\ \frac{d\theta}{ds} \end{matrix}\right\},$$

$$F(u) \equiv \left\{\begin{matrix} u_2 \\ \frac{F_{X0}}{EI}\sin u_1 - \frac{w(s-s_0)}{EI}\cos u_1 \end{matrix}\right\},$$

$\kappa_0$ is a specified curvature at point O, the parameter $\beta = F_{X0}$, unknown a priori, is the internal x-directed force acting on the stamp's cross section at $s=s_0$ per unit depth of the stamp in the y direction, E is Young's modulus of the stamp, us the area moment of inertia of the stamp's cross section per unit depth in the y-direction, and w is the weight per unit area of the stamp; and wherein for each configuration the solution for $x_P$ and $z_P$ is derived by means of the "shooting method", whereby an initial value $\beta^{(0)}$ of $\beta$ is guessed, the differential equations are solved to yield $T(\beta^{(0)})$ and $$\left[\frac{\partial T}{\partial \beta}\right]^{-1}_{\beta=\beta^{(0)}},$$

Newton iteration $$\beta^{(n+1)} = \beta^{(n)} - \left[\frac{\partial T}{\partial \beta}\right]^{-1}_{\beta=\beta^{(n)}} T(\beta^{(n)})$$

is applied to obtain a refined value $\beta^{(1)}$ of the unknown parameter $\beta$, whereupon the differential equations are solved again; this iteration procedure being applied repeatedly until the correct auxiliary boundary condition $T(\beta)=0$ is achieved to within some tolerance.

19. A printing apparatus, comprising:
a receiver means whose receiving surface lies in an xy plane, the normal to the surface defining a z-axis direction;
a lower stamp clamp means for fixing a first edge of a stamp;
an upper stamp clamp means for holding a second edge of a stamp for movement in the xz directions;
a flexible stamp means for printing to the receiver, said flexible stamp in substantially the form of a sheet defining edges, the first edge of which is affixed to the lower stamp clamp, and the opposing second edge of which is affixed to the upper stamp clamp, thereby allowing the stamp to hang in a curve under gravity and the sheet's own stiffness, such that every normal to the stamp's curved surface lies substantially parallel to the xz plane; and
a trajectory-producing means for moving the upper stamp clamp along a prescribed trajectory in the xz plane, such that the stamp is draped upon the receiving surface in a manner that causes the curvature of the stamp near a contact front at a point B to be constant throughout the trajectory.

20. The apparatus of claim 19 further comprising print-force application means for applying pressure upon the stamp means against the receiver means and for defining the contact front.

21. The apparatus of claim 19 further comprising stamp-control means for defining a point C through which the curvature of the sheet will pass throughout the trajectory.

22. A printing apparatus, comprising:

a print surface lying in a print plane defined by an imaginary x-axis and y-axis, the print surface having an outward normal pointing in the positive direction along an imaginary z-axis, such that the x-axis, y-axis, and z-axis are substantially orthogonal to one another;

a lower stamp clamp disposed adjacent to the negative-x edge of the print surface;

an upper stamp clamp, moveable in two dimensions in a trajectory plane defined by the x-axis and z-axis; and a stamp comprising a flexible material, the stamp having a first end attached to the lower stamp clamp and a second end attached to the upper stamp clamp, such that a cross section of the stamp parallel to the trajectory plane forms an arc extending from an origin point Q on the lower stamp clamp having (x, z) coordinates (0, 0) to point E on the upper stamp clamp, this arc being described by the mathematical function $\theta(s)$, where s is the curvilinear distance along the arc measured from point Q, and $\theta$ is the angle between the print plane and an imaginary line, the imaginary line being tangent to the cross section of the stamp at s, wherein the upper stamp clamp is pivoted about a pivot line $l_P$ parallel to the y axis and intersecting the xz plane at point P having coordinates $x_P$ and $z_P$.

23. A printing apparatus, comprising:

a print surface lying in a print plane defined by an imaginary x-axis and y-axis, the print surface having an outward normal pointing in the positive direction along an imaginary z-axis, such that the x-axis, y-axis, and z-axis are substantially orthogonal to one another;

a lower stamp clamp disposed adjacent to the negative-x edge of the print surface;

an upper stamp clamp, moveable in a trajectory comprising a plurality of xz positions;

a stamp comprising a flexible material, the stamp having a first end attached to the lower stamp clamp and a second end attached to the upper stamp clamp, such that a cross section of the stamp parallel to a trajectory plane defined by the x-axis and z-axis forms an arc extending from an origin point Q on the lower stamp clamp having (x, z) coordinates (0, 0) to point E on the upper stamp clamp, this arc being described by the mathematical function $\theta(s)$, where s is the curvilinear distance along the arc measured from point Q, and $\theta$ is the angle between the print plane and an imaginary line, the imaginary line being tangent to the cross section of the stamp at s; and a stamp-control system movable along the x-axis, wherein each xz position of the upper stamp clamp is a function of the displacement $x_C$ of the stamp-control system along the x-axis.

24. A method for printing, comprising:

lying a print surface in a print plane defined by an imaginary x-axis and y-axis, the print surface having an outward normal pointing in the positive direction along an imaginary z-axis, such that the x-axis, y-axis, and z-axis are substantially orthogonal to one another;

disposing a lower stamp clamp adjacent to the negative-x edge of the print surface;

attaching a first end of a stamp comprising a flexible material to the lower stamp clamp and a second end of the stamp to an upper stamp clamp, such that a cross section of the stamp parallel to a trajectory plane defined by the x-axis and z-axis forms an arc extending from an origin point Q on the lower stamp clamp having (x, z) coordinates (0, 0) to point E on the upper stamp clamp, this arc being described by the mathematical function $\theta(s)$, where s is the curvilinear distance along the arc measured from point Q, and $\theta$ is the angle between the print plane and an imaginary line, the imaginary line being tangent to the cross section of the stamp at s; and moving the upper stamp clamp in a trajectory comprising a plurality of xz positions of the upper stamp clamp that blend into a substantially continuous motion, the trajectory being effective in laying the stamp down smoothly and flat upon the print surface in a manner such that a moving contact front between the stamp and the print surface is created, the contact front being disposed substantially along a line characterized by a contact-front coordinate $s_0 \equiv x_0$ that increases as the trajectory progresses, the trajectory also being effective in causing the curvature $$\frac{d\theta}{ds}$$

of the stamp at or near the contact front to be substantially constant throughout the motion.

* * * * *